(12) United States Patent
Toda

(10) Patent No.: US 9,431,449 B2
(45) Date of Patent: Aug. 30, 2016

(54) SOLID-STATE IMAGING DEVICE, DRIVING METHOD FOR SOLID-STATE IMAGING DEVICE, AND ELECTRONIC APPLIANCE

(71) Applicant: Sony Corporation, Tokyo (JP)

(72) Inventor: Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/362,797

(22) PCT Filed: Dec. 4, 2012

(86) PCT No.: PCT/JP2012/081305
§ 371 (c)(1),
(2) Date: Jun. 4, 2014

(87) PCT Pub. No.: WO2013/088983
PCT Pub. Date: Jun. 20, 2013

(65) Prior Publication Data
US 2014/0347538 A1      Nov. 27, 2014

(30) Foreign Application Priority Data

Dec. 12, 2011   (JP) ................................ 2011-271604

(51) Int. Cl.
*H04N 5/374*      (2011.01)
*H04N 5/357*      (2011.01)
(Continued)

(52) U.S. Cl.
CPC ..... *H01L 27/14638* (2013.01); *H01L 27/1464* (2013.01); *H01L 27/14603* (2013.01); *H01L 27/14609* (2013.01); *H01L 27/14623* (2013.01); *H01L 27/14643* (2013.01); *H01L 27/14689* (2013.01); *H04N 5/3575* (2013.01);
(Continued)

(58) Field of Classification Search
CPC ............... H04N 5/374; H04N 5/3745; H04N 5/37452; H04N 5/37457; H01L 27/14609; H01L 27/14614; H01L 27/14616; H01L 27/14623; H01L 27/1464; H01L 27/14643; H01L 27/14647; H01L 27/14652; H01L 27/14638; H01L 27/14689; H01L 23/5225; H01L 23/5226; H01L 23/5227
See application file for complete search history.

(56) References Cited

U.S. PATENT DOCUMENTS

2007/0052056 A1*   3/2007   Doi et al. ................. 257/462
2007/0139542 A1*   6/2007   Ohkubo et al. ........... 348/294
(Continued)

FOREIGN PATENT DOCUMENTS

JP    04-281681       10/1992
JP    2006-311515     11/2006
(Continued)

*Primary Examiner* — Roberto Velez
*Assistant Examiner* — Quan Pham
(74) *Attorney, Agent, or Firm* — Chip Law Group

(57) ABSTRACT

The present disclosure relates to a solid-state imaging device, a driving method for the same, and an electronic appliance, and an object is to provide a solid-state imaging device that can achieve the pixel miniaturization and the global shutter function with higher sensitivity and saturated charge amount. Another object is to provide an electronic appliance including the solid-state imaging device. In a solid-state imaging device 1 having the global shutter function, a first charge accumulation unit 18 and a second charge accumulation unit 25 are stacked in the depth direction of a substrate 12, and the transfer of the signal charges from the first charge accumulation unit 12 to the second charge accumulation unit 25 is conducted by a vertical first transfer transistor Tr1. Thus, the pixel miniaturization can be achieved.

18 Claims, 26 Drawing Sheets

(51) Int. Cl.
*H01L 27/146* (2006.01)
*H04N 5/3745* (2011.01)

(52) U.S. Cl.
CPC ........... *H04N 5/374* (2013.01); *H04N 5/3745* (2013.01); *H04N 5/37452* (2013.01)

(56) References Cited

U.S. PATENT DOCUMENTS

| | | | | |
|---|---|---|---|---|
| 2008/0083940 A1* | 4/2008 | Ezaki et al. | ................. | 257/292 |
| 2009/0244514 A1* | 10/2009 | Jin et al. | ....................... | 356/4.01 |
| 2010/0025738 A1* | 2/2010 | Kohyama | .................... | 257/222 |
| 2010/0194959 A1* | 8/2010 | Kanbe | ........................... | 348/311 |
| 2010/0245638 A1* | 9/2010 | Ota | ................................ | 348/280 |
| 2011/0079832 A1* | 4/2011 | Masagaki et al. | ............ | 257/291 |
| 2011/0227091 A1* | 9/2011 | Toda | ............................... | 257/76 |
| 2012/0085888 A1* | 4/2012 | Endo et al. | ................ | 250/208.1 |

FOREIGN PATENT DOCUMENTS

| | | |
|---|---|---|
| JP | 2007-503722 | 2/2007 |
| JP | 2010-283086 | 12/2010 |
| JP | 2011-138927 | 7/2011 |
| JP | 2011-188410 | 9/2011 |
| JP | 2011-199816 | 10/2011 |
| JP | WO/2012/164829 A1 | 12/2012 |

* cited by examiner

SOLID-STATE IMAGING DEVICE, DRIVING METHOD FOR SOLID-STATE IMAGING DEVICE, AND ELECTRONIC APPLIANCE

TECHNICAL FIELD

The present disclosure relates to a solid-state imaging device, and particularly to a CMOS solid-state imaging device and a driving method for the same. Moreover, the present disclosure relates to an electronic appliance including the solid-state imaging device.

BACKGROUND ART

A general CMOS (Complementary Metal Oxide Semiconductor) solid-state imaging device has a mechanism in which a pixel array arranged two-dimensionally is scanned sequentially for each pixel row to read out pixel signals. This row-sequential scanning causes time displacement in an accumulation period for each pixel row, thereby causing a phenomenon called focal plane distortion that the image obtained by photographing a moving subject is distorted.

In the photographing of a subject moving fast, for which such image distortion is not allowed, or in the application of sensing in which the simultaneity of the photographed image is necessary, the global shutter function or the mechanical shutter function has been suggested for achieving the simultaneity of the accumulation period of the pixel array.

The mechanical shutter function enables the global exposure in which the exposure is finished simultaneously in the entire pixels by controlling the exposure time with a mechanical light-shielding means. Specifically, a mechanical shutter is opened to start the exposure simultaneously for the entire pixels, and is closed after a certain period of times to end the exposure. In the case of performing the global exposure with the mechanical shutter, however, a mechanical light-shielding means is necessary, which makes it difficult to reduce the size. Further, since there is a limitation in mechanical driving speed of the mechanical shutter, the simultaneity of the exposure time in the pixel region is poor.

On the other hand, the global shutter function enables the global exposure in which the exposure is finished simultaneously in the entire pixels by electrical control. Specifically, the accumulation of the signal charges in the entire pixel array surface is started simultaneously by performing the entire-row simultaneous reset driving of photodiodes in the pixel array. Then, by the entire-row simultaneous transfer driving to the charge accumulation unit such as floating diffusion, the accumulation of signal charges in the entire pixel array surface is finished simultaneously.

Incidentally, in the case of employing the global shutter function, the signal charges are read out by the row sequential scanning in a manner similar to the general CMOS solid-state imaging device. Therefore, it is necessary to accumulate the signal charges, which have been read out by the global shutter function simultaneously in the entire pixels, in the charge accumulation unit such as the floating diffusion until the readout time. This causes problems that the signal charges held in the floating diffusion until the readout time leak out or deteriorate due to noise (referred to as alias) that is generated by the photoelectric conversion of the floating diffusion.

For preventing this, a structure has been suggested in which a light-shielding film is provided over the charge accumulation unit such as the floating diffusion. The provision of the light-shielding film, however, causes problems that the sensitivity deteriorates because the opening area of the photodiode is reduced and moreover that the saturated sensitivity deteriorates. Moreover, since the charge accumulation unit such as the floating diffusion is often disposed at the position close to the photodiode, which serves as a light incidence portion, in the horizontal direction, the light may leak therein due to the light diffraction phenomenon or the scattering phenomenon, in which case the noise increases.

Furthermore, at an interface between silicon and a silicon oxide film, a large number of crystal defects are present, so that dark current easily occurs. Therefore, when the charges are held in the floating diffusion, a difference is generated in the dark current applied to the signal level depending on the order of readout. The noise from such dark current cannot be cancelled just by the noise removal by the reset level.

As a solution to this problem, a solid-state imaging device has been suggested in which a memory unit that accumulates charges is mounted separately from the floating diffusion in a pixel (Patent Documents 1 and 2). The memory unit is formed as a charge accumulation unit that can be embedded, and temporarily holds the signal charges transferred from the photodiodes. In the structure having the memory unit as above, however, the area where the light is blocked is large relative to the pixel area, so that the opening area becomes smaller. As a result, the sensitivity is deteriorated further.

On the other hand, a solid-state imaging device of back-illumination type has been suggested as a means for increasing the opening area of the pixel relative to the incident light. In the solid-state imaging device of back-illumination type, the opening of the pixels can be increased by having, as the light incidence surface, the back surface side that is on the opposite side of the front surface of a semiconductor substrate provided with circuits including transistors, wires, etc., and the miniaturization is thus enabled.

Incidentally, in the case of adding the global shutter function in the solid-state imaging device of back-illumination type, a structure is employed in which a light-shielding film is formed on the light incident surface side for preventing the light from entering to reach the front surface side of the semiconductor substrate. In this case, when the light-shielding film is formed largely, the opening area of the pixels is narrowed to make the miniaturization difficult.

Patent Document 3 has disclosed the structure in which a capacitor is formed outside a semiconductor substrate. In this structure, however, a large amount of dark current is generated from the capacitor and the high-quality image cannot be obtained.

CITATION LIST

Patent Document

Patent Document 1: JP 2007-503722 A
Patent Document 2: JP 2006-311515 A
Patent Document 3: JP 4-281681 A

SUMMARY OF THE INVENTION

Problems to be Solved by the Invention

In view of the above, an object of the present disclosure is to provide a solid-state imaging device that can achieve miniaturization of pixels and improve the sensitivity and the saturated charge amount, and a driving method for the solid-state imaging device. Another object of the present disclosure is to provide an electronic appliance including the solid-state imaging device.

Solutions to Problems

A solid-state imaging device according to the present disclosure includes a photoelectric conversion unit, a first charge accumulation unit, a second charge accumulation unit, a first transfer transistor, a floating diffusion unit, and a second transfer transistor. The photoelectric conversion unit generates signal charges corresponding to the light quantity. The first charge accumulation unit is provided for a substrate, and accumulates the signal charges generated in the photoelectric conversion unit. The second charge accumulation unit is stacked on the first charge accumulation unit in a substrate depth direction, and reads out the signal charges accumulated in the first charge accumulation unit. The first transfer transistor includes a first transfer gate electrode embedded in the substrate to the depth of such a degree that the first transfer gate electrode reaches the first charge accumulation unit from a substrate surface provided with the second charge accumulation unit. The floating diffusion unit is formed adjacent to the second charge accumulation unit. The second transfer transistor transfers the signal charges accumulated in the second charge accumulation unit to the floating diffusion unit.

In the solid-state imaging device according to the present disclosure, the first charge accumulation unit and the second charge accumulation unit are stacked in the substrate depth direction. Thus, the pixel area can be reduced. The readout of the signal charges from the first charge accumulation unit to the second charge accumulation unit is carried out by the vertical first transfer transistor. Accordingly, the area of the transistor is also reduced, thereby achieving the miniaturization of the pixels.

A driving method for the solid-state imaging device according to the present disclosure includes, in the aforementioned solid-state imaging device, transferring the signal charges accumulated in the first charge accumulation units and the photoelectric conversion units to the second charge accumulation units simultaneously in the entire pixels by turning on the first transfer transistors. Moreover, by turning on the second transfer transistors, the signal charges held in the second charge accumulation units are read out for each row.

In the driving method for the solid-state imaging device according to the present disclosure, the signal charges accumulated in the first charge accumulation units can be transferred to the second charge accumulation units simultaneously in the entire pixels and held in the second charge accumulation units. Thus, the exposure period can be synchronized in the entire pixels.

An electronic appliance according to the present disclosure includes an optical lens, the aforementioned solid-state imaging device to which the light condensed by the optical lens is incident, and a signal processing circuit that processes an output signal output from the solid-state imaging device.

In the solid-state imaging device of the electronic appliance according to the present disclosure, the first charge accumulation unit and the second charge accumulation unit are stacked in the substrate depth direction. Thus, the pixel area is reduced and the electronic appliance is also reduced in size. The readout of the signal charges from the first charge accumulation unit to the second charge accumulation unit is carried out by the vertical first transfer transistor. Accordingly, the area of the transistor is reduced to achieve the miniaturization of the pixels, and the image quality of the electronic appliance is improved.

Effects of the Invention

According to the solid-state imaging device of the present disclosure, since the first charge accumulation unit and the second charge accumulation unit are stacked in the substrate depth direction, the pixels are miniaturized. Moreover, since the area for the photoelectric conversion unit and the first charge accumulation unit can be increased, the saturated charge amount can be improved. By the use of the solid-state imaging device, the electronic appliance can have higher image quality.

MODES FOR CARRYING OUT THE INVENTION

Figure 1:
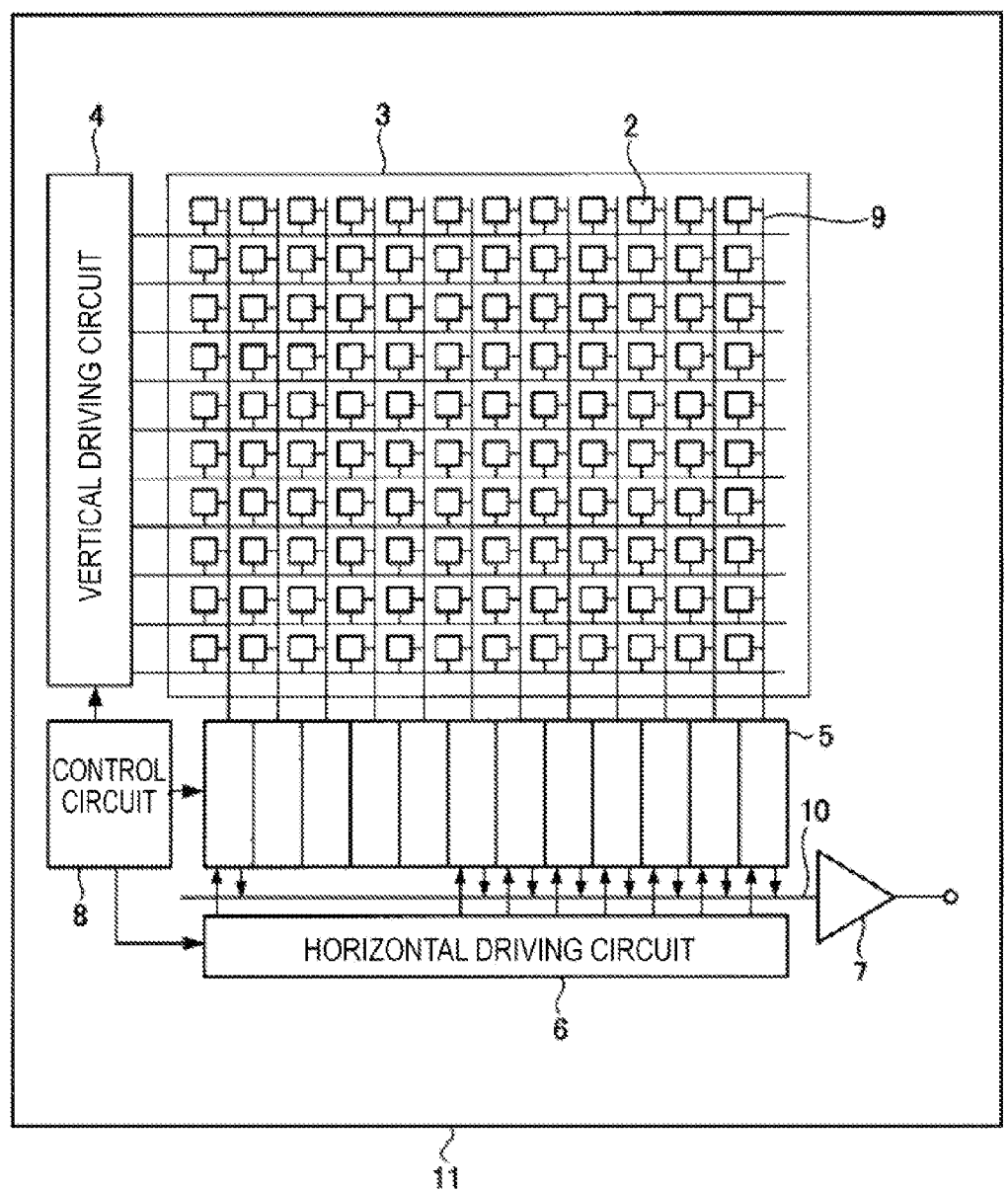
FIG. 1 is a schematic structure diagram illustrating the entire CMOS solid-state imaging device according to a first embodiment of the present disclosure.

A solid-state imaging device according to embodiments of the present disclosure, a driving method for the same, and an example of an electronic appliance are described with reference to FIG. 1 to FIG. 29. Embodiments of the present disclosure are described in the order as below. Note that the present disclosure is not limited to the examples below.
1. First embodiment: solid-state imaging device of back-illumination type
   1-1 Structure of solid-state imaging device
   1-2 Structure of main components
   1-3 Manufacturing method
   1-4 Driving method
   1-5 Modified example
2. Second embodiment: example of structuring one vertical transistor in each pixel
3. Third embodiment: solid-state imaging device of front-illumination type
4. Fourth embodiment: example of drifting signal charges in transfer electrode
5. Fifth embodiment: example of reading out signal charges in a signal readout transistor
6. Sixth embodiment: example of stacking photoelectric conversion unit on substrate
   6-1 Structure of main components
   6-2 Manufacturing method
   6-3 Driving method
   6-4 First modified example
   6-5 Second modified example
7. Seventh embodiment: example of providing p-type semiconductor layer on upper layer of photoelectric conversion unit
   7-1 Structure of main components
   7-2 Manufacturing method
8. Eighth embodiment: example of stacking photoelectric conversion unit over substrate with electrode layer interposed therebetween
9. Ninth embodiment: example of stacking photoelectric conversion unit over substrate with electrode layer interposed therebetween in solid-state imaging device of front-illumination type
10. Tenth embodiment: example of stacking three photoelectric conversion films on substrate
11. Eleventh embodiment: electronic appliance First Embodiment Solid-State Imaging Device of Back-Illumination Type 1-1 Structure of Solid-State Imaging Device First, a solid-state imaging device according to a first embodiment of the present disclosure is described. FIG. 1 is a schematic structure diagram depicting the entire CMOS solid-state imaging device according to the first embodiment of the present disclosure.

A solid-state imaging device 1 according to this embodiment includes a pixel region 3 including a plurality of pixels 2 arranged on a substrate 11 formed of silicon, a vertical driving circuit 4, column signal processing circuits 5, a horizontal driving circuit 6, an output circuit 7, and a control circuit 8.

The pixel 2 includes a photoelectric conversion unit including a photodiode, and a plurality of pixel transistors. The pixels 2 are arranged regularly in a two-dimensional array on the substrate 11. As the pixel transistors included in the pixel 2, for example, a transfer transistor, a reset transistor, a selection transistor, and an amplification transistor are given. The pixel transistors are described below.

The pixel region 3 includes the plurality of pixels 2 arranged regularly in the two-dimensional array. The pixel region 3 includes an effective pixel region where a signal charge generated by receiving light actually and converting the light into electricity is amplified and read out to the column signal processing circuit 5, and a black reference pixel region (not illustrated) for outputting optical black, which is the reference of the black level. The black reference pixel region is generally formed at the outer periphery of the effective pixel region.

The control circuit 8 generates a clock signal, a control signal, etc. which serve as the reference of the operation of the vertical driving circuit 4, the column signal processing circuit 5, the horizontal driving circuit 6, etc. on the basis of a vertical synchronization signal, a horizontal synchronization signal, and a master clock. The clock signal, the control signal, etc. generated in the control circuit 8 are input to the vertical driving circuit 4, the column signal processing circuit 5, the horizontal driving circuit 6, etc.

The vertical driving circuit 4 is formed of, for example, a shift register, and selectively scans the pixels 2 of the pixel region 3 for each row in the sequential vertical direction. Then, the pixel signal based on the signal charge generated according to the quantity of received light in the photodiode in each pixel 2 is supplied to the column signal processing circuit 5 through a vertical signal line 9.

The column signal processing circuit 5 is disposed for each column of the pixels 2, for example, and the signals output from one row of pixels 2 are subjected to the signal process such as noise removal or signal amplification by the signal from the black reference pixel region (formed around the effective pixel region, although not illustrated) for each pixel column. A horizontal selection switch (not illustrated) is provided between the horizontal signal line 10 and the output stage of the column signal processing circuit 5.

The horizontal driving circuit 6 is formed of, for example, a shift register, and selects each column signal processing circuit 5 in order by sequentially outputting the horizontal scanning pulses, thereby outputting the pixel signal from each of the column signal processing circuits 5 to the horizontal signal line 10.

The output circuit 7 performs the signal process on the signals supplied from each of the column signal processing circuits 5 through the horizontal signal line 10, and outputs the signals.

1-2 Structure of Main Components

Figure 2:
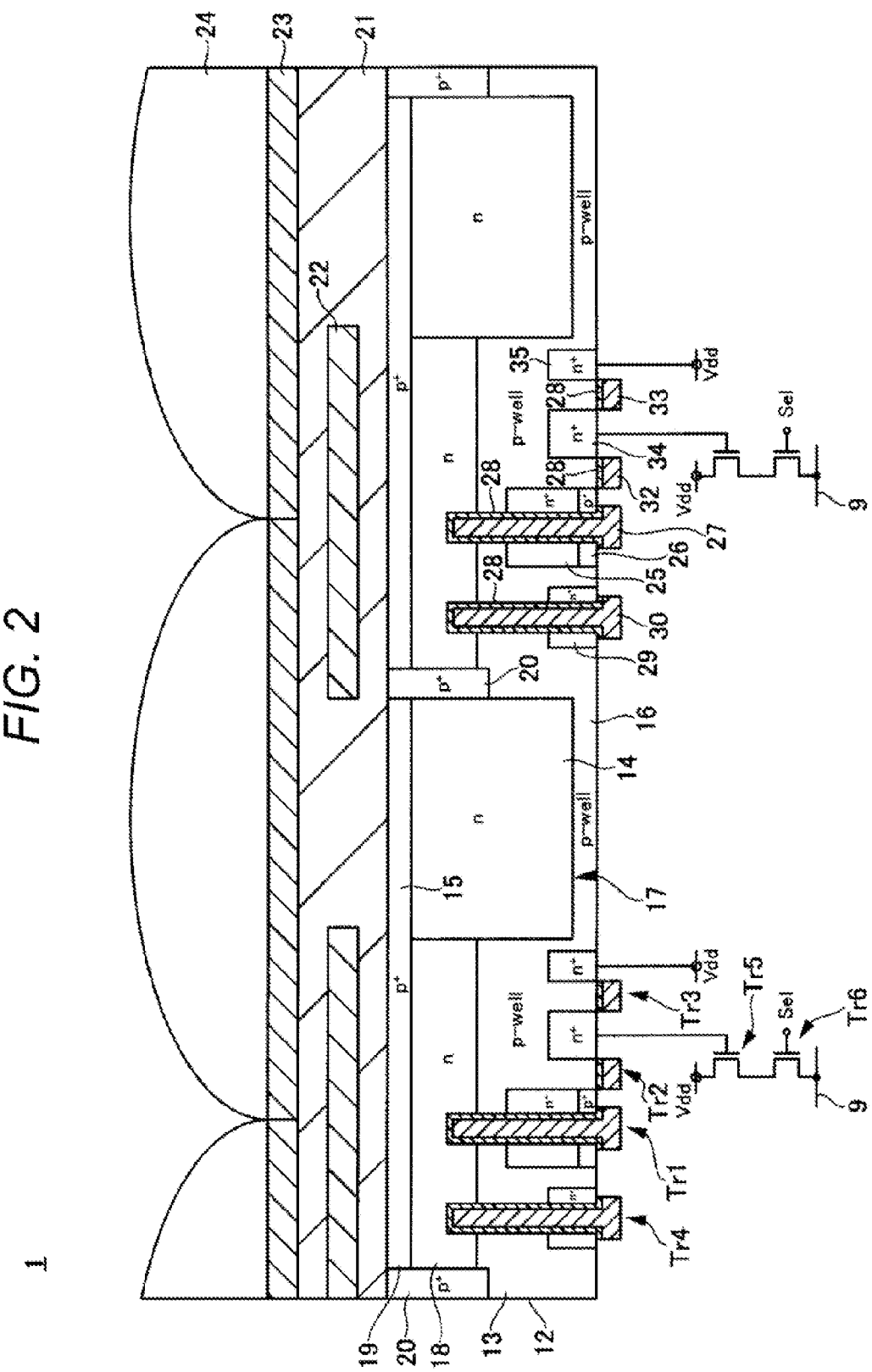
FIG. 2 illustrates a schematic sectional structure of a pixel region in the solid-state imaging device according to the first embodiment.
Figure 3:
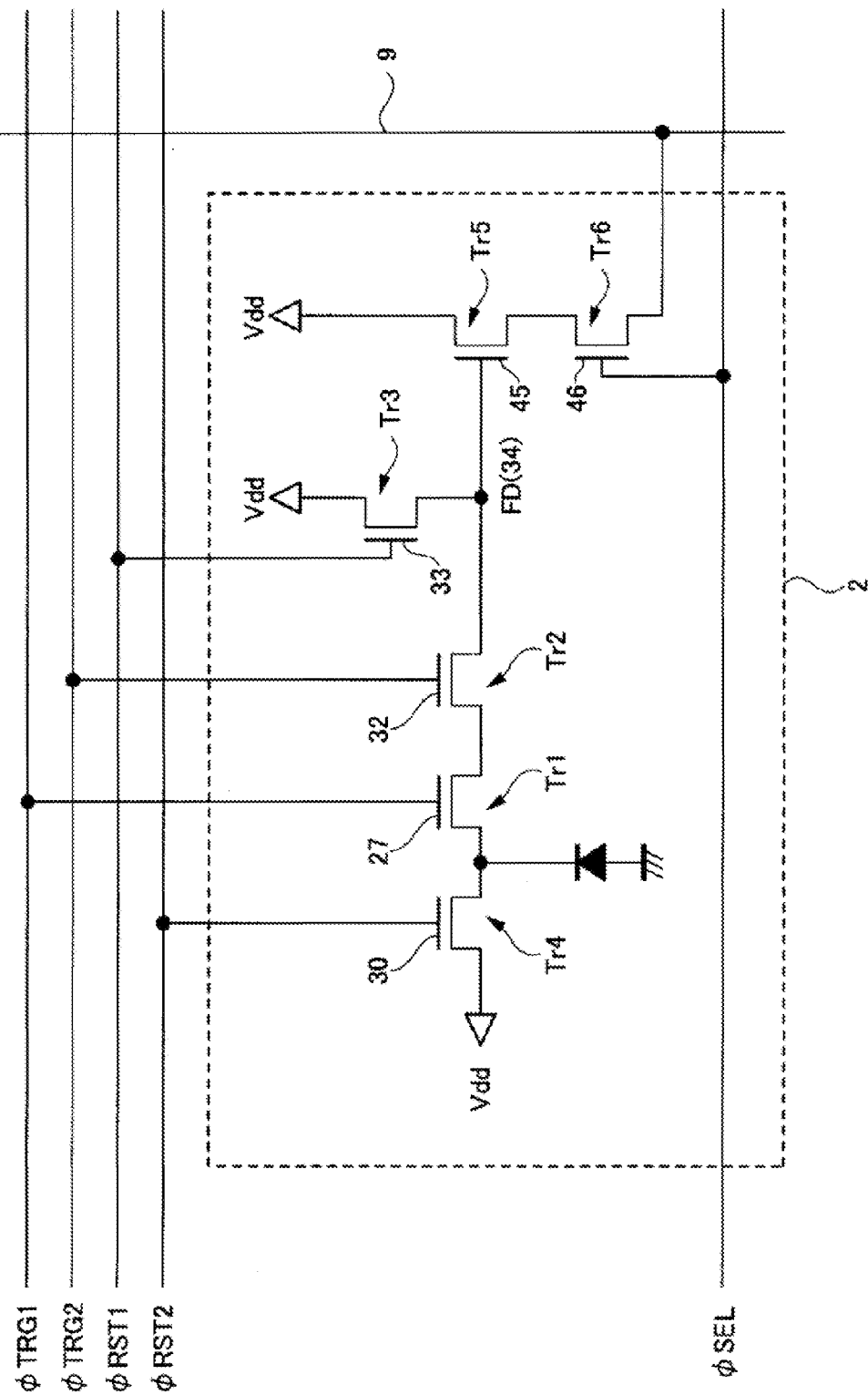
FIG. 3 is an equivalent circuit diagram of a pixel of the solid-state imaging device according to the first embodiment.
Figure 4:
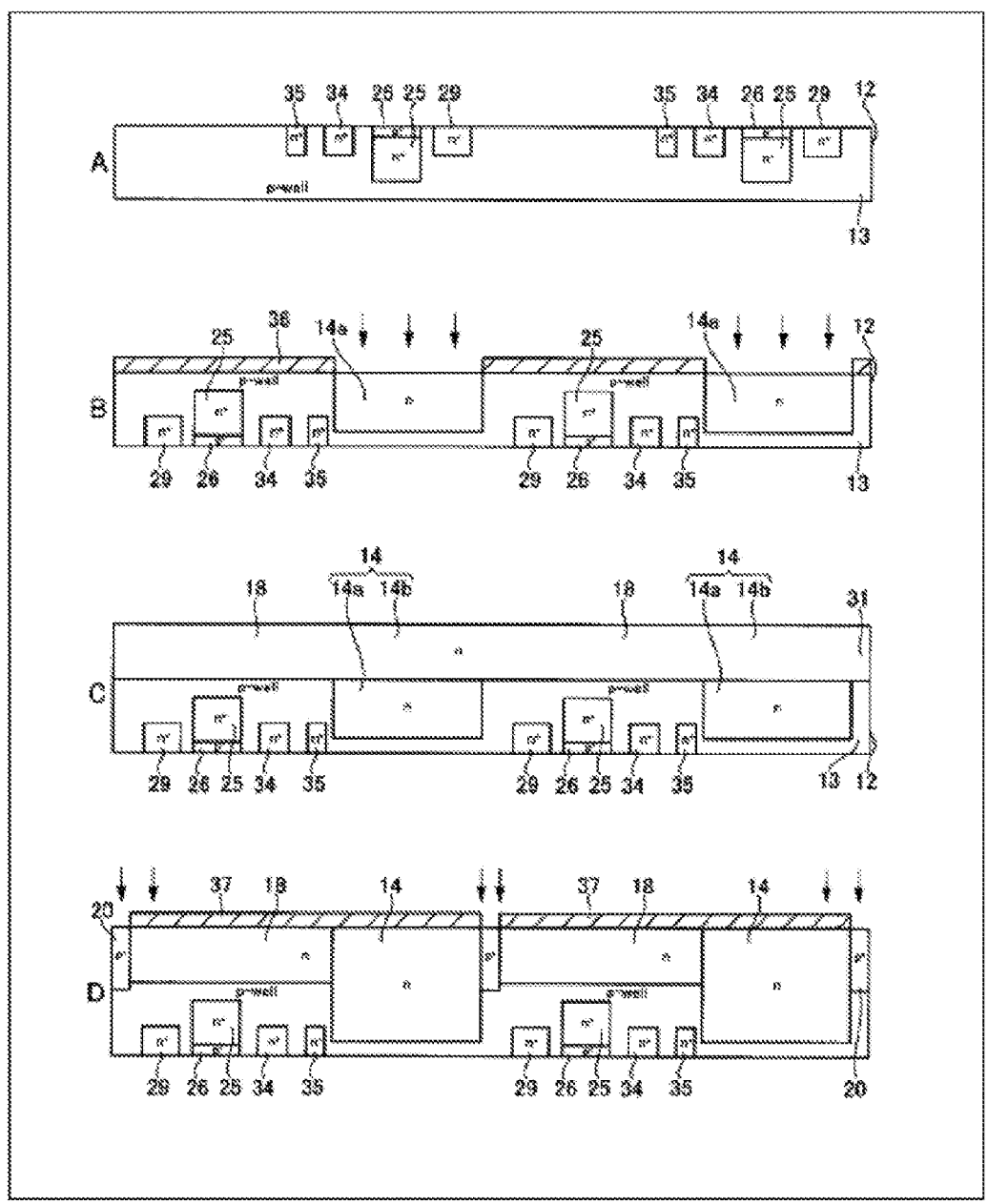
FIGS. 4A to 4D are process diagrams (Part 1) illustrating a manufacturing method for the solid-state imaging device according to the first embodiment.
Figure 5:
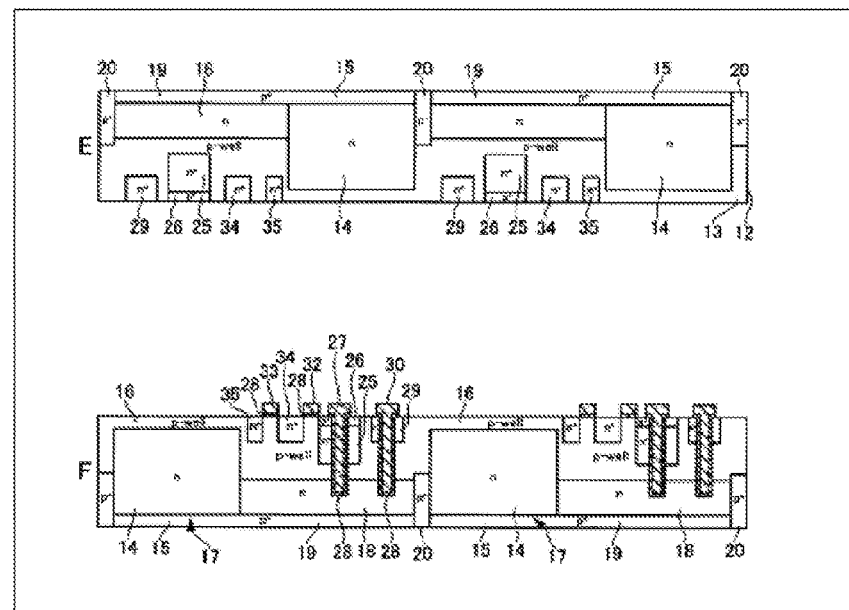
FIGS. 5E and 5F are process diagrams (Part 2) illustrating the manufacturing method for the solid-state imaging device according to the first embodiment.

Next, the structure of each pixel 2 of the solid-state imaging device 1 of this embodiment is described. This embodiment describes an example of a solid-state imaging device of back-illumination type, in which the back-surface side of the semiconductor substrate is the light incidence surface. FIG. 2 illustrates a schematic sectional structure of the pixel region 3 of the solid-state imaging device 1 according to this embodiment, and FIG. 3 illustrates an equivalent circuit diagram of each pixel 2 of the solid-state imaging device 1 according to this embodiment. In FIG. 2, apart of the pixel transistors of each pixel 2 is illustrated as the circuit diagram.

As illustrated in FIG. 2, the solid-state imaging device 1 according to this embodiment includes a substrate 12 provided with a photoelectric conversion unit 17, a first charge accumulation unit 18, a second charge accumulation unit 25, a floating diffusion unit 34, and a plurality of pixel transistors. Moreover, the solid-state imaging device 1 includes a wiring layer, which is not illustrated, on the front surface side of the substrate 12, and further includes a light-shielding film 22, a color filter layer 23, and an on-chip lens 24 on the back surface side of the substrate 12, which serves as the light incidence surface of the substrate 12.

The substrate 12 is a semiconductor substrate formed of silicon, and has a thickness of, for example, 3 µm to 5 µm. The substrate 12 is a semiconductor substrate of a first conductivity type (n type in this embodiment), and the pixel region 3 having an impurity region that forms the pixel 2 such as the photoelectric conversion unit 17 is a well region 13 of a second conductivity type (p type in this embodiment). The pixels 2 are sectioned by a pixel isolation unit 20 provided for the substrate 12. The pixel isolation unit 20 is formed of a high-concentration p-type semiconductor layer formed at a desired depth from the back surface side of the substrate 12, and is provided for electrically isolating between the two adjacent pixels 2.

In this embodiment, the photoelectric conversion unit 17 constituting the pixel 2, the first and second charge accumulation units 18 and 25, the floating diffusion unit 34, and source/drain regions included in each pixel transistor are formed within the p-type well region 13. Each pixel 2 includes six pixel transistors: a first transfer transistor Tr1, a second transfer transistor Tr2, a first reset transistor Tr3, a second reset transistor Tr4, an amplification transistor Tr5, and a selection transistor Tr6.

The photoelectric conversion unit 17 includes p-type semiconductor layers 15 and 16, and an n-type semiconductor layer 14. The p-type semiconductor layer 15 is formed at small depth from the back surface of the substrate 12, and the p-type semiconductor layer 16 is formed at small depth from the substrate 12. The n-type semiconductor layer 14 is formed between the p-type semiconductor layers 15 and 16 formed on the front and back surfaces of the substrate 12. In this embodiment, a photodiode is formed by the pn junction between the n-type semiconductor layer 14 and the p-type semiconductor layers 15 and 16 formed on the front and back surfaces of the substrate 12.

The p-type semiconductor layer 15 on the back surface side of the substrate 12 is formed to have higher impurity concentration than the p-type impurity concentration of the well region 13. The p-type semiconductor layer 16 on the front surface side of the substrate 12 is constituted by a part of the well region 13. In this embodiment, the p-type semiconductor layer 16 is constituted by a part of the well region 13; however, the p-type semiconductor layer 16 may alternatively be formed by forming a high-concentration p-type semiconductor layer on the front surface side of the substrate 12.

By forming the p-type semiconductor layers 15 and 16 on the front and back surfaces of the substrate 12 in this manner, the dark current generated at the interface between the substrate 12 and the oxide films formed at the front and back surfaces of the substrate 12 can be suppressed. Note that the oxide film formed on the front surface of the substrate 12 corresponds to the oxide film formed between the substrate 12 and a wire of the wiring layer, which is not illustrated, and the oxide film formed on the back surface of the substrate 12 corresponds to an insulation film 21 formed between the substrate 12 and the light-shielding film 22.

The first charge accumulation unit 18 is formed of an n-type semiconductor layer provided in connection with the n-type semiconductor layer 14 included in the photoelectric conversion unit 17. This first charge accumulation unit 18 is formed on the back surface side of the substrate 12, and has the width narrower than the width of the n-type semiconductor layer 14 of the photoelectric conversion unit 17 in the depth direction. In this embodiment, the impurity concentration of the n-type semiconductor layer included in the first charge accumulation unit 18 is higher than the impurity concentration of the n-type semiconductor layer 14 included in the photoelectric conversion unit 17. For example, when the impurity concentration of the n-type semiconductor layer included in the photoelectric conversion unit 17 is $10^{-14}$ to $10^{-15}$ cm$^{-3}$, the first charge accumulation unit 18 can be formed of the n-type semiconductor layer with an impurity concentration of $10^{-15}$ to $10^{-16}$ cm$^{-3}$.

In this manner, in this embodiment, by setting the impurity concentration of the first charge accumulation unit 18 to be higher than that of the n-type semiconductor layer 14 included in the photoelectric conversion unit 17, the substrate 12 has potential gradient. Thus, the signal charges generated in the photoelectric conversion unit 17 flow to the first charge accumulation unit 18 with high potential and are accumulated therein.

In a region where the first charge accumulation unit 18 is formed, a p-type semiconductor layer 19 is formed continuously from the p-type semiconductor layer 15 included in the photoelectric conversion unit 17 on the back surface side of the substrate 12. This suppresses the dark current to be generated at the interface between the substrate 12 and the insulation film 21 also in the first charge accumulation unit 18.

The second charge accumulation unit 25 is constituted by an n-type semiconductor layer formed on the front surface side of the substrate 12, and is positioned overlapping with the first charge accumulation unit 18 in the depth direction (thickness direction) of the substrate 12. In other words, the second charge accumulation unit 25 is formed over the first charge accumulation unit 18 in the thickness direction of the substrate 12. On this occasion, the n-type semiconductor layer included in the first charge accumulation unit 18 and the n-type semiconductor layer included in the second charge accumulation unit 25 are electrically isolated from each other with the p-type well region 13 interposed therebetween. Moreover, in order to carry out the readout of the signal charges to the signal charges from the first charge accumulation unit 18 to the second charge accumulation unit 25 more perfectly (i.e., reduce the charges left untransferred), the impurity concentration of the second charge accumulation unit 25 is desirably higher than that of the first charge accumulation unit 18.

A portion that is closer to the front surface side than the n-type semiconductor layer of the second charge accumulation unit 25 is provided with a thin p-type semiconductor layer 26 in contact with the second charge accumulation unit 25. With this p-type semiconductor layer 26, the generation of the dark current at the interface between the substrate 12 and the oxide film of the wiring layer (not illustrated) formed on the front surface side of the substrate 12 can be suppressed.

The floating diffusion unit 34 is formed in a region between the second charge accumulation unit 25 and the photoelectric conversion unit 17 on the front surface side of the substrate 12. The floating diffusion unit 34 is formed by a high-concentration n-type semiconductor layer. In addition to this, the source/drain region of each pixel transistor is formed on the front surface side of the substrate 12. FIG. 3 typically illustrates drains 35 and 29 of the first and second reset transistors Tr3 and Tr4.

The source/drain region in each pixel transistor is formed of a high-concentration n-type semiconductor layer in a manner similar to the floating diffusion unit 34. The floating diffusion unit 34 and the source/drain region of each pixel transistor are also formed overlapping with the first charge accumulation unit 18 in the depth direction of the substrate 12, and are formed so that the n-type semiconductor layers thereof are not connected to each other by having the p-type well region 13 therebetween.

The first transfer transistor Tr1 is formed by the first charge accumulation unit 18 serving as a source, the second charge accumulation unit 25 serving as a drain, and a first transfer gate electrode 27. The first transfer gate electrode 27 included in the first transfer transistor Tr1 is a vertical gate electrode formed in the depth direction from the front surface side of the substrate 12, and is formed at the depth of such a degree that the first transfer gate electrode 27 reaches the first charge accumulation unit 18 through the second charge accumulation unit 25. This first transfer gate electrode 27 is formed by embedding the electrode material into a trench formed at a desired depth from the front surface side of the substrate 12 with a gate insulation film 28 interposed therebetween.

Although not illustrated in FIG. 2, in the case of forming the first transfer gate electrode 27, a p-type semiconductor layer may be formed thinly at each of a side surface and a bottom surface of the trench. By thinly forming the p-type semiconductor layer at each of the side surface and the bottom surface of the trench, the dark current generated at the interface between the trench and the substrate 12 can be suppressed.

Then, the first transfer gate electrode 27 is connected to a wire that supplies a first transfer pulse ΦTRG1 as illustrated in FIG. 3. In the first transfer transistor Tr1, the signal charges accumulated in the first charge accumulation unit 18 can be read out to the second charge accumulation unit 25 when the desired first transfer pulse ΦTRG1 is applied to the first transfer gate electrode 27. In this case, a channel is formed along the first transfer gate electrode 27, and the signal charges move to the second charge accumulation unit 25 along the first transfer gate electrode 27.

The second transfer transistor Tr2 includes the second charge accumulation unit 25 serving as a source, the floating diffusion unit 34 serving as a drain, and a second transfer gate electrode 32. The second transfer gate electrode 32 included in the second transfer transistor Tr2 is formed on the front surface side of the substrate 12 between the source and the drain with the gate insulation film 28 formed of, for example, a silicon oxide film interposed therebetween. The second transfer gate electrode 32 is connected to a wire that supplies a second transfer pulse ΦTRG2 as illustrated in FIG. 3. The signal charges accumulated in the second charge accumulation unit 25 can be read out to the floating diffusion unit 34 when the desired second transfer pulse ΦTRG2 is applied to the second transfer transistor Tr2.

The first reset transistor Tr3 includes the floating diffusion unit 34 serving as a source, a drain 35 connected to a power source voltage Vdd, and a first reset gate electrode 33. The first reset gate electrode 33 included in the first reset transistor Tr3 is formed on the front surface side of the substrate 12 between the source and the drain with the gate insulation film 28 formed of, for example, a silicon oxide film interposed therebetween. The first reset gate electrode 33 is connected to a wire that supplies a first reset pulse ΦRST1 as illustrated in FIG. 3. The potential of the floating diffusion unit 34 is reset to the power source voltage Vdd when a desired reset pulse ΦRST1 is applied to the first reset gate electrode 33 in the first reset transistor ΦRST1.

The second reset transistor Tr4 includes the first charge accumulation unit 18 serving as a source, the drain 29 connected to the power source voltage Vdd, and a second reset gate electrode 30. The second reset gate electrode 30 included in the second reset transistor Tr4 is a vertical gate electrode formed in the depth direction of the substrate 12 from the front surface side of the substrate 12, and is formed at the depth of such a degree that the second reset gate electrode 30 reaches the first charge accumulation unit 18 through the drain 29. The second reset gate electrode 30 is formed by embedding the electrode material into a trench formed at a desired depth from the front surface side of the substrate 12 with the gate insulation film 28 interposed therebetween.

The second reset gate electrode 30 is connected to a wire that supplies a second reset pulse ΦRST2 as illustrated in FIG. 3. In the second reset transistor Tr4, the potential of the first charge accumulation unit 18 is reset to the power source voltage Vdd when a desired reset pulse ΦRST2 is applied to the second reset gate electrode 30. In this case, a channel is formed along the second reset gate electrode 30 and the signal charges are discharged to the drain 29 along the third reset gate electrode 30. Since the first charge accumulation unit 18 and the photoelectric conversion unit 17 are electrically connected to each other in this embodiment, the potential of the photoelectric conversion unit 17 is reset to the power source voltage Vdd as the same time as resetting the first charge accumulation unit 18.

The amplification transistor Tr5 includes a drain connected to the power source voltage Vdd, a source also serving as a drain of the selection transistor Tr6, and a selection gate electrode 45. As illustrated in FIG. 3, the amplification gate electrode 45 between the source and the drain of the amplification transistor Tr5 is connected to the floating diffusion unit 34. This amplification transistor Tr5 forms a source follower circuit with the power source voltage Vdd as the load, and a pixel signal according to the potential change of the floating diffusion unit 34 is output from the amplification transistor Tr5.

The selection transistor Tr6 includes a drain also serving as the source of the amplification transistor Tr5, a source connected to the vertical signal line 9, and a selection gate electrode 46. As illustrated in FIG. 3, the selection gate electrode 46 between the source and the drain of the selection transistor Trs is connected to a wire that supplies a selection pulse φSEL. When the selection pulse φSEL is supplied to the selection gate electrode 46 for each pixel, the pixel signal amplified in the amplification transistor Tr5 is output to the vertical signal line 9 via the selection transistor Tr6.

In the sectional structure of FIG. 2, the amplification transistor Tr5 and the selection transistor Tr6 are illustrated as the circuit diagram and the sectional structure is omitted; in fact, the amplification transistor Tr5 and the selection transistor Tr6 are formed overlapping with the first charge accumulation unit 18 in the depth direction of the substrate 12. The source/drain region of the amplification transistor Tr5 and the selection transistor Tr6 has a structure similar to the structure of the source/drain region of the first reset transistor Tr3, for example.

Although not illustrated, a plurality of wiring layers is formed over the front surface side of the substrate 12 with an interlayer insulation film interposed therebetween. A desired pulse is supplied to each pixel transistor through the wiring layers, whereby the signal charge of each pixel 2 is read out.

The light-shielding film 22 is formed over the back surface side of the substrate 12, which corresponds to the light incidence surface side, with the insulation film 21 formed of, for example, a silicon oxide film interposed therebetween, and is formed to open the photoelectric conversion unit 17 for the light incidence surface and shield the regions of the first charge accumulation unit 18 and the pixel transistors from light. The light-shielding film 22 may be formed of any material as long as the light can be blocked; for example, tungsten (W), aluminum (Al), titanium (Ti), titanium nitride (TiN), copper (Cu), or tantalum (Ta) can be used. Alternatively, the light-shielding film 22 can be formed of a multilayer film including any of these materials.

The color filter layer 23 is formed over the light-shielding film 22 with the insulation film 21 interposed therebetween, and a filter layer selectively transmitting R (red), G (green), and B (blue) light is disposed for every pixel. These filter layers are disposed for each pixel in the Bayer array.

The color filter layer 23 transmits light with a desired wavelength, and the transmitted light enters the photoelectric conversion unit 17 in the substrate 12. In this embodiment, each pixel transmits any of R, G, B light; however, the present invention is not limited thereto. The material of the color filter layer 23 may be an organic material that transmits light of cyan, yellow, magenta, or the like, and various colors can be selected according to the specification.

The on-chip lens 24 is formed over the color filter layer 23 for each pixel. The on-chip lens 24 condenses the incident light, and the condensed light enters each photoelectric conversion unit 17 efficiently through the color filter layer 23. In this embodiment, the on-chip lens 24 has a structure for condensing the incident light at a central position of the photoelectric conversion unit 17 open in the light-shielding film 22.

In the solid-state imaging device 1 of this embodiment, the incident light is converted into electricity in the photoelectric conversion unit 17 and the signal charge corresponding to the incident light is generated in the photoelectric conversion unit 17. The generated signal charges move along the potential gradient in the substrate 12, and are accumulated mainly in the first charge accumulation unit 18. The signal charges accumulated in the first charge accumulation units 18 are mainly transferred to the second charge accumulation units 25 simultaneously in the entire pixels and are transferred to the floating diffusion units 34 for each row. This driving method is described later in detail.

In the solid-state imaging device 1 of this embodiment, the first charge accumulation unit 18 connected to the photoelectric conversion unit 17 and the second charge accumulation unit 25 holding the signal charges temporarily are stacked in the depth direction of the substrate 12. This can reduce the pixel area, thereby achieving the miniaturization of the pixels. The signal charges accumulated in the first charge accumulation unit 18 can be read out by the first transfer transistor Tr1 including the vertical transistor. The vertical transistor reads out the signal charges in the depth direction of the substrate 12, whereby the vertical transistor occupies smaller area than the general planar transistor that reads out the signal charges in the horizontal direction of the substrate 12. This can achieve further miniaturization of the pixels.

In the solid-state imaging device 1 of this embodiment, the first charge accumulation unit 18 and the second charge accumulation unit 25 are stacked in the depth direction of the substrate 12 and the signal charges of the first charge accumulation unit 18 are transferred by the first transfer transistor Tr1 including the vertical transistor. Therefore, the position of the second charge accumulation unit 25 may be any position as long as the position overlaps with the first charge accumulation unit 18; thus, the degree of freedom of the layout of the pixel transistors is high. By forming the second charge accumulation unit 25 close to the center of the light-shielding film 22, the first transfer transistor Tr1 can be formed in a region apart from the opening of the light-shielding film 22. This can prevent the incident light from leaking to the second charge accumulation unit 25 due to the diffraction phenomenon, scattering phenomenon, etc. during the signal readout, thereby reducing the noise further.

Since the first charge accumulation unit 18 connected to the photoelectric conversion unit 17, and the semiconductor layer forming each pixel transistor are formed at the overlapping positions in the depth direction of the substrate 12, the area of the first charge accumulation unit 18 can be enlarged. This can improve the saturated charge amount.

1-3 Manufacturing Method

Next, a manufacturing method for the solid-state imaging device 1 of this embodiment is described. FIG. 4A to FIG. 5F are process diagrams illustrating the manufacturing method for the solid-state imaging device 1 of this embodiment.

First, in this embodiment, an n-type substrate 12 of silicon is prepared and ions of boron (B) of the Group-III atom as p-type dopant are implanted thereto, thereby forming the p-type well region 13. After that, as illustrated in FIG. 4A, ions of phosphorus (P) of the Group-V atom as n-type dopant are implanted to a front surface side of the substrate 12 through a desired mask. Thus, the second charge accumulation unit 25, the floating diffusion unit 34, and the source/drain regions 29 and 35 of each pixel transistor are formed.

After that, the ions of p-type impurity are implanted into the front surface side of the second charge accumulation unit 25 at high concentration, thereby forming the thin p-type semiconductor layer 26. These steps can be conducted by the manufacturing process for the general CMOS solid-state imaging device.

Next, a support substrate (not illustrated) formed of silicon or the like is attached to the front surface side of the substrate 12 and the substrate 12 is reversed so that the back surface side of the substrate 12 faces upward. Next, as illustrated in FIG. 4B, a resist layer 36 having an opening in the region to be provided with the photoelectric conversion unit 17 is formed and the ions of the n-type impurity are implanted through the resist layer 36. Thus, a first region 14a of the n-type semiconductor layer 14 included in the photoelectric conversion unit 17 is formed.

Next, as illustrated in FIG. 4C, while the back surface side of the substrate 12 is doped with the n-type impurity by a CVD (Chemical Vapor Deposition) method, the n-type semiconductor layer 31 is subjected to epitaxial growth until a desired thickness is obtained. Thus, a second region 14b included in the n-type semiconductor layer 14 of the photoelectric conversion unit 17 and the n-type semiconductor layer included in the first charge accumulation unit 18 are formed. Accordingly, the first charge accumulation unit 18 and the n-type semiconductor layer 14 of the photoelectric conversion unit 17 are formed.

In this embodiment, the concentration of the n-type semiconductor layer of the first charge accumulation unit 18 is preferably higher than the impurity concentration of the n-type semiconductor layer 14 of the photoelectric conversion unit 17. Therefore, the ions of the n-type impurity may be implanted again on the first charge accumulation unit 18 side as necessary.

Next, as illustrated in FIG. 4D, a resist layer 37 with an opening formed in a desired region is formed on the back surface side of the substrate 12, i.e., on a top surface of the n-type semiconductor layer 31 having been subjected to the epitaxial growth. Here, the resist layer 37 is formed which has an opening in the portion where the pixel isolation unit 20 illustrated in FIG. 4D is formed.

Next, ions of the p-type impurity are implanted through the resist layer 37, thereby forming the pixel isolation unit 20. Here, ions of the p-type dopant are implanted at high concentration to the depth that at least the n-type semiconductor layer 31 formed in the previous step is isolated for each pixel.

Then, the resist layer 37 formed in the step of forming the pixel isolation unit 20 is removed and ions of the p-type impurity are implanted at high concentration at a shallow position in the upper part of the n-type semiconductor layer 14 of the photoelectric conversion unit 17 and the first charge accumulation unit 18. Thus, the p-type semiconductor layers 15 and 19 for suppressing the dark current are formed as depicted in FIG. 5E. Then, an annealing process is performed at approximately 1000° C. to activate each of the impurity regions.

Next, a support substrate (not illustrated) attached to the front surface side of the substrate 12 is removed and another support substrate (not illustrated) is attached to the back surface side of the substrate 12 and the substrate 12 is reversed so that the front surface side of the substrate 12 faces upward. After that, as depicted in FIG. 5F, the gate electrode of each pixel transistor is formed.

In the step of forming the gate electrode, first, the front surface side of the semiconductor substrate is etched in the depth direction of the substrate 12 through a mask having an opening in the region where the vertical gate electrode is formed, whereby a trench with a desired depth is formed. After that, the mask used at the etching is removed and a silicon oxide film serving as the gate insulation film 28 is formed on the front surface side of the substrate 12 including the inner peripheral surface of the trench. Then, at the same time as filling the inside of the trench, a gate electrode material film of polysilicon or the like is formed on the front surface side of the substrate 12. Finally, the gate electrode material film is etched to form the gate electrode of each pixel transistor as illustrated in FIG. 5F.

Note that in this embodiment, the p-type semiconductor layer 16 on the front surface side of the photoelectric conversion unit 17 is formed of the p-type well region 13. The present invention is, however, not limited thereto and the p-type semiconductor layer for suppressing the dark current may be formed as necessary by implanting ions of the p-type impurity at high concentration at the shallow position of the front surface side of the photoelectric conversion unit 17 after the formation of the gate electrode.

Next, although not illustrated, the wiring layer is formed by forming a plurality of wires with an interlayer insulation film such as a silicon oxide film interposed therebetween on the front surface side of the substrate 12. After the wiring layer is formed, the support substrate attached to the back surface side of the substrate 12 is removed. Then, after another support substrate is attached to the wiring layer side, the substrate 12 is reversed so that the back surface side of the substrate faces upward. By sequentially forming the light-shielding film 22, the color filter layer 23, the on-chip lens 24, etc. through the general process on the back surface side of the substrate, the solid-state imaging device 1 of this embodiment illustrated in FIG. 2 is completed.

1-4 Driving Method

Figure 6:
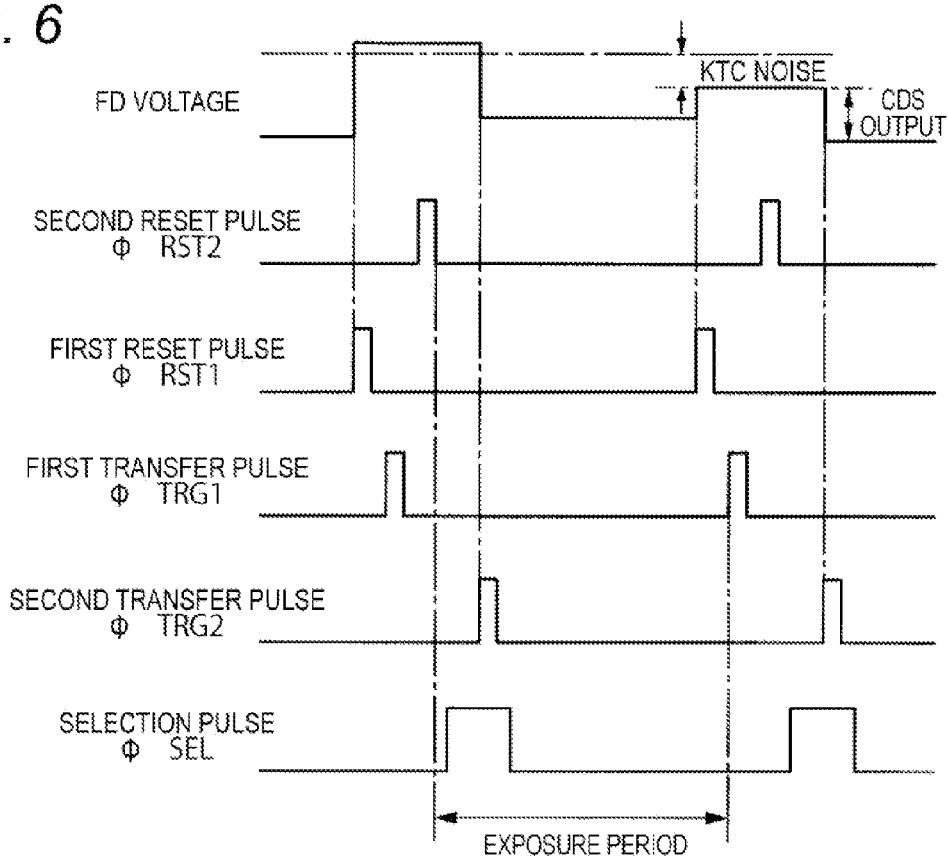
FIG. 6 is a timing chart illustrating a driving method for the solid-state imaging device according to the first embodiment.
Figure 7:
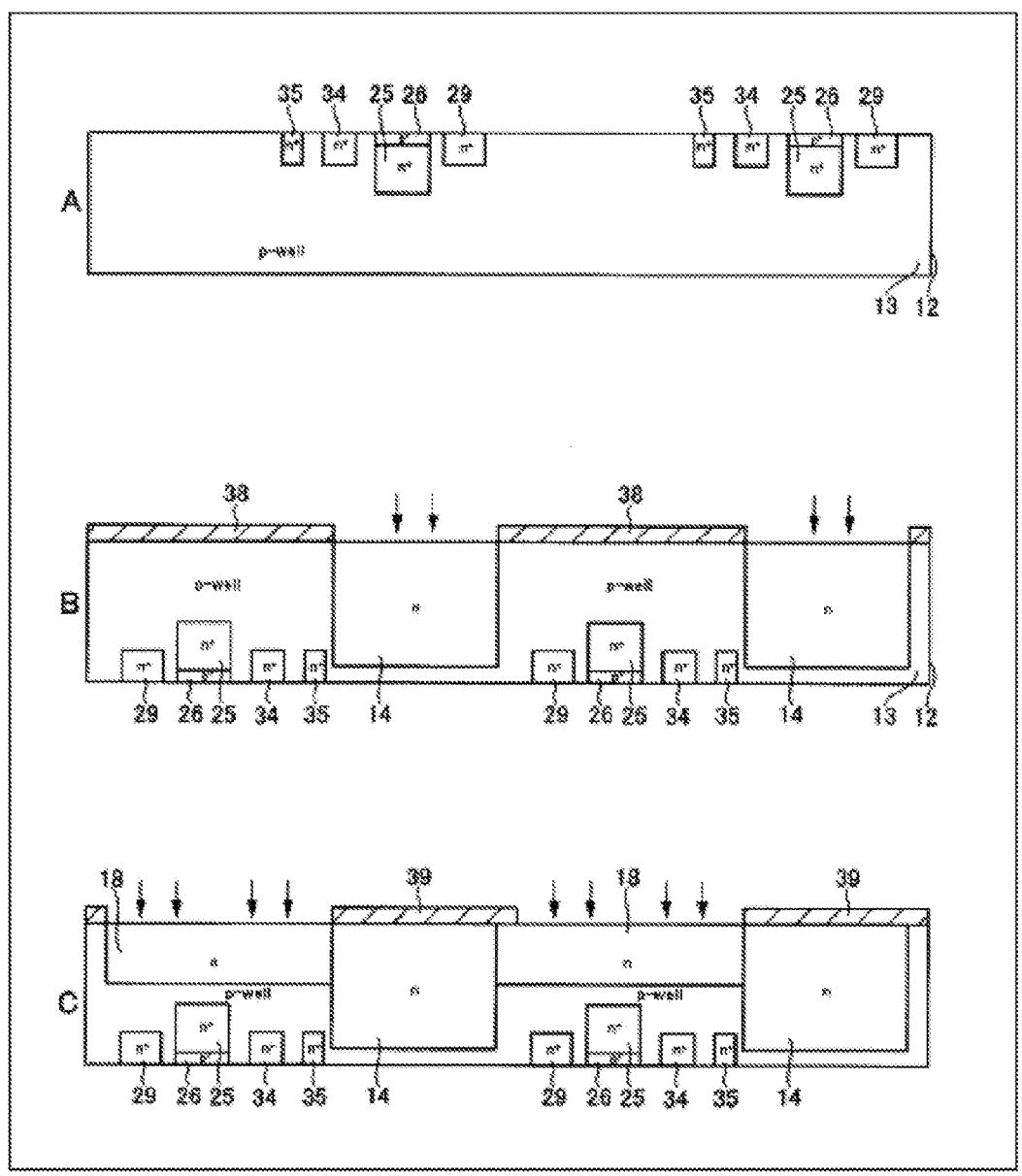
FIGS. 7A to 7C are process diagrams illustrating a manufacturing method for the solid-state imaging device according to a modified example.

Next, a driving method for the solid-state imaging device 1 of this embodiment is described. FIG. 6 is a timing chart illustrating the driving method for the solid-state imaging device 1 of this embodiment. Here, description is made of the timing of reading out the pixels in the n-th row.

First, the supply of the first reset pulses ΦRST1 to the entire pixels is started simultaneously to turn on the first reset transistors Tr3. Thus, the signal charges accumulated in the floating diffusion unit 34 are discharged toward the power source voltage Vdd, and the floating diffusion unit 34 is reset. Here, the signal charges accumulated in the floating diffusion unit 34 are the signal charges read out in the previous frame. After that, the supply of the first reset pulses ΦRST1 to the entire pixels is stopped simultaneously and the second reset transistors Tr3 are turned off.

Next, the first transfer transistors Tr1 are turned on by starting the supply of the first transfer pulses ΦTRG1 simultaneously in the entire pixels. Thus, the signal charges accumulated in the photoelectric conversion unit 17 and the first charge accumulation unit 18 are transferred to the second charge accumulation unit 25. After that, the first transfer transistors Tr1 are turned off by stopping the supply of the first transfer pulses ΦTRG1 simultaneously in the entire pixels. In this embodiment, the signal charges read out in the second charge accumulation units 25 simultaneously in the entire pixels are held in the second charge accumulation units 25 until the readout time of each row.

Next, the supply of the second reset pulses ΦRST2 to the entire pixels is started simultaneously and the second reset transistors Tr4 are turned on. Thus, the signal charges left in the photoelectric conversion units 17 and the first charge accumulation units 18 and the signal charges accumulated in the period from the time when the first transfer transistors Tr1 are turned off to the time when the second reset transistors Tr4 are turned on are discharged toward the power source voltage Vdd, and reset. After that, the second reset transistors Tr4 are turned off simultaneously in the entire pixels, thereby starting the exposure of the next frame.

A series of operations up to this step is conducted simultaneously in the entire pixels. In other words, in this embodiment, the global exposure is started by turning off the second reset transistors Tr4 simultaneously in the entire pixels, and the global exposure is finished by turning on the first transfer transistors Tr1 simultaneously in the entire pixels. In other words, the exposure period corresponds to the period from when the second reset transistor Tr4 is turned off to when the first transfer transistor Tr1 is turned on. In the exposure period, the signal charges corresponding to the quantity of incident light are generated in the photoelectric conversion unit 17. The signal charges generated in the photoelectric conversion unit 17 move along the potential in the substrate 12, and are accumulated mainly in the first charge accumulation unit 18.

Next, the readout for each row is started. In the readout of the signal charges in the n-th row, when the turn of operation of the n-th row has come, the selection transistors Tr6 are turned on by supplying the selection pulse ΦSEL. Thus, the potential of the floating diffusion unit 34 in the reset state is read out as the reset signal and taken into the column circuit.

Next, in the state that the selection pulse ΦSEL is supplied, the supply of the second transfer pulse ΦTRG2 is started and the second transfer transistor Tr2 is turned on. Thus, in the pixels in the n-th row, the signal charges accumulated in the second charge accumulation units 25 are transferred to the floating diffusion units 34. After that, the output corresponding to the potential of the floating diffusion unit 34 is taken into the column circuit as the pixel signal. In the column circuit, correlated double sampling is conducted by taking the difference between this pixel signal and the reset signal obtained first. Thus, in the column circuit, the pixel signal with the kTc noise removed therefrom can be obtained.

After that, the supply of the second transfer pulses ΦTRG2 is stopped and the supply of the selection pulses ΦSEL is stopped, so that the second transfer transistors Tr2 and the selection transistors Tr6 are turned off to end the readout of the pixels in the n-th row. After the end of the readout of the pixels in the n-th row, the pixels in the (n+1)-th row are read out; in this manner, the readout of the entire rows is sequentially carried out.

In this embodiment, the global shutter operation becomes possible in the solid-state imaging device 1 with the pixels miniaturized, whereby the simultaneous exposure in the entire pixels becomes possible to solve the focal plane distortion. In this embodiment, by separately providing the second reset transistor Tr4 that resets the signal charges accumulated in the first charge accumulation unit 18, the exposure period of the next frame can be started before the end of the readout period. This effect is particularly effective in shooting the moving image.

1-5 Modified Example

Although the aforementioned example has described the manufacturing method for the solid-state imaging device 1 in which the first charge accumulation unit 18 is formed using the epitaxial growth, the method of forming the solid-state imaging device 1 according to this embodiment is not limited thereto. As a modified example, another example of the manufacturing method for the solid-state imaging device 1 of this embodiment is described. FIG. 7A to FIG. 7C are process diagrams illustrating the manufacturing method for the solid-state imaging device 1 according to the modified example.

First, in the modified example, the second charge accumulation unit 25, the floating diffusion unit 34, the source/drain regions 29 and 35 of each pixel transistor, and the p-type semiconductor layer 26 are formed on the front surface side of the substrate 12 in a manner similar to the first embodiment illustrated in FIG. 7A.

As illustrated in FIG. 7B, a resist layer 38 having an opening in the region to be provided with the photoelectric conversion unit 17 is formed on the back surface side of the substrate 12. By implanting the ions of the n-type impurity with high energy through the resist layer 38, the n-type semiconductor layer 14 of the photoelectric conversion unit 17 is formed. Here, unlike the manufacturing method illustrated in FIG. 4 and FIG. 5, the entire region of the n-type semiconductor layer 14 of the photoelectric conversion unit 17 is formed by one ion implantation. Therefore, the ion implantation is performed with higher energy than in the process illustrated in FIG. 4B.

Next, after the resist layer 38 used in the previous step is removed, a resist layer 39 having an opening in the region to be provided with the first charge accumulation unit 18 is formed as illustrated in FIG. 7C. Then, by implanting the ions of the n-type impurity through the resist layer 39, the first charge accumulation unit 18 is formed to the desired depth of the substrate 12. Here, the impurity concentration of the n-type semiconductor layer of the first charge accumulation unit 18 is preferably higher than the impurity concentration of the n-type semiconductor layer 14 of the photoelectric conversion unit 17. Therefore, the first charge accumulation unit 18 is formed by the ion implantation at higher concentration than the n-type semiconductor layer 14 of the photoelectric conversion unit 17.

After that, the solid-state imaging device 1 illustrated in FIG. 2 is completed by the steps similar to the steps illustrated in FIG. 4D to FIG. 5F. By forming all the impurity regions through the ion implantation, the epitaxial growth process can be omitted, so that the number of steps can be reduced to achieve the cost reduction.

2. Second Embodiment

Example of Forming One Vertical Transistor in Each Pixel

Figure 8:
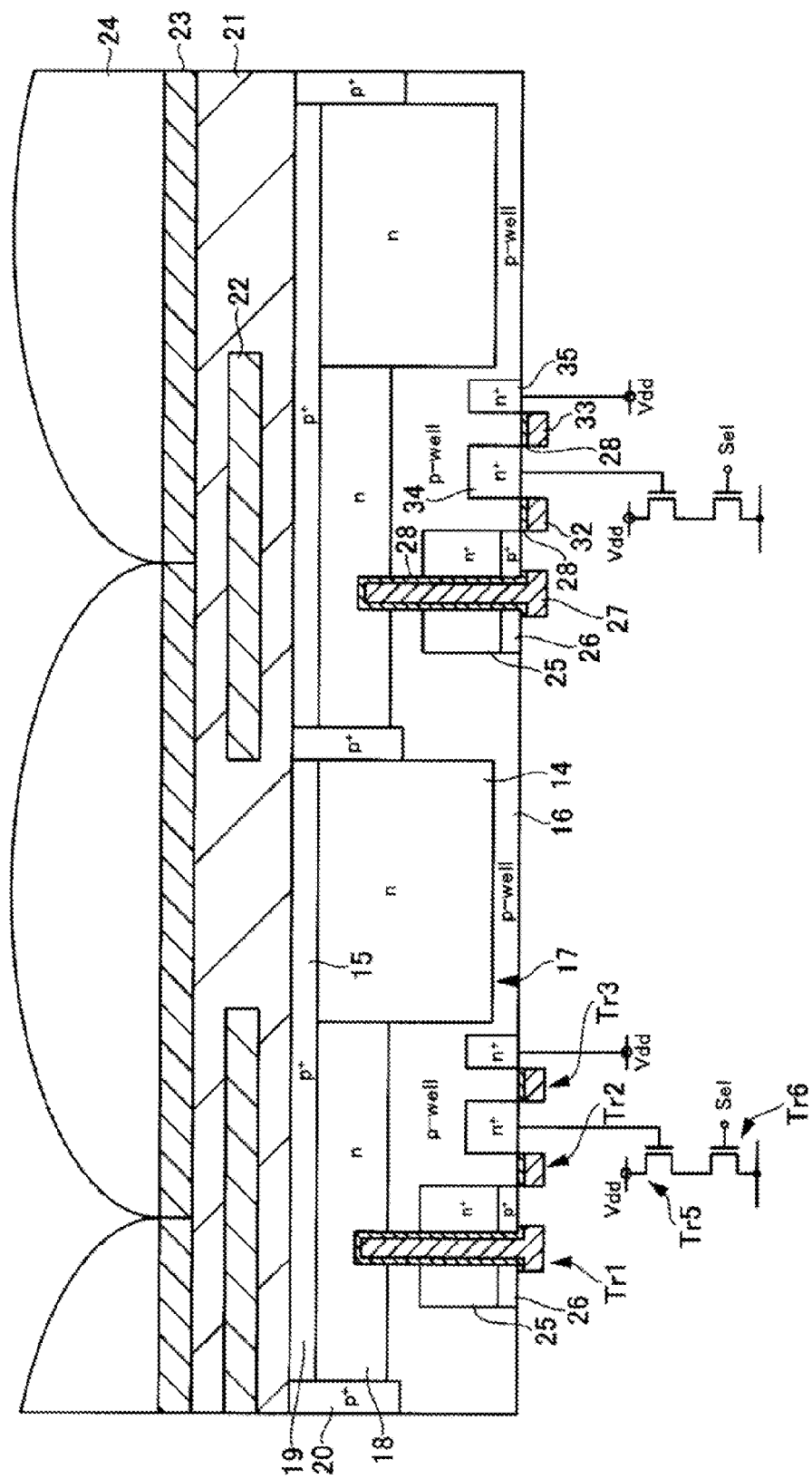
FIG. 8 is a sectional structure diagram of main components of a solid-state imaging device according to a second embodiment of the present disclosure.

Next, a solid-state imaging device according to a second embodiment of the present disclosure is described. FIG. 8 is a sectional structural diagram of main components of a solid-state imaging device 70 according to this embodiment. In FIG. 8, the same part as that of FIG. 2 is denoted by the same reference symbol and the description thereto is not repeated.

This embodiment describes an example in which the second reset transistor Tr4 is not formed in the solid-state imaging device 1 according to the first embodiment. In other words, each pixel of the solid-state imaging device 70 of this embodiment includes the first transfer transistor Tr1, the second transfer transistor Tr2, the reset transistor Tr3, the amplification transistor Tr5, and the selection transistor Tr6.

Figure 9:
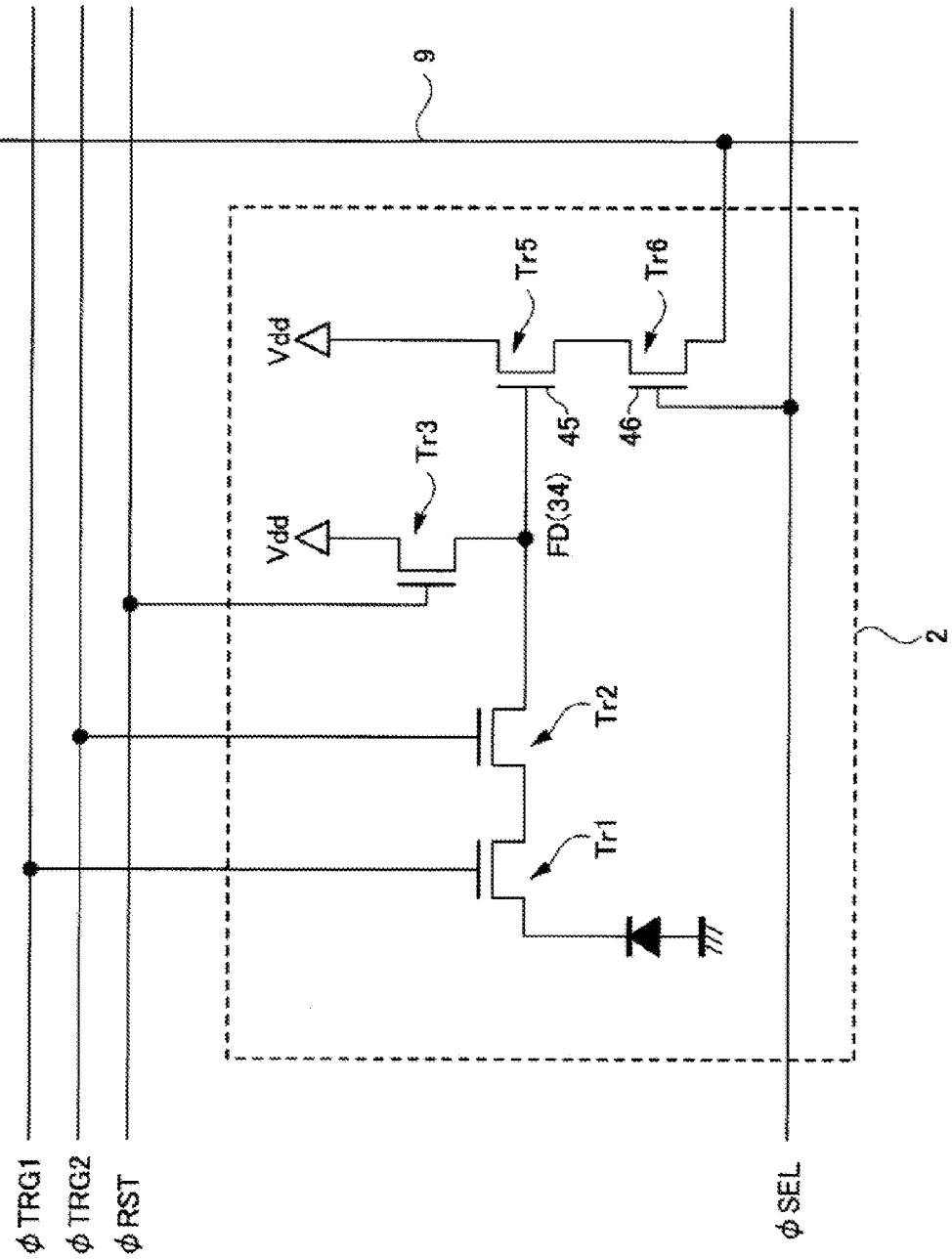
FIG. 9 is an equivalent circuit diagram of a pixel of the solid-state imaging device according to the second embodiment.

FIG. 9 is an equivalent circuit diagram of the pixel of the solid-state imaging device 70 of this embodiment. As illustrated in FIG. 9, in this embodiment, the source of the reset transistor Tr3 is the floating diffusion unit 34 and the drain thereof is connected to the power source voltage Vdd. A reset pulse ΦRST is applied to the gate electrode 33 of the reset transistor Tr3 through the wire.

Figure 10:
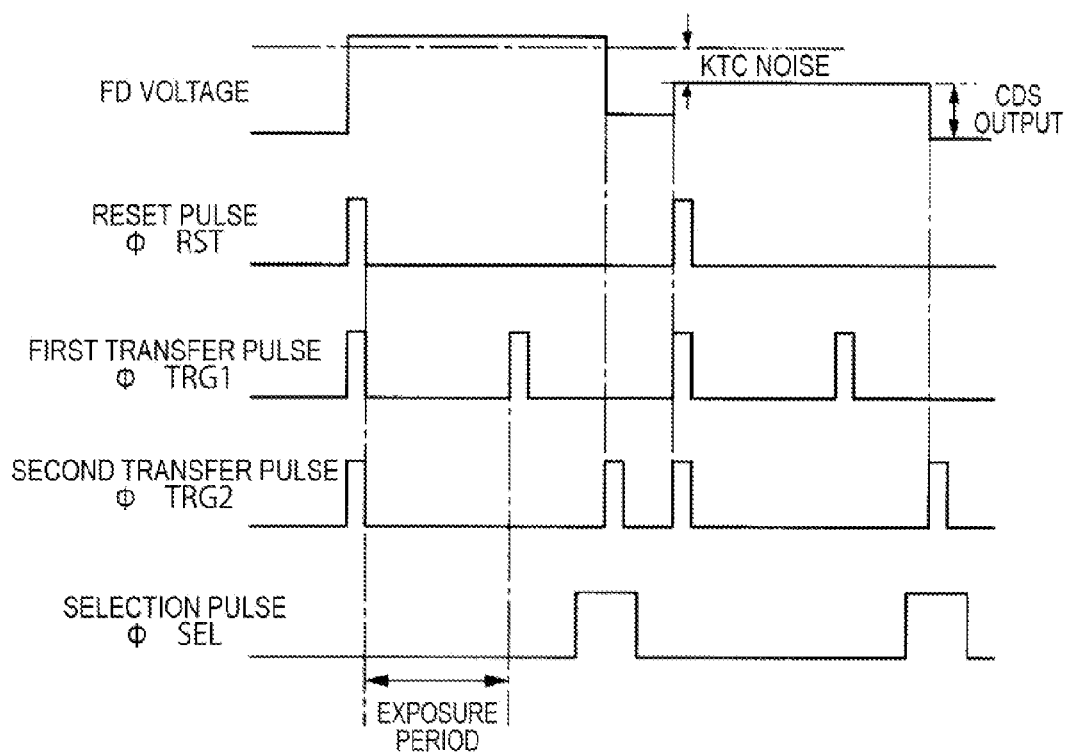
FIG. 10 is a timing chart illustrating a driving method for the solid-state imaging device according to the second embodiment.

A driving method for the solid-state imaging device 70 of this embodiment having the above structure is described. FIG. 10 is a timing chart depicting the driving method for the solid-state imaging device 70 of this embodiment. Here, description is made of the timing of reading out the pixels in the n-th row.

First, the supply of the reset pulses ΦRST is started simultaneously in the entire pixels and the supply of the first transfer pulses ΦTRG1 and the second transfer pulses ΦTRG2 is also started simultaneously in the entire pixels, and the reset transistors Tr3, the first transfer transistors Tr1 and the second transfer transistors Tr2 are turned on simultaneously. Thus, the signal charges accumulated in the floating diffusion unit 34 are discharged toward the power source voltage Vdd, and the floating diffusion unit 34 is reset. At the same time, since the second charge accumulation unit 25, the first charge accumulation unit 18, and the photoelectric conversion unit 17 are electrically connected to the power source voltage Vdd, the second charge accumulation unit 25, the first charge accumulation unit 18, and the photoelectric conversion unit 17 are also reset.

Here, the signal charges accumulated in the floating diffusion unit 34 before the reset are the signal charges read out in the previous frame. The signal charges accumulated in the first charge accumulation unit 18 and the photoelectric conversion unit 17 are the signal charges generated in the photoelectric conversion unit 17 after the end of the exposure period in the previous frame.

After that, the supply of the reset pulses ΦRST, the first transfer pulses ΦTRG1, and the second transfer pulses ΦTRG2 is stopped simultaneously in the entire pixels, and the reset transistors Tr3, the first transfer transistors Tr1, and the second transfer transistors Tr2 are turned off. By turning off the first transfer transistors Tr1, the exposure period is started.

Next, the first transfer transistors Tr1 are turned on by starting the supply of the first transfer pulses ΦTRG1 simultaneously in the entire pixels. Thus, the exposure period ends and the signal charges accumulated in the photoelectric conversion unit 17 and the first charge accumulation unit 18 are transferred to the second charge accumulation unit 25. After that, the first transfer transistors Tr1 are turned off by stopping the supply of the first transfer pulses ΦTRG1 simultaneously in the entire pixels. In this embodiment, the signal charges read out in the second charge accumulation units 25 simultaneously in the entire pixels are held in the second charge accumulation units 25 until the readout time of each row.

A series of operations up to this step is conducted simultaneously in the entire pixels. In other words, in this embodiment, the global exposure is started when the reset transistors Tr3, the first transfer transistors Tr1, and the second transfer transistors Tr2 are turned off simultaneously in the entire pixels. Then, the global exposure ends when the first transfer transistors Tr1 are turned on simultaneously in the entire pixels. In other words, the exposure period corresponds to the period from when the first transfer transistors Tr1 are turned off to when the first transfer transistors Tr1 are turned on. In the exposure period, the signal charges corresponding to the quantity of incident light are generated in the photoelectric conversion unit. The signal charges generated in the photoelectric conversion unit 17 move along the potential in the substrate 12, and are accumulated mainly in the first charge accumulation unit 18.

Next, the readout for each row is started. In the readout of the signal charges in the n-th row, when the turn of operation of the n-th row has come, the selection transistors Tr6 are turned on by supplying the selection pulse ΦSEL. Thus, the potential of the floating diffusion unit 34 in the reset state is read out as the reset signal and taken into the column circuit.

Next, in the state that the selection pulse ΦSEL is supplied, the supply of the second transfer pulse ΦTRG2 is started and the second transfer transistor Tr2 is turned on. Thus, in the pixels in the n-th row, the signal charges accumulated in the second charge accumulation units 25 are transferred to the floating diffusion units 34. After that, the output corresponding to the potential of the floating diffusion unit 34 is taken into the column circuit as the pixel signal. In the column circuit, correlated double sampling is conducted by taking the difference between this pixel signal and the reset signal obtained first. Thus, in the column circuit, the pixel signal with the kTc noise removed therefrom can be obtained.

After that, the supply of the second transfer pulses ΦTRG2 is stopped and the supply of the selection pulses ΦSEL is stopped, so that the second transfer transistors Tr2 and the selection transistors Tr6 are turned off to end the readout of the pixels in the n-th row. After the end of the readout of the pixels in the n-th row, the pixels in the (n+1)-th row are read out; in this manner, the readout of the entire rows is sequentially carried out.

In this embodiment, since the floating diffusion unit 34, the second charge accumulation unit 25, the first charge accumulation unit 18, and the photoelectric conversion unit 17 can be reset at one time, the circuits can be simplified to reduce the variation and the noise, which is advantageous.

Moreover, since the reset transistor for resetting the first charge accumulation unit 18 and the photoelectric conversion unit 17 is not provided in the solid-state imaging device 70 of this embodiment, the pixel area can be reduced. In this embodiment, the effects similar to those of the first embodiment can be obtained.

3. Third Embodiment

Solid-State Imaging Device of Front-Illumination Type

Figure 11:
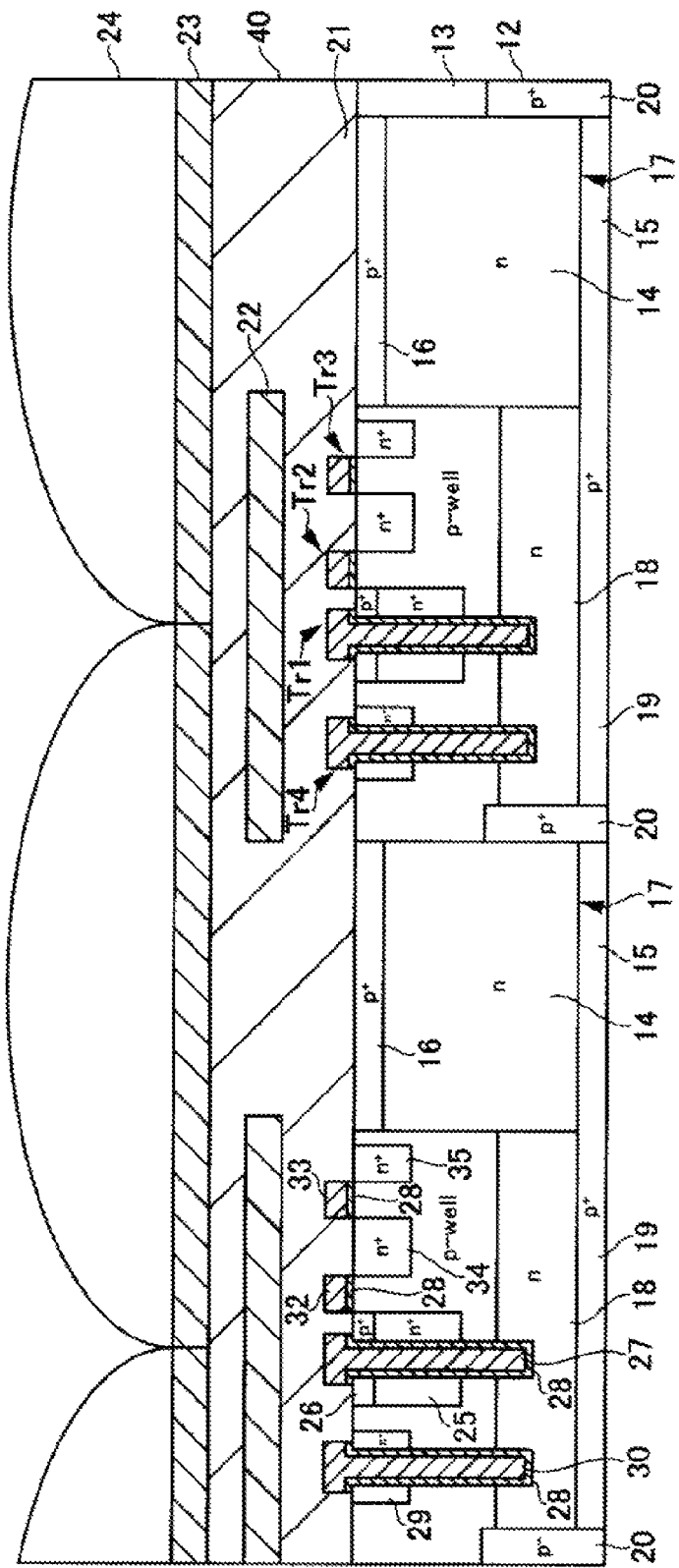
FIG. 11 is a sectional structure diagram of main components of a solid-state imaging device according to a third embodiment of the present disclosure.

Next, a solid-state imaging device according to a third embodiment of the present disclosure is described. Since the overall structure of the solid-state imaging device according to this embodiment is similar to that of FIG. 1, the illustration is omitted and the overlapping description is omitted. FIG. 11 is a sectional structure diagram of main components of a solid-state imaging device 71 of this embodiment. This embodiment describes an example of a solid-state imaging device of front-illumination type, in which the light incidence surface is formed on the opposite side to that of the solid-state imaging device 1 of the first embodiment. In FIG. 11, the same part as that in FIG. 2 is denoted by the same reference symbol and the description thereto is not repeated. Note that in FIG. 11, the illustration of a part of the pixel transistors included in each pixel is omitted.

In the solid-state imaging device 71 of this embodiment, as illustrated in FIG. 11, the light-shielding film 22 is formed on the front surface side of the substrate 12 provided with each pixel transistor, and the color filter layer 23 and the on-chip lens 24 are formed over the light-shielding film 22. On this occasion, the light-shielding film 22 can be formed using a part of the wires formed in the wiring layer (not illustrated) formed on the front surface side of the substrate 12.

In this embodiment, the p-type semiconductor layer 16 on the front surface side in the photoelectric conversion unit 17 is formed by implanting ions of the p-type impurity at high concentration. The solid-state imaging device 71 of this embodiment can be formed in a manner similar to the first embodiment until the pixel transistor is formed on the front surface side of the substrate 12. After the pixel transistor is formed, a wiring layer 40 including the light-shielding film 22, the color filter layer 23, and the on-chip lens 24 are formed on the front surface side of the substrate, thereby completing the solid-state imaging device 71 illustrated in FIG. 11.

In this embodiment, the light entering from the front surface side of the substrate 12 through the on-chip lens 24 and the color filter layer 23 is converted into electricity in the photoelectric conversion unit 17, so that the signal charges corresponding to the quantity of incident light are generated. The signal charges generated in the photoelectric conversion unit 17 are moved along the potential of the substrate 12 and are accumulated in the first charge accumulation unit 18.

Each impurity diffusion layer can be formed within the substrate 12 by a method similar to the method described in the first embodiment in the solid-state imaging device 71 having the above structure. However, since the solid-state imaging device 71 is the solid-state imaging device of the front-illumination type, the step of reversing the substrate 12 again after the step of forming the wiring layer is not necessary, thereby reducing the number of steps. In this embodiment, the driving method similar to that of the first embodiment can be employed.

In this embodiment, the effects similar to those of the first embodiment can be obtained.

4. Fourth Embodiment

Example of Drifting Signal Charges with Transfer Electrode

Figure 12:
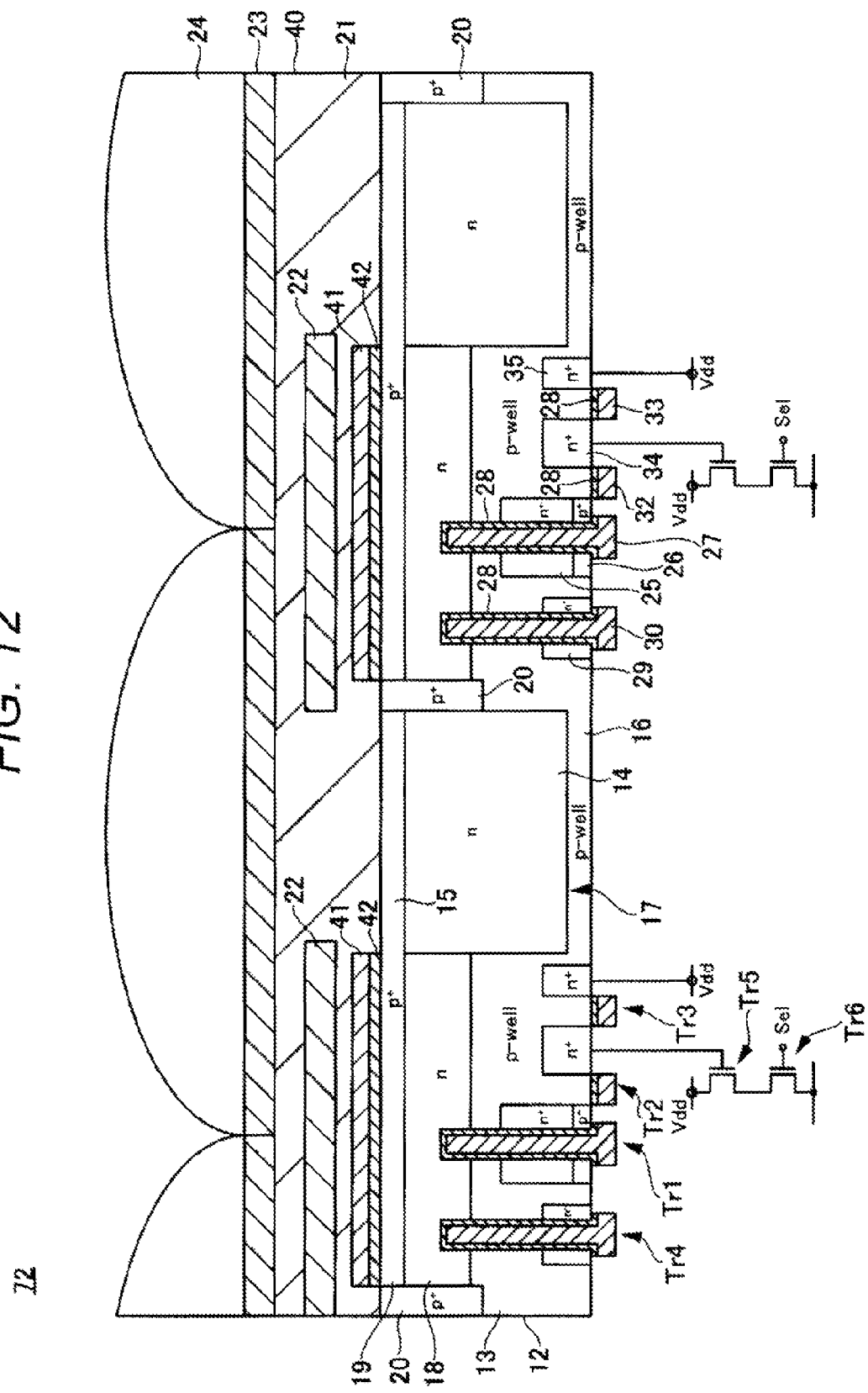
FIG. 12 is a sectional structure diagram of main components of a solid-state imaging device according to a fourth embodiment of the present disclosure.

Next, a solid-state imaging device according to a fourth embodiment is described. Since the overall structure of the solid-state imaging device according to this embodiment is similar to that of FIG. 1, the illustration is omitted and the overlapping description is omitted. FIG. 12 is a sectional structure diagram of main components of a solid-state imaging device 72 of this embodiment. This embodiment describes an example of moving the signal charges accumulated in the photoelectric conversion unit 17 toward the first charge accumulation unit 18 by applying voltage to the first charge accumulation unit 18. In FIG. 12, the same part as that of FIG. 2 is denoted by the same reference symbol, and the description thereto is not repeated.

In this embodiment, a transfer electrode 41 is formed over the first charge accumulation unit 18 with an insulation film 42 of a silicon oxide film interposed therebetween on the back surface side of the substrate 12 serving as the light incidence surface. The material of the transfer electrode 41 may be, for example, a conductive material such as polysilicon, Cu, Al, W. In this embodiment, the potential of the first charge accumulation unit 18 is lower than the potential of the photoelectric conversion unit 17 when positive voltage is applied to the transfer electrode 41.

In the solid-state imaging device 72 with the above structure, the signal charges generated in the photoelectric conversion unit 17 can be moved toward the first charge accumulation unit 18 by supplying a desired potential to the transfer electrode 41 in the exposure period. Therefore, the signal charges can be moved efficiently as compared with the structure in which the signal charges are moved along the potential gradient in the substrate 12 that is formed due to just the difference in impurity concentration between the photoelectric conversion unit 17 and the first charge accumulation unit 18 as described in the first embodiment. Moreover, since more signal charges can be supplied to the first charge accumulation unit 18, more signal charges can be read out by the first transfer transistor Tr1, thereby improving the sensitivity.

In this embodiment, the effects similar to those of the first embodiment can be obtained.

In this embodiment, the light-shielding film 22 and the transfer electrode 41 are provided separately; however, in the case of forming the transfer electrode 41 with the light-shielding conductive material, the transfer electrode 41 may also serve as the light-shielding film 22. In this case, the element can be reduced in height on the light incidence surface side.

5. Fifth Embodiment

Example of Reading Out Signal Charges with Signal Readout Transistor

Figure 13:
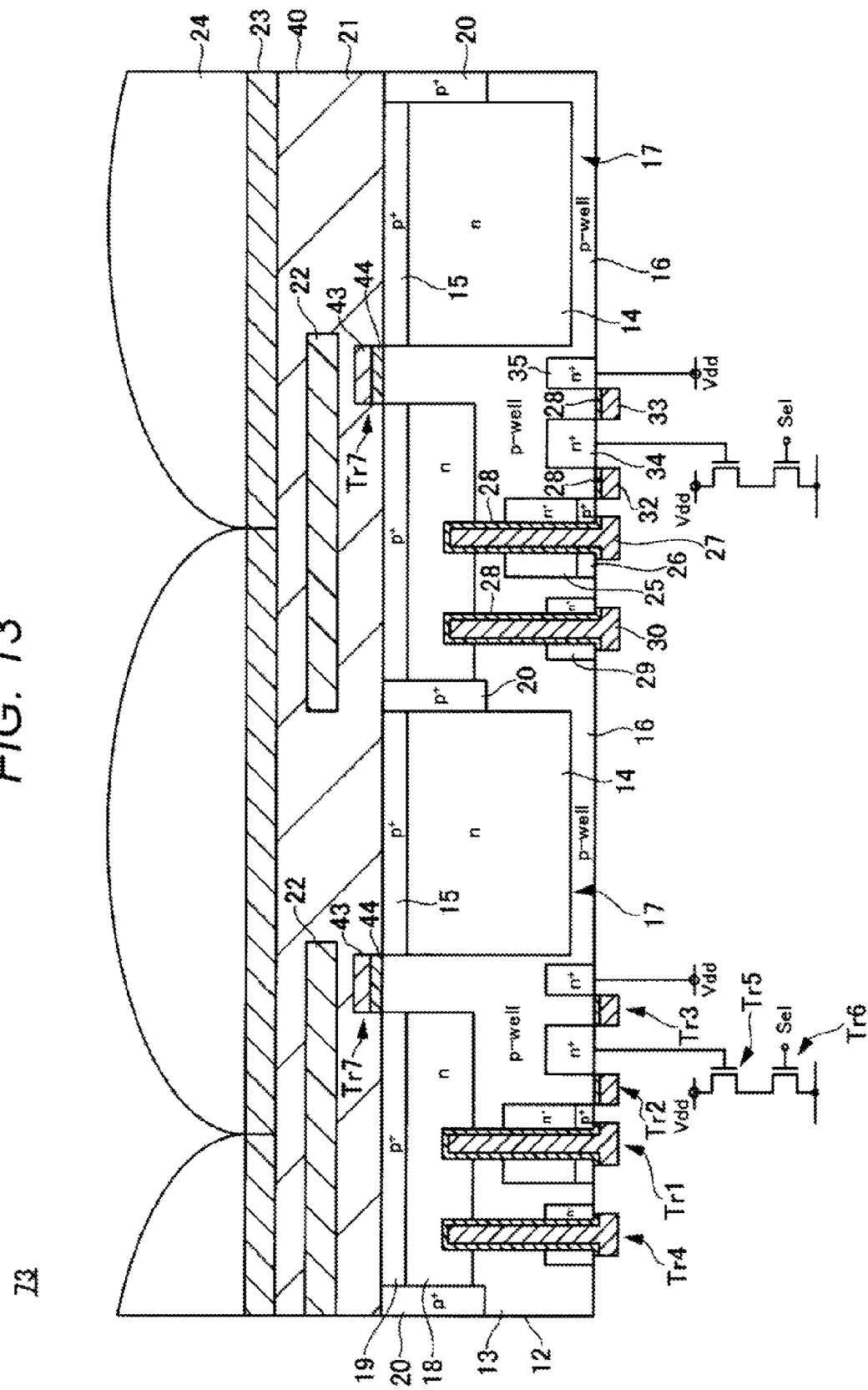
FIG. 13 is a sectional structure diagram of main components of a solid-state imaging device according to a fifth embodiment of the present disclosure.

Next, a solid-state imaging device according to a fifth embodiment of the present disclosure is described. Since the overall structure of the solid-state imaging device according to this embodiment is similar to that of FIG. 1, the illustration is omitted and the overlapping description is omitted. FIG. 13 is a sectional structure diagram of main components of a solid-state imaging device 73 of this embodiment. This embodiment describes an example of providing a signal readout transistor between the photoelectric conversion unit 17 and the first charge accumulation unit 18. In FIG. 13, the same part as that of FIG. 2 is denoted by the same reference symbol and the description thereto is not repeated.

In this embodiment, the n-type semiconductor layer 14 of the photoelectric conversion unit 17 and the first charge accumulation unit 18 are formed isolated from each other by a predetermined distance, and the p-type semiconductor layers 15 and 19 that are formed for suppressing the dark current on the back surface side of the substrate 12 are also isolated from each other by a predetermined distance. In a region between the photoelectric conversion unit 17 and the first charge accumulation unit 18, a transfer electrode 43 is formed on the back surface side of the substrate 12 with a gate insulation film 44 interposed therebetween. In other words, in this embodiment, the signal charges are transferred between the photoelectric conversion unit 17 and the first charge accumulation unit 18 with a signal readout transistor Tr7 including the transfer electrode 43.

In this embodiment, the signal charges generated in the photoelectric conversion unit 17 are transferred to the first charge accumulation unit 18 and accumulated in the first charge accumulation unit 18 when the desired readout potential is supplied to the transfer electrode 43 and the signal readout transistor Tr7 is turned on.

In this embodiment, since the transfer of the signal charges between the photoelectric conversion unit 17 and the first charge accumulation unit 18 is controlled by the signal readout transistor Tr7, the signal charges can be held once in the photoelectric conversion unit 17. Moreover, the signal charges can be held in the first charge accumulation unit 18. In this embodiment, therefore, the signal charges can be held twice in succession; accordingly, this can be applied to high-speed shutter.

In this embodiment, since the amount of signal charges remaining in the photoelectric conversion unit 17 can be controlled by controlling the voltage of the transfer electrode 43, the wide dynamic range becomes possible. Moreover, in this embodiment, the blooming caused by the overflow of the signal charges from the photoelectric conversion unit 17 can be prevented.

In this embodiment, the effects similar to those of the first embodiment can be obtained.

6. Sixth Embodiment

Example of Stacking Photoelectric Conversion Unit on Substrate

Figure 14:
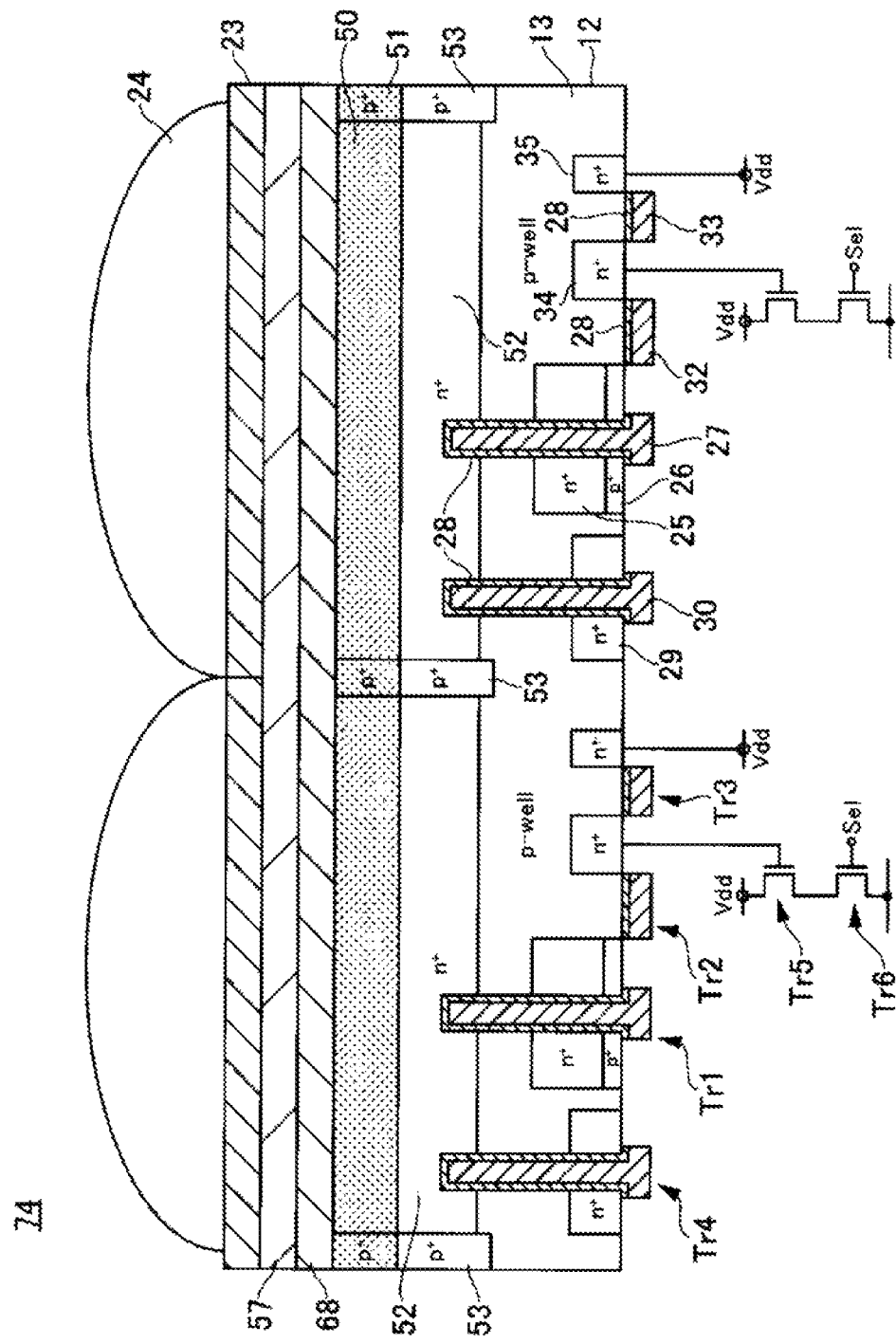
FIG. 14 is a sectional structure diagram of main components of a solid-state imaging device according to a sixth embodiment of the present disclosure.

Next, a solid-state imaging device according to a sixth embodiment of the present disclosure is described. Since the overall structure of the solid-state imaging device according to this embodiment is similar to that of FIG. 1, the illustration is omitted and the overlapping description is omitted. FIG. 14 is a sectional structure diagram of main components of a solid-state imaging device 74 of this embodiment. The solid-state imaging device 74 of this embodiment is different from that of the first embodiment in the structure of the photoelectric conversion unit. In FIG. 14, the same part as that of FIG. 2 is denoted by the same reference symbol and the description thereto is not repeated. In FIG. 14, a part of the pixel transistors included in each pixel is illustrated as the circuit diagram.

6-1 Structure of Main Components

As illustrated in FIG. 14, the solid-state imaging device 74 of this embodiment includes the substrate 12 provided with a first charge accumulation unit 52, the second charge accumulation unit 25, the floating diffusion unit 34, and the plurality of pixel transistors. The solid-state imaging device 74 includes a photoelectric conversion unit 50, a barrier layer 68, a transparent electrode 57, the color filter layer 23, and the on-chip lens 24 stacked on the light incidence surface side of the substrate 12.

The substrate 12 is formed of n-type silicon, and has a thickness of, for example, 3 μm to 5 μm and a pixel region where the impurity region of each pixel is formed is the p-type well region 13. The pixels are sectioned by a pixel isolation unit 53 formed in the substrate 12. The pixel isolation unit 53 is formed of the high-concentration p-type semiconductor layer provided at the desired depth from the back surface side of the substrate 12, and is provided to electrically isolate between the adjacent pixels.

In this embodiment, the first and second charge accumulation units 52 and 25 in each pixel, the floating diffusion unit 34, and the source/drain regions 29 and 35 of each pixel transistor are formed in the p-type well region 13. Each pixel includes the six pixel transistors: the first transfer transistor Tr1, the second transfer transistor Tr2, the first reset transistor Tr3, the second reset transistor Tr4, the amplification transistor Tr5, and the selection transistor Tr6.

The first charge accumulation unit 52 is formed of the n-type semiconductor layer to the desired depth from the back surface side of the substrate 12. The first charge accumulation unit 52 is formed for each corresponding pixel, and in each pixel, is formed across the region in the unit of pixel sectioned by the pixel isolation unit 53. The first charge accumulation unit 52 functions as an accumulation unit that accumulates the signal charges generated in the photoelectric conversion unit 50 to be described below.

The first charge accumulation unit 52 preferably has a structure in which impurities are distributed so that the n-type impurity concentration becomes higher in the depth direction from the back surface side of the substrate. With this structure, the first charge accumulation unit 52 can have the potential gradient in which the potential becomes higher in the depth direction of the substrate 12. Thus, the signal charges (electrons in this embodiment) having moved from the photoelectric conversion unit 50 automatically move toward the front surface side of the substrate 12 in the first charge accumulation unit 52.

Each pixel transistor is formed on the front surface side of the substrate 12 in a manner similar to the first embodiment, and in this embodiment, the first transfer transistor Tr1 and the second reset transistor Tr4 are vertical transistors. In other words, the first transfer gate electrode 27 and the second reset gate electrode 30 are formed to the depth of such a degree that the electrodes reach the first charge accumulation unit 52.

The photoelectric conversion unit 50 is formed of a photoelectric conversion material that can generate the signal charges corresponding to the quantity of incident light, and is stacked on the back surface side of the substrate 12 across the entire surface of the pixel region so as to cover the upper surface of the first charge accumulation unit 52 including the n-type semiconductor layer. The photoelectric conversion unit 50 also serves as the light-shielding film. In other words, the light incident into the photoelectric conversion unit 50 is converted into electricity in the photoelectric conversion unit 50 and does not enter the substrate 12 side. The photoelectric conversion unit 50 is also provided with a pixel isolation unit (hereinafter referred to as a photoelectric conversion unit side pixel isolation unit 51) to section the photoelectric conversion unit 50 for each pixel.

Figure 15:
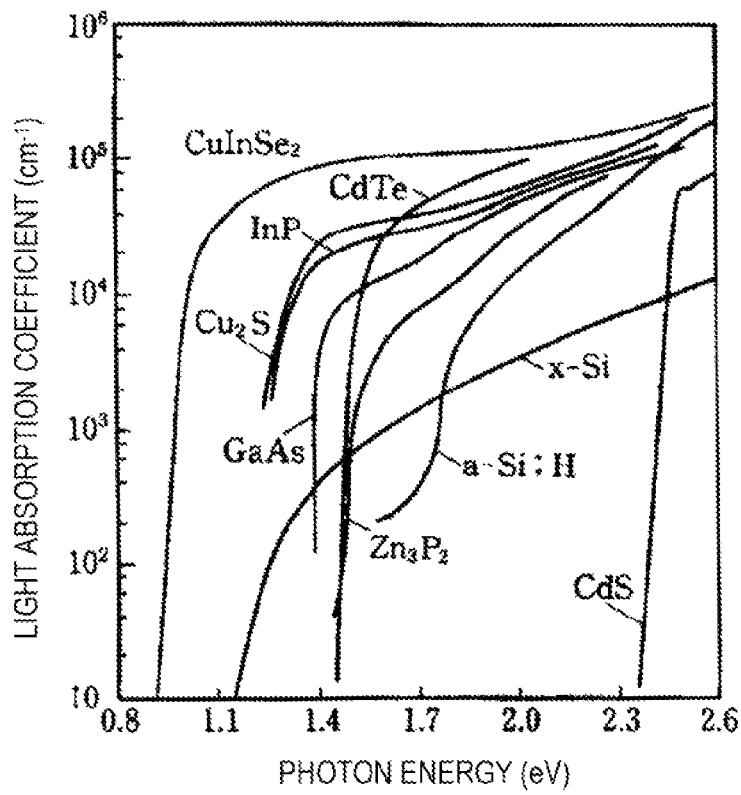
FIG. 15 is a diagram representing the relation between the photon energy and the light absorption coefficient in various semiconductor materials.

The photoelectric conversion unit 50 as above can be formed of a compound semiconductor with a chalcopyrite structure, more specifically $CuInSe_2$. FIG. 15 is a diagram illustrating the relation between the photon energy and the light absorption coefficient in various semiconductor materials. As illustrated in FIG. 15, the light absorption coefficient of $CuInSe_2$ is higher than that of the other materials, and particularly, approximately two digits higher than that of Si single crystal (x-Si in FIG. 15). Therefore, the photoelectric conversion unit formed of $CuInSe_2$ not just serves as the photoelectric conversion unit but also fulfills the function of the light-shielding film for blocking visible light.

The material of the photoelectric conversion unit 50 may have any crystal structure of single-crystal, polycrystalline, or amorphous structures as long as the absorption coefficient of visible light is higher than that of the substrate 12 made of silicon and the material exhibits the photoelectric conversion function. The chalcopyrite material of the photoelectric conversion unit 50 may be other chalcopyrite material than $CuInSe_2$.

Figure 16:
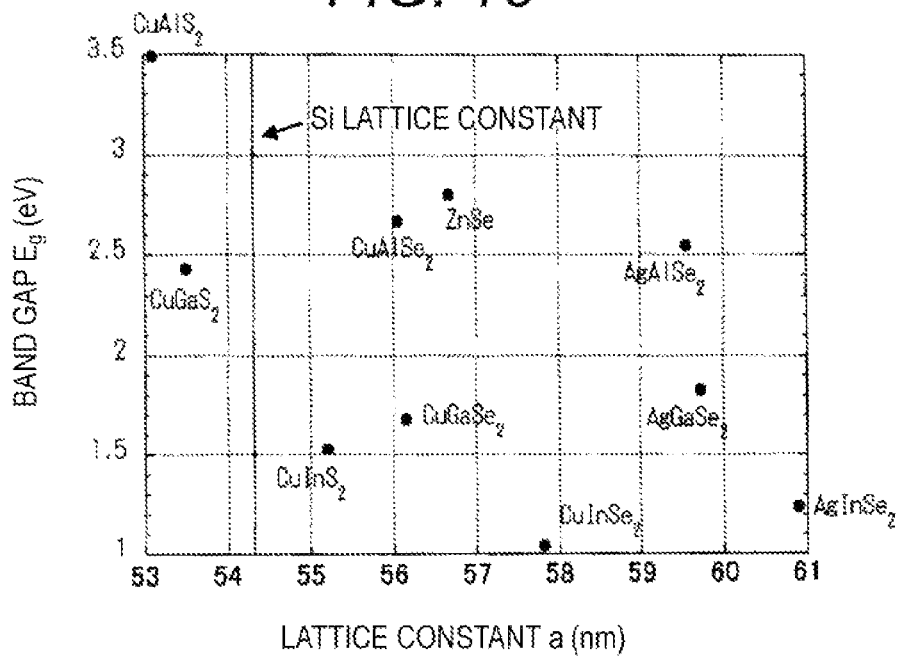
FIG. 16 is a diagram (Part 1) representing the relation between the lattice constant and band gap of chalcopyrite materials.
Figure 17:
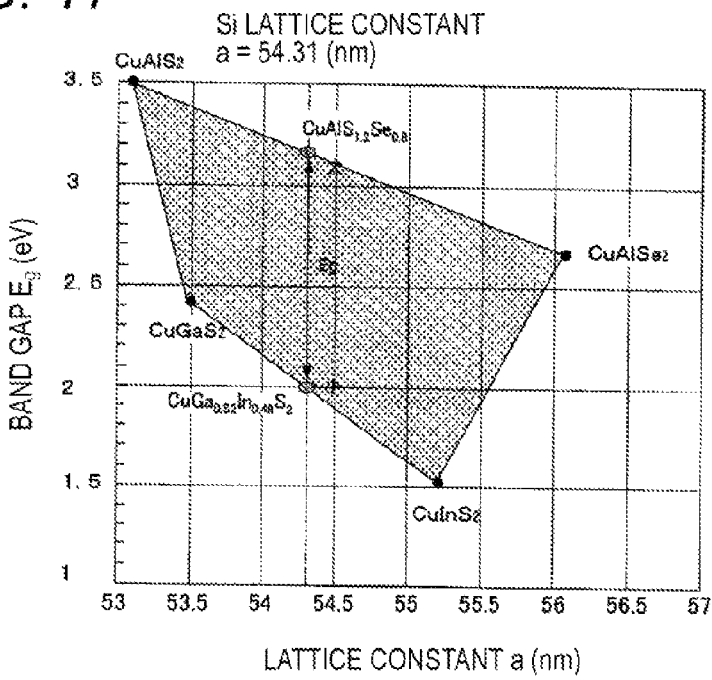
FIG. 17 is a diagram (Part 2) representing the relation between the lattice constant and band gap of chalcopyrite materials.

FIG. 16 and FIG. 17 are diagrams representing the relation between the lattice constant and the band gap of chalcopyrite materials. As is illustrated in FIG. 16, there are various chalcopyrite materials. Among those, for example, a compound semiconductor with the chalcopyrite structure including mixed crystal of copper-aluminum-gallium-indium-sulfur-selenium-based compound (hereinafter, CuAl- GaInSSe-based mixed crystal) may be used for forming the photoelectric conversion unit 50 as illustrated in FIG. 17.

The CuAlGaInSSe-based mixed crystal can have its composition controlled so as to adjust its lattice constant to the lattice constant of silicon; thus, the crystal defects can be reduced. Therefore, it is possible to produce a single-crystal thin film of CuAlGaInSSe-based mixed crystal through the epitaxial growth on the substrate 12 of silicon, and the crystal defects such as misfit dislocation on the hetero junction can be reduced. This can suppress the generation of dark current and reduce the noise.

The chalcopyrite material of the photoelectric conversion unit 50 may have any conductivity type of p-type, n-type, or i-type. It is preferable that, however, the impurity concentration is changed to enable the potential in the photoelectric conversion unit 50 to change so that the signal charges generated in the photoelectric conversion unit 50 move toward the first charge accumulation unit 52. When the electrons are used as the signal charges as described in this embodiment, the signal charges generated in the photoelectric conversion unit 50 move along the potential gradient and are accumulated in the first charge accumulation unit 52 by structuring the photoelectric conversion unit 50 so that the potential increases toward the substrate 12.

Figure 18:
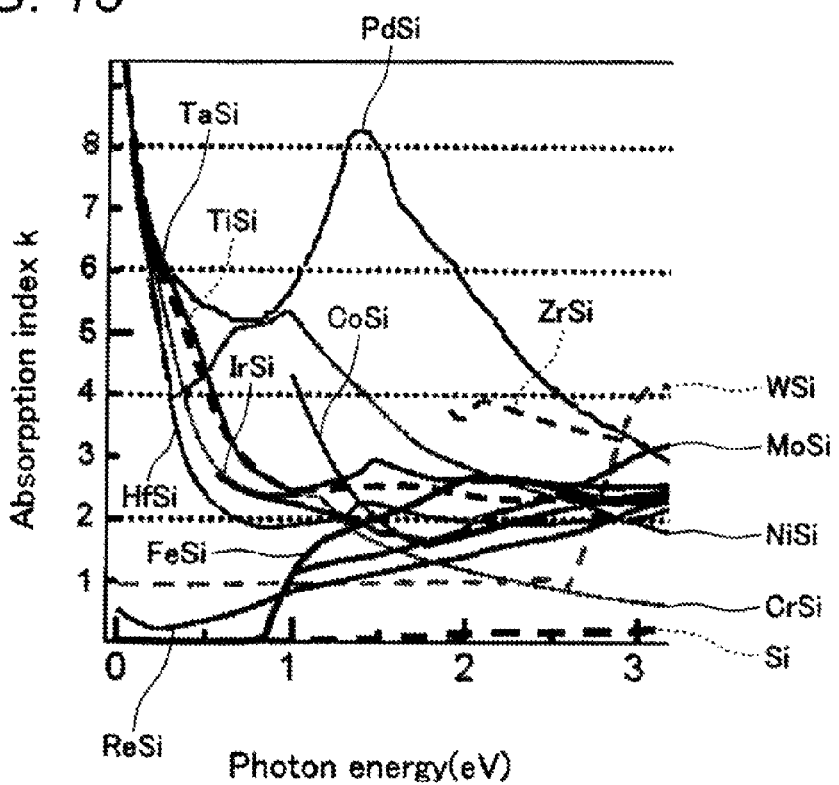
FIG. 18 is a diagram representing the relation between the extinction coefficient k and the photon energy of various silicide materials.

Alternatively, the photoelectric conversion unit 50 can be formed of a silicide material. FIG. 18 is a diagram illustrating the relation between the extinction coefficient k and the photon energy of various silicide materials.

The light absorption coefficient $\alpha$ satisfies the relation $\alpha=4\pi k/\lambda$, where k is the extinction coefficient and $\lambda$ is the wavelength. As is clear from FIG. 18, the silicide material such as CoSi, CrSi, HfSi, IrSi, MoSi, NiSi, PdSi, ReSi, TaSi, TiSi, WSi, or ZrSi has higher light absorption coefficient $\alpha$ than Si.

The light absorption coefficient of $\beta$-iron silicide material ($\beta$-FeSi$_2$) is approximately two digits higher than that of Si (see H. Katsumata, et al., J. Appl. Phys. 8(10), 5955 (1996)). Moreover, $\beta$-iron silicide material ($\beta$-FeSi$_2$) can be formed in the silicon substrate through the epitaxial growth (see John E. Mahan, et al., Appl. Phys. Lett. 56(21), 2126 (1990)). Therefore, by the use of $\beta$-iron silicide material ($\beta$-FeSi$_2$), the photoelectric conversion unit 50 that achieves both the photoelectric conversion function and the light-shielding function can be formed.

Moreover, the absorption coefficients of a barium silicide material (BaSi$_2$) and Ba$_{1-x}$Sr$_x$Si$_2$ are approximately two digits higher than that of silicon (Si). Additionally, another silicide material such as SiGe, Mg$_2$SiGe, SrSi$_2$, MnSi$_{1.7}$, CrSi$_2$, NiSi-based material, CuSi-based material, CoSi-based material, or PtSi also has high absorption coefficient. Therefore, by the use of the silicide material, the photoelectric conversion unit 50 also functioning as the light-shielding film can be formed.

The photoelectric conversion unit 50 can be formed of an organic material instead of the inorganic material as above. For example, an organic material including quinacridone pigment or coumarin pigment can be employed. In this embodiment, the color filter layer 23 is provided on the light incidence side of the photoelectric conversion unit 50; therefore, when the photoelectric conversion unit 50 is formed of the organic material, the material having sensitivity in the entire visible light range can be used. In each pixel, the photoelectric conversion unit 50 may be structured to absorb the light with the wavelength corresponding to the wavelength of the light transmitting through the color filter layer 23.

The organic material has low electron mobility. Therefore, in the case of structuring the photoelectric conversion unit 50 with the organic material, the photoelectric conversion unit side pixel isolation unit 51 for isolating the photoelectric conversion units 50 for each pixel may be omitted. Moreover, in the case of structuring the photoelectric conversion unit 50 with the organic material, the photoelectric conversion unit 50 can be formed by applying the organic material on the substrate 12.

The barrier layer 68 is provided between the transparent electrode 57 and the top of the photoelectric conversion unit 50 for preventing the carrier injection from the transparent electrode 57 toward the photoelectric conversion unit 50. The barrier layer 68 can be formed of a material that can prevent the electron injection; for example, a zinc oxide (ZnO) film, a nickel oxide (NiO) film, a copper oxide (Cu$_2$O) film, a diamond (C) film, or the like can be used. Although the barrier layer 68 is formed in this embodiment, the barrier layer 68 can be omitted.

The transparent electrode 57 is formed on the light incidence surface side of the top of the photoelectric conversion unit 50, and is formed across the entire surface of the pixel region. The transparent electrode 57 is formed of the electrode material that transmits the wavelength of the visible light region; for example, a transparent conductive film such as an indium tin oxide (ITO) film, an indium zinc oxide film, or an aluminum zinc oxide (AZO) film can be used. The transparent electrode 57 is connected to the ground potential to prevent the charging caused by the hole accumulation.

In this embodiment, the first charge accumulation unit 52 including the n-type semiconductor layer is formed below the photoelectric conversion unit 50 and the transparent electrode 57 connected to the ground potential is formed above the photoelectric conversion unit 50. Thus, the signal charges (electrons) generated according to the quantity of incident light move toward the first charge accumulation unit 52 in the photoelectric conversion unit 50 and the holes generated along with the generation of the signal charges move toward the transparent electrode 57.

Figure 19:
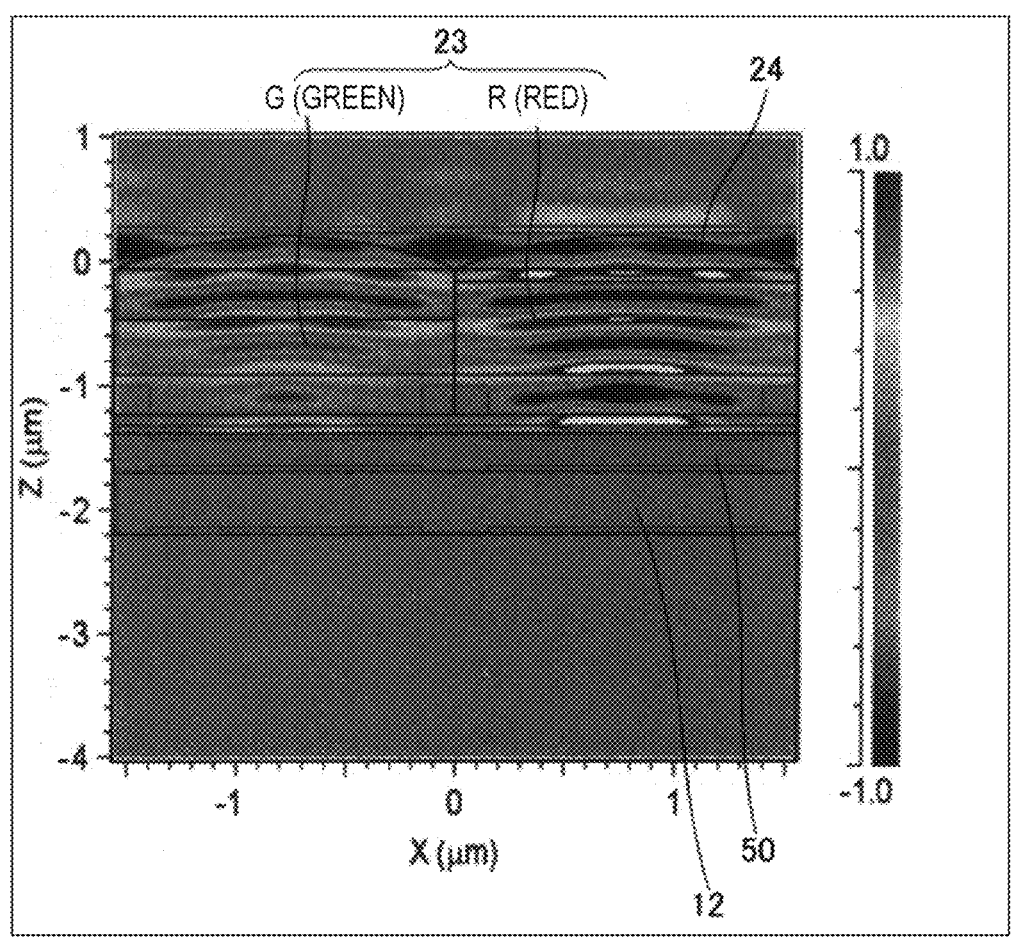
FIG. 19 is a diagram illustrating the result of simulating light transmission in the solid-state imaging device according to the sixth embodiment.
Figure 20:
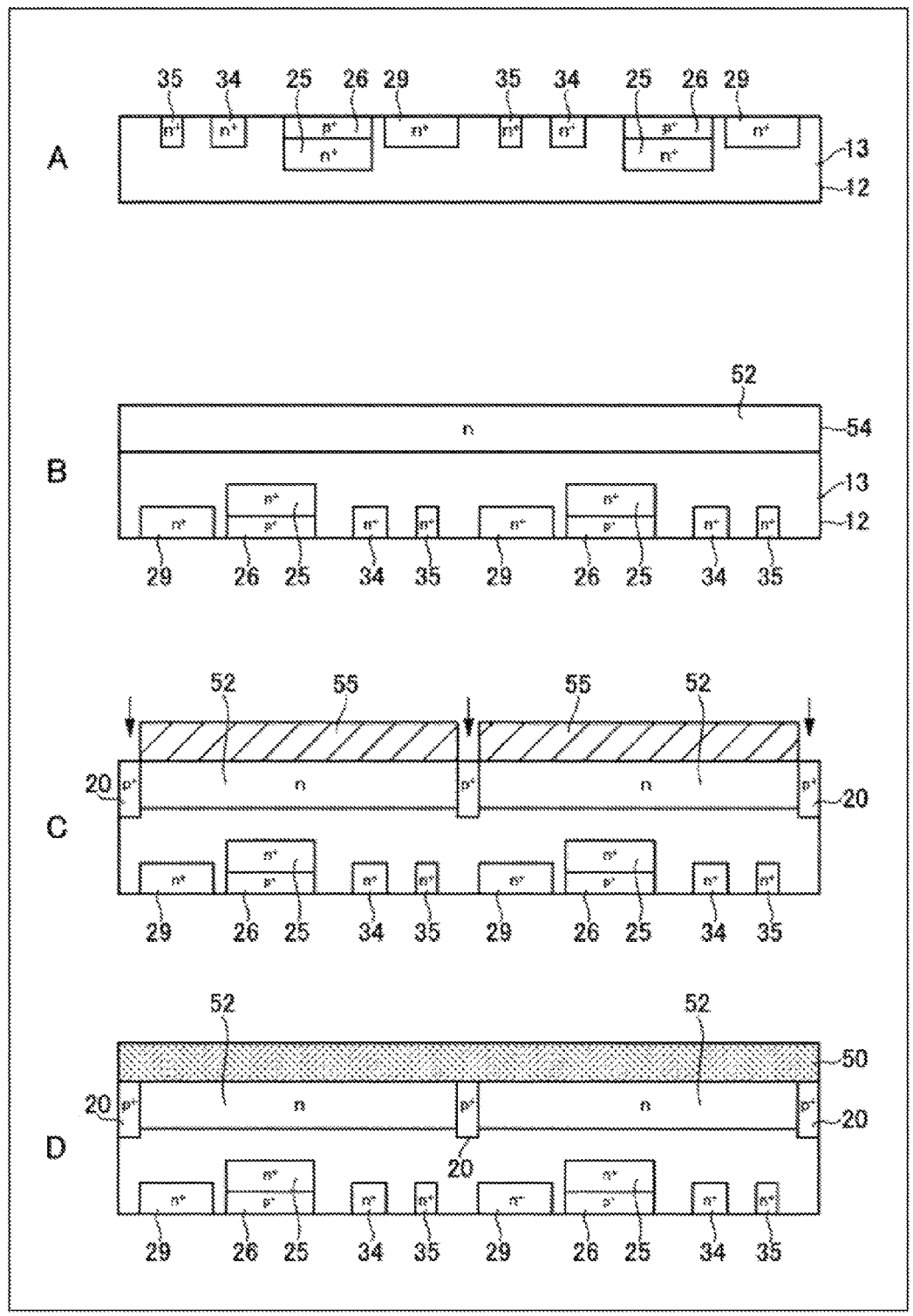
FIGS. 20A to 20D are process diagrams (Part 1) illustrating a manufacturing method for the solid-state imaging device according to the sixth embodiment.
Figure 21:
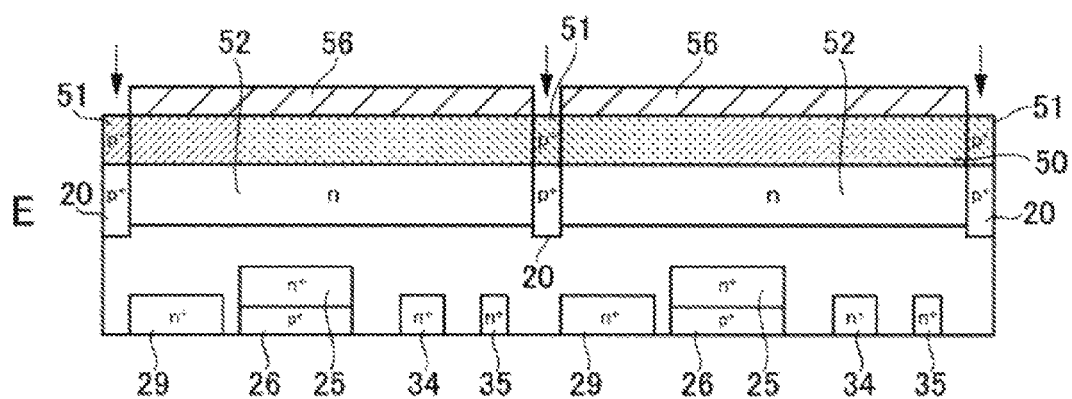
FIG. 21E is a process diagram (Part 2) illustrating the manufacturing method for the solid-state imaging device according to the sixth embodiment.

FIG. 19 is a diagram representing the result of simulating the light transmission in the solid-state imaging device 74 according to this embodiment. Here, FIG. 19 represents the result obtained when light with a wavelength of 650 nm enters the photoelectric conversion unit 50, which is a 0.3-µm-thick CuInGaS$_2$ film, provided on the 0.5-µm-thick substrate 12 through the on-chip lens 24.

FIG. 19 indicates that in the solid-state imaging device 74 of this embodiment, the incident light is absorbed in, and blocked by the photoelectric conversion unit 50, so that the light does not enter the substrate 12. In this case, as a result of specifically estimating the proportion of light reaching the bottom surface of the substrate 12 according to the simulation in which the light amount monitor is taken into consideration, it has been clarified that merely $1.8 \times 10^{-3}$% of light reaches the substrate 12 and almost all the light is blocked.

6-2 Manufacturing Method

A manufacturing method for the solid-state imaging device 74 of this embodiment is described. Here, an example is described in which the solid-state imaging device 74 is formed using the photoelectric conversion unit 50 formed of the chalcopyrite-based material of the CuAlGaInSSe-based mixed crystal. Moreover, this embodiment describes the case of forming the photoelectric conversion unit 50 by forming the aforementioned compound semiconductor through the epitaxial growth with the use of a silicon substrate whose main plane is (100)-plane. FIG. 20A to FIG. 21E are process diagrams illustrating the manufacturing method for the solid-state imaging device 74 of this embodiment.

First, in this embodiment, the n-type substrate 12 is prepared and by implanting the ions of the p-type impurity, for example, the p-type well region 13 is formed. After that, as illustrated in FIG. 20A, ions of P (phosphorus) of Group-V atom as the n-type dopant are implanted on the front surface side of the substrate 12, whereby the second charge accumulation unit 25, the floating diffusion unit 34, and the source/drain regions 29 and 35 of each pixel transistor are formed.

After that, ions of the p-type impurity are implanted at high concentration on the front surface side of the second charge accumulation unit 25, whereby the p-type semiconductor layer 26 is formed. These steps can be conducted by the manufacturing process for the general CMOS solid-state imaging device.

Next, a support substrate (not illustrated) formed of silicon or the like is attached to the front surface side of the substrate 12 and the substrate 12 is reversed so that the back surface side of the substrate 12 faces upward. After that, as illustrated in FIG. 20B, the n-type semiconductor layer 54 to be the first charge accumulation unit 52 is subjected to the epitaxial growth until the thickness becomes the desired thickness while the back surface side of the substrate 12 is doped with the n-type impurity by a CVD method.

Next, as illustrated in FIG. 20C, a resist layer 55 having an opening in the region to be provided with the pixel isolation unit 20 is formed on the n-type semiconductor layer 54 having been subjected to the epitaxial growth. This resist layer 55 can be formed by a general photolithography technique. The pixel isolation unit 20 is formed by implanting the ions of the p-type impurity through the resist layer 55 at higher concentration than the impurity concentration of the p-type well region 13, for example. The p-type semiconductor layer of the pixel isolation unit 20 is formed to the depth of such a degree that at least the first charge accumulation unit 52 is isolated for each pixel.

Next, as illustrated in FIG. 20D, the photoelectric conversion unit 50 is formed by forming the chalcopyrite-based material through the epitaxial growth on the first charge accumulation unit 52. In this embodiment, as a method of forming the chalcopyrite-based compound semiconductor through the epitaxial growth, for example, a molecular beam epitaxy (MBE), metal organic chemical vapor deposition (MOCVD), or liquid phase epitaxy (LPE) can be employed.

The lattice constant of silicon (Si) of the substrate 12 is 51.45 nm, and the CuAlGaInSSe-based mixed crystal includes the material corresponding to this lattice constant, whereby the photoelectric conversion unit 50 that can lattice-match with the substrate 12 can be formed. Therefore, for example, a $CuGa_{0.52}In_{0.48}S_2$ film can be formed through the epitaxial growth on the substrate 12 as the photoelectric conversion unit 50.

In the case of forming the photoelectric conversion unit 50 by the MOCVD method, the organic metal raw material is bubbled with hydrogen in the MOCVD apparatus to produce a saturated vapor pressure state. Thus, the organic metal raw material is thermally decomposed to be taken into the crystal, thereby causing the crystal growth and forming the photoelectric conversion unit 50 on the substrate 12 of silicon. On this occasion, by controlling the flow rate of hydrogen to be supplied to each raw material in the MOCVD apparatus, the molar ratio of the raw materials to be transported per unit time is determined. Since this molar ratio is correlated with the composition ratio of the crystal to be formed, the composition ratio of the photoelectric conversion unit 50 that is formed through the epitaxial growth can be controlled by controlling the molar ratio of the raw material transported per unit time.

In the case of forming the photoelectric conversion unit 50 by the MOCVD method, for example, acetylacetone copper $(Cu(C_5H_7O_2)_2)$ can be used as the organic metal raw material of copper. Alternatively, cyclopentadienyl copper triethyl phosphine $(h5\text{-}(C_2H_5)Cu\text{:}P(C_2H_5)_3)$ may be used. As the organic metal raw material of gallium (Ga), for example, trimethyl gallium $(Ga(CH_3)_3)$ can be used. As the organic metal raw material of aluminum (Al), for example, trimethyl aluminum $(Al(CH_3)_3)$ can be used. As the organic metal raw material of indium (In), for example, trimethyl indium $(In(CH_3)_3)$ can be used. As the organic metal raw material of selenium (Se), for example, dimethyl selenium $(Se(CH_3)_2)$ can be used. As the organic metal raw material of sulfur (S), for example, dimethyl sulfide $(S(CH_3)_2)$ can be used. As the organic metal raw material of zinc (Zn), for example, dimethyl zinc $(Zn(CH_3)_2)$ can be used.

Here, the organic metal raw material is not limited to those above and any organic metal material can be used as the raw material for the MOCVD growth similarly. For example, triethyl gallium $(Ga(C_2H_5)_3)$, triethyl aluminum $(Al(C_2H_5)_3)_3$ triethyl indium $(In(C_2H_5)_3)$, diethyl selenium $(Se(C_2H_5)_2)$, diethyl sulfide $(S(C_2H_5)_2)$, or diethyl zinc $(Zn(C_2H_5)_2)$ can be used as the raw material. Moreover, the raw material for the MOCVD growth is not necessarily the organic metal but may be gaseous. For example, hydrogen selenide $(H_2Se)$ may be used as the raw material of Se and hydrogen sulfide $(H_2S)$ may be used as the raw material of S.

In the case of forming the photoelectric conversion unit 50 by the MBE method, each single raw material of the photoelectric conversion unit 50 is put into each Knudsen cell in high vacuum in the MBE apparatus and heated to an appropriate temperature. Thus, a molecular beam is generated and delivered to the substrate 12, thereby forming a desired crystal growth layer. The single raw material to be put into the Knudsen cell may be gallium (Ga), aluminum (Al), indium (In), selenium (Se), or sulfur (S). In the case of the raw material with particularly high vapor pressure, such as sulfur (S), the stability of the molecular beam quantity may be poor. In this case, a valved cracker cell may be used to stabilize the molecular beam quantity. Further, a part of the raw material may be gas source like the gas source MBE. In this case, for example, hydrogen selenide $(H_2Se)$ can be used as the raw material of Se, and hydrogen sulfide $(H_2S)$ can be used as the raw material of sulfur (S).

In the case of forming the photoelectric conversion unit 50 by the MOCVD method or the MBE method, for example, the concentration of Zn, which is the n-type dopant, is gradually decreased along with the crystal growth, whereby the photoelectric conversion unit 50 with the band inclined in the crystal growth direction can be formed. By inclining the band in the photoelectric conversion unit 50 in this manner, the signal charges generated in the photoelectric conversion unit 50 can be moved toward the substrate 12 easily.

The photoelectric conversion unit 50 as above is formed to lattice-match on the substrate 12. In this case, the crystallinity of the photoelectric conversion unit 50 is improved because the misfit dislocation at the hetero junction can be reduced. Therefore, since the crystal defects are reduced, the dark current can be reduced and the deterioration in image quality due to white spots can be prevented. Moreover, since higher sensitivity can be achieved, the high-quality image can be photographed even under the dark environment (for example, in the nighttime).

Here, the lattice mismatch can be represented by $|\Delta a/a|$ ($\Delta a$: difference between the lattice constant of the photoelectric conversion unit and the constant of the substrate, a: the lattice constant of the substrate), and the lattice match can be represented by $\Delta a/a=0$. Note that in this embodiment, the definition of "lattice match" includes the state close to the lattice-matched state under the condition where the thickness of the photoelectric conversion unit 50 formed through the crystal growth is within the critical film thickness. In other words, even though the lattice is not matched perfectly, the state with excellent crystallinity without misfit dislocation can be obtained as long as the thickness is within the critical film thickness.

The term "critical film thickness" is defined in "the formula of Matthew and Blakeslee" (J. W. Matthews and A. E. Blakeslee, J. Cryst. Growth 27 (1974) 118-125) or "the formula of People and Bean" (R. People and J. C. Bean, Appl. Phys. Lett. 47 (1985) 322-324).

After the photoelectric conversion unit 50 including the epitaxial crystal is formed as above, a resist layer 56 having an opening in the region to be provided with the photoelectric conversion unit side pixel isolation unit 51 on the photoelectric conversion unit 50 is formed as illustrated in FIG. 21E. Then, by implanting the ions of the p-type dopant, Ga, In, As, or P, through the resist layer 56, the photoelectric conversion unit side pixel isolation unit 51 that isolates the photoelectric conversion unit 50 for each pixel is formed. After that, an annealing process is performed at 400° C. or more to activate each semiconductor layer.

Then, each pixel transistor is formed on the front surface side of the substrate 12 in a manner similar to FIG. 5F and the barrier layer 68, the transparent electrode 57, the color filter layer 23, and the on-chip lens 24 are formed on the back surface side of the substrate 12, thereby completing the solid-state imaging device 74 of this embodiment.

In this embodiment, the silicon substrate whose main plane is the (100)-plane is used and the photoelectric conversion unit is formed by forming the compound semiconductor on that main plane through the epitaxial growth. In other words, this embodiment describes the case of using the {100} substrate. The present disclosure is, however, not limited thereto.

In the case of forming the above compound semiconductor through the epitaxial growth as the material of the ionic element on a non-ionic and non-polarity silicon substrate, a defect called an antiphase domain may occur. In other words, the cation and anion are grown locally on the reverse phase, thereby generating the antiphase domain.

Therefore, an off substrate may be used as the silicon substrate. By performing the epitaxial growth on the off substrate, the generation of the antiphase domain can be suppressed. For example, by the use of the off substrate in which the plane direction of the {100} substrate of silicon is made off in the <011> direction, the region with the antiphase domain disappears by itself along with the crystal growth, thereby improving the crystallinity. As the off substrate, a substrate with an inclination angle of 1 to 10 degrees can be used.

6-3 Driving Method

Each pixel of the solid-state imaging device 74 of this embodiment also has an equivalent circuit similar to that of FIG. 3, and each pixel transistor is operated at the timing similar to that of FIG. 6. In the solid-state imaging device 74 of this embodiment, the incident light is converted into electricity in the photoelectric conversion unit 50 and the signal charges (electrons) generated therein move to the first charge accumulation unit 52 and are mainly accumulated in the first charge accumulation unit 52. The holes generated in the photoelectric conversion unit 50 move to the transparent electrode 57.

In the exposure period, the signal charges accumulated in the first charge accumulation units 52 and the photoelectric conversion units 50 are transferred to the second charge accumulation units 25 simultaneously in the entire pixels when the first transfer transistors Tr1 are turned on. The signal charges accumulated in the second charge accumulation unit 25 are read out by the floating diffusion unit 34 at the timing for each row, and the corresponding pixel signals are discharged to the vertical signal line 9.

In this embodiment, since the photoelectric conversion unit 50 is stacked on the substrate 12, it is not necessary to provide the photoelectric conversion unit 50 for the substrate 12, thereby reducing the pixel area. The first charge accumulation unit 52 formed on the back surface side of the substrate 12 and each pixel transistor formed on the front surface side of the substrate 12 are stacked in the depth direction of the substrate 12. This further reduces the size of the pixel area. In this embodiment, the photoelectric conversion unit 50 formed across the entire surface of the pixel region 3 also serves as the light-shielding film; therefore, the incident light does not reach the substrate 12 and the noise is suppressed.

In this embodiment, the effects similar to those of the first embodiment can be obtained.

In the case of forming the photoelectric conversion unit 50 on the substrate 12 as described in this embodiment, an intermediate layer may be provided to reduce the potential barrier for facilitating the movement of the signal charges generated in the photoelectric conversion unit 50 from the photoelectric conversion unit 50 toward the substrate 12. An example of forming the intermediate layer is hereinafter described as a modified example.

6-4 First Modified Example

Figure 22:
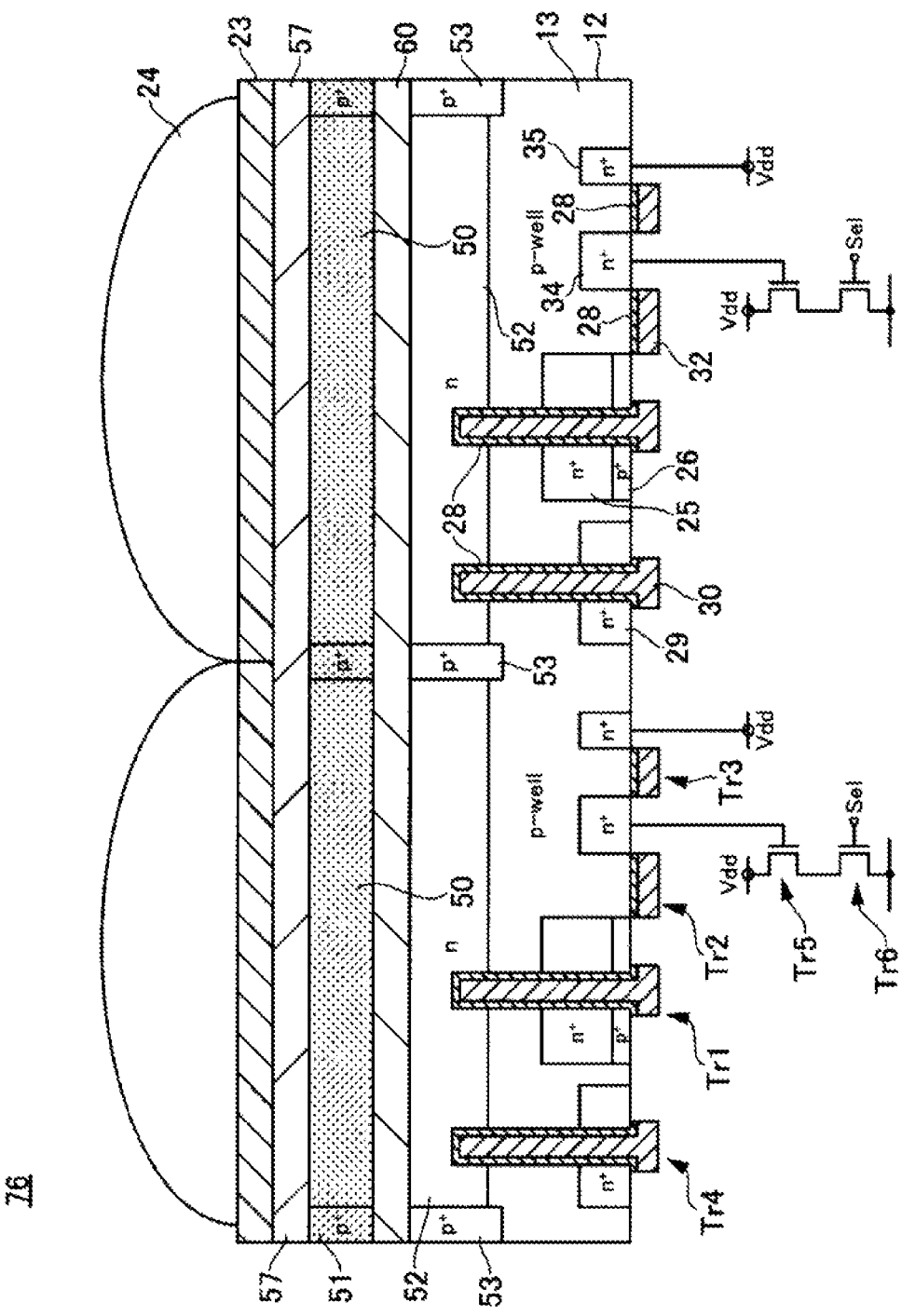
FIG. 22 is a sectional structure diagram of main components of a solid-state imaging device according to a first modified example of the sixth embodiment.

FIG. 22 is a sectional structure diagram of main components of a solid-state imaging device 76 of a first modified example of this embodiment. In FIG. 22, the same part as that of FIG. 14 is denoted by the same reference symbol, and the description thereto is not repeated.

In the first modified example, an intermediate layer 60 is formed between the substrate 12 and the photoelectric conversion unit 50 as illustrated in FIG. 22. This intermediate layer 60 can be formed of a material with the electron affinity between the electron affinity of the substrate 12 and the electron affinity of the photoelectric conversion unit 50. For example, it is the most preferable that the electron affinity of the intermediate layer 60 is intermediate between the electron affinity of the substrate 12 and the electron affinity of the photoelectric conversion unit 50.

Specifically, the intermediate layer 60 can be formed of $CuGa_{0.64}In_{0.36}S_2$ with a thickness of 5 nm. The intermediate layer 60 may be formed with a thickness within the critical film thickness. For example, when the intermediate layer 60 is formed of $CuGa_{0.64}In_{0.36}S_2$, the lattice mismatch with the substrate 12 is $\Delta a/a=5.12\times10^{-3}$. On this occasion, when the film thickness is 5 nm, the thickness is less than the critical film thickness defined by "the formula of Matthew and Blakeslee" or "the formula of People and Bean".

In the case where the photoelectric conversion unit 50 is formed of a p-type semiconductor, the intermediate layer 60 can be formed of an n-type semiconductor. Above all, when the photoelectric conversion unit 50 is formed of a p-type chalcopyrite layer, the intermediate layer 60 is preferably formed of a II-VI semiconductor (see References 1 to 3).

Reference 1: Takeshi Yagioka and Tokio Nakada, Applied Physics Express 2 (2009) 072201

Reference 2: S. P. Grindle, A. H. Clark, S. Rezaie-Serej, E. Falconer, and J. McNeily, and L. L. Kazmerski, J. AppL Phys. 51(10). (1980) 5464

Reference 3: T. Makada, N. Okano, Y. Tanaka, H. Fukuda, and A. Kunioka, First WCOEC; Dec. 5-9, 1994; Hawaii In this case, the p-type chalcopyrite layer of the photoelectric conversion unit 50 and the substrate 12 of silicon may have a ZnS layer, a CdS layer, or a ZnO layer as the intermediate layer 60 interposed therebetween. When the photoelectric conversion unit 50 is formed of the n-type semiconductor layer, the intermediate layer 60 can be formed of the p-type semiconductor.

6-5 Second Modified Example

Figure 23:
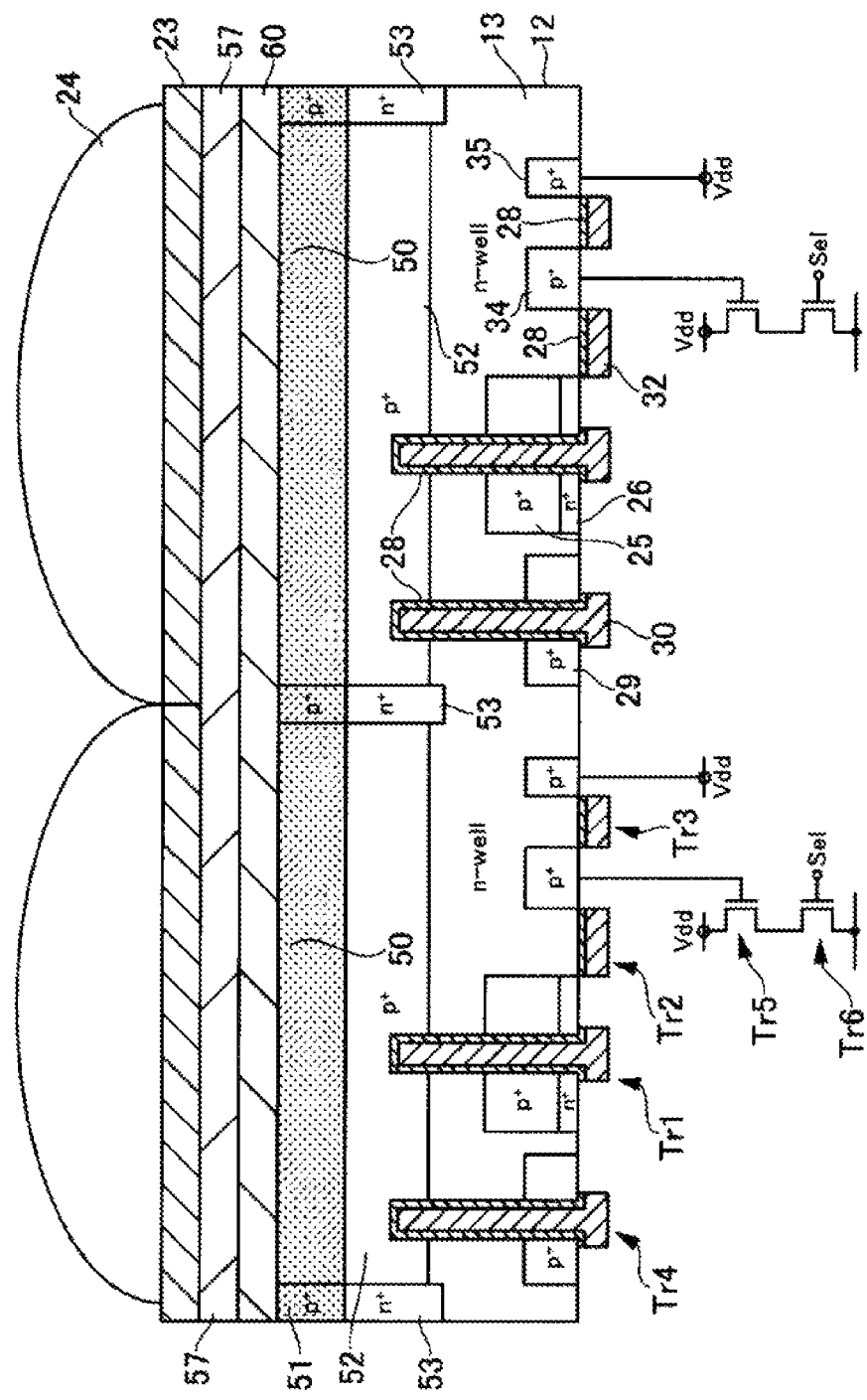
FIG. 23 is a sectional structure diagram of main components of a solid-state imaging device according to a second modified example of the sixth embodiment.

FIG. 23 is a sectional structure diagram of main components of a solid-state imaging device 77 of a first modified example. In FIG. 23, the same part as that of FIG. 14 is denoted by the same reference symbol and the description thereto is not repeated.

In the second modified example, the intermediate layer 60 is formed between the photoelectric conversion unit 50 and the transparent electrode 57 as illustrated in FIG. 23. In the second modified example, the conductivity type of each semiconductor layer in the substrate 12 is opposite to that of the first modified example and the hole (hole) is used as the signal charge. The second modified example can also employ the ZnS layer, the CdS layer, or the ZnO layer as the intermediate layer 60.

In such a structure, when the photoelectric conversion unit 50 is formed of the p-type chalcopyrite layer and the intermediate layer 60 is formed of the n-type semiconductor layer, the pn junction is formed at the interface between the photoelectric conversion unit 50 and the intermediate layer. No problem will occur even if the pn junction is provided in this manner at other than the interface between the substrate 12 and the photoelectric conversion unit 50.

7. Seventh Embodiment

Figure 24:
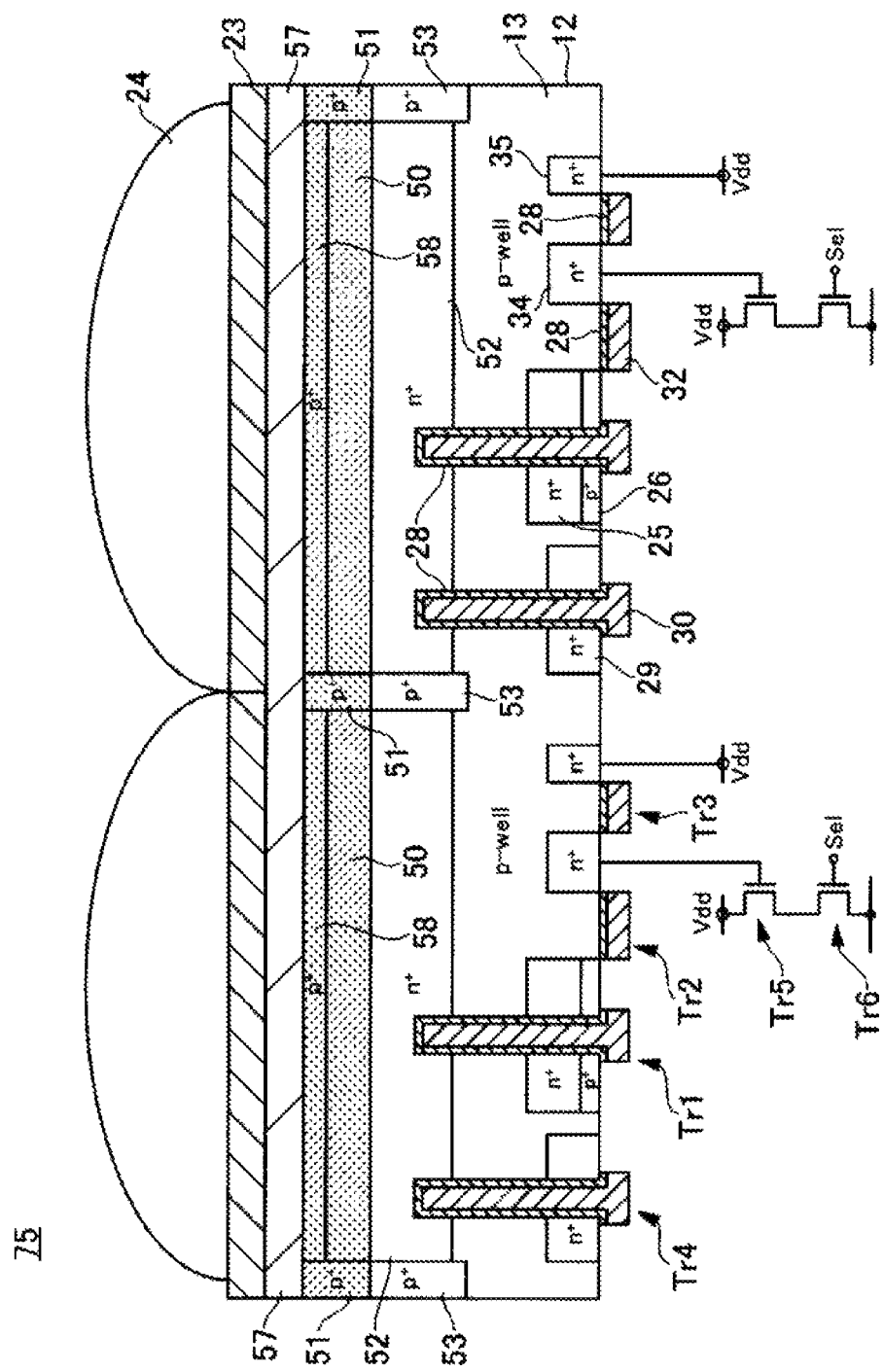
FIG. 24 is a sectional structure diagram of main components of a solid-state imaging device according to a seventh embodiment of the present disclosure.
Figure 25:
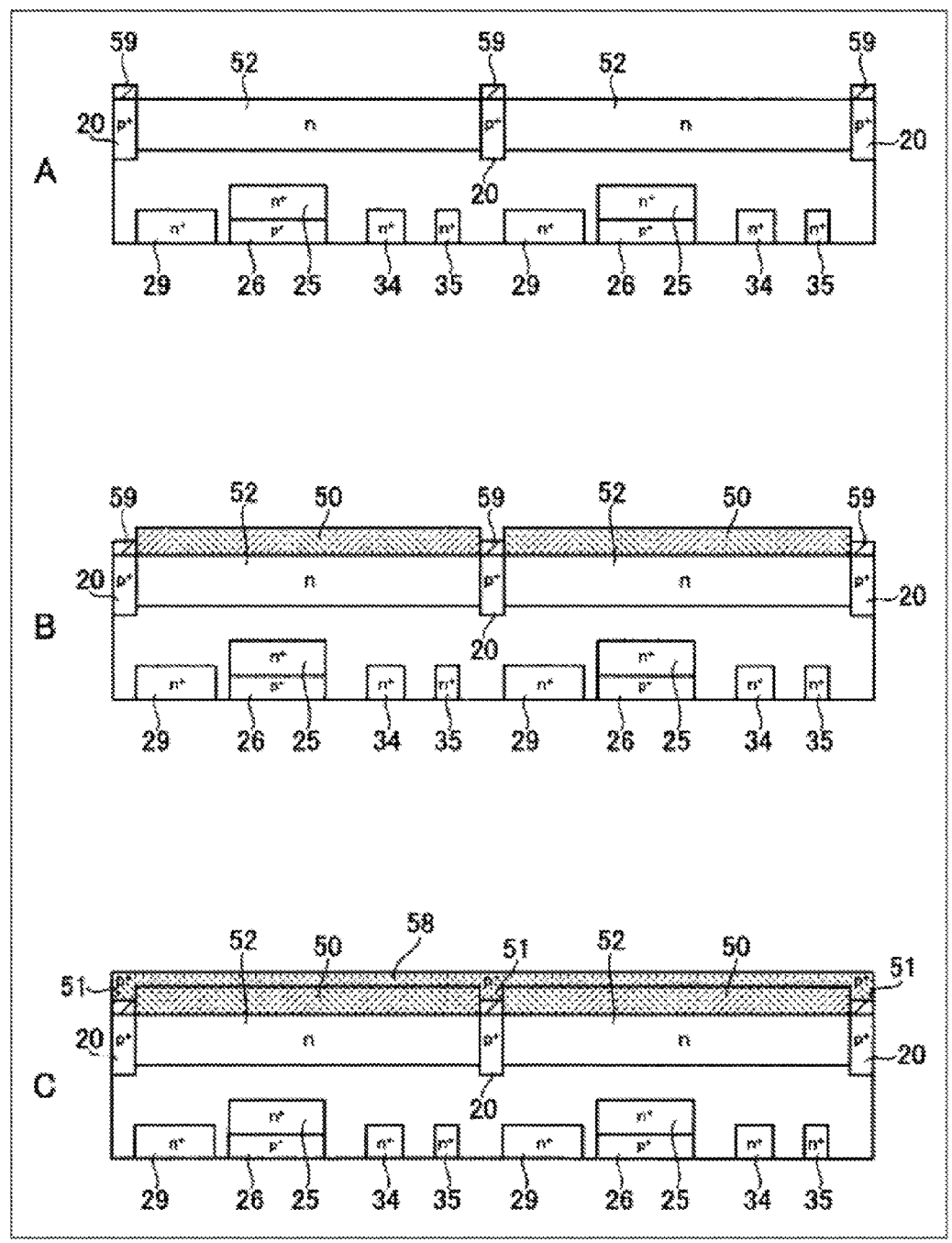
FIGS. 25A to 25C are process diagrams illustrating a manufacturing method for the solid-state imaging device according to a seventh embodiment.

Example of Providing p-Type Semiconductor Layer on Photoelectric Conversion Unit Next, a solid-state imaging device according to a seventh embodiment of the present disclosure is described. Since the overall structure of the solid-state imaging device according to this embodiment is similar to that of FIG. 1, the illustration is omitted and the overlapping description is omitted. FIG. 24 is a sectional structure diagram of main components of a solid-state imaging device 75 of this embodiment. In the solid-state imaging device 75 of this embodiment, a high-concentration p-type semiconductor layer 58 is formed on the transparent electrode 57 side of the photoelectric conversion unit 50 in the solid-state imaging device 74 of the sixth embodiment. In FIG. 24, the same part as that of FIG. 14 is denoted by the same reference symbol and the description thereto is not repeated. In FIG. 24, a part of the pixel transistors in each pixel is illustrated as a circuit diagram.

[7-1 Structure of Main Component]

In the solid-state imaging device 75 of this embodiment, the high-concentration p-type semiconductor layer 58 is formed on the light incidence side of the photoelectric conversion unit 50 as illustrated in FIG. 24. In this embodiment, the photoelectric conversion unit 50 and the p-type semiconductor layer 58 are formed of the chalcopyrite material or the silicide material. Here, the p-type semiconductor layer 58 has high impurity concentration so that the holes generated in the photoelectric conversion unit 50 flow through the p-type semiconductor layer 58 in the horizontal direction (direction along the film surface of the photoelectric conversion unit 50).

In the solid-state imaging device 75 of this embodiment, the high-concentration p-type semiconductor layer 58 is formed on the surface of the photoelectric conversion unit 50 which the incident light enters; therefore, the dark current is suppressed. Moreover, the p-type semiconductor layers 58 formed on the photoelectric conversion units 50 are provided continuously between the pixels with the p-type semiconductor layer of the photoelectric conversion unit side pixel isolation unit 51 interposed therebetween. Therefore, the signal charges (electrons) generated in the photoelectric conversion unit 50 flow toward the substrate 12, and the holes move from the photoelectric conversion unit to the p-type semiconductor layer 58 in the horizontal direction over the photoelectric conversion unit 50.

Therefore, in this embodiment, the transparent electrode 57 is provided on the photoelectric conversion unit 50; however, it is not always necessary to provide the transparent electrode 57 on the photoelectric conversion unit 50. By forming the p-type semiconductor layer 58 and the transparent electrode 57 as described in this embodiment, the control over the movement of the electrons and holes is facilitated.

[7-2 Manufacturing Method]

Next, a manufacturing method for the solid-state imaging device 75 of this embodiment is described. Here, an example is described in which the solid-state imaging device 75 is manufactured by forming the photoelectric conversion unit 50 with the use of the chalcopyrite-based material including the CuAlGaInSSe-based mixed crystal. FIG. 25A to FIG. 25C are process diagrams illustrating the manufacturing method for the solid-state imaging device 75 of this embodiment.

First, a desired semiconductor layer is provided for the substrate 12 in a manner similar to the method illustrated in FIG. 20A to FIG. 20C. Then, as illustrated in FIG. 25A, an insulation film 59 is formed selectively in a portion on the back surface side of the substrate 12 provided with the first charge accumulation unit 52 where the photoelectric conversion unit side pixel isolation unit 51 is to be formed. In other words, the insulation film 59 is formed to section between the adjacent pixels.

The insulation film 59 can be formed of, for example, a silicon oxide film or a silicon nitride film. In this embodiment, since the photoelectric conversion unit side pixel isolation unit 51 is formed at the same position as the pixel isolation unit 20 formed on the substrate 12 side, the insulation film 59 is formed on the pixel isolation unit 20 formed on the substrate 12 side.

This insulation film 59 can be formed by forming, for example, a silicon oxide film on the entire surface on the back surface side of the substrate 12 and then patterning the silicon oxide film through a photolithography technique, and has a thickness of, for example, 50 to 100 nm.

Next, the compound semiconductor is formed through the epitaxial growth by the MOCVD method, the MBE method, or the like on the back surface side of the substrate 12, thereby forming the photoelectric conversion unit 50 as illustrated in FIG. 25B. In this embodiment, the insulation film 59 that sections between the pixels is formed on the back surface side of the substrate 12; therefore, the photoelectric conversion unit 50 is selectively subjected to the crystal growth in the exposed portion of the substrate 12 where the insulation film 59 is not formed on the back surface side of the substrate 12. Here, the photoelectric conversion unit 50 is formed so as to have the thickness larger than the thickness of the insulation film 59. Thus, the photoelectric conversion unit 50 is formed to correspond to each pixel and a trench is provided between the adjacent photoelectric conversion units 50.

Next, by forming the compound semiconductor with the chalcopyrite structure through the lateral growth on the back surface side of the substrate 12, the photoelectric conversion unit side pixel isolation unit 51 and the p-type semiconductor layer 58 are formed as illustrated in FIG. 25C. Specifically, under the condition where a large amount of p-type impurity such as Ga, In, As, or P is contained, the compound semiconductor with the chalcopyrite structure is formed through the lateral growth. Thus, the p-type compound semiconductor is embedded in the trench between the adjacent photoelectric conversion units 50, and at the same time, the high-concentration p-type semiconductor layer 58 is formed on the photoelectric conversion unit 50.

Here, in the sectional structure diagram of FIG. 24, the illustration of the insulation film 59 used when the photoelectric conversion unit 50 is selectively grown is omitted. In the MOCVD method and the MBE method, which one of the lateral growth or the selective growth is employed can be selected by the pressure control during the crystal growth.

In this embodiment, for example, the impurity concentration of the photoelectric conversion unit side pixel isolation unit 51 and the p-type semiconductor layer 58 is set to $1 \times 10^{17}$ to $1 \times 10^{19}$ cm$^{-3}$. Thus, the photoelectric conversion unit side pixel isolation unit 51 that isolates the photoelectric conversion unit 50 for each pixel and the p-type semiconductor layer 58 on the light incidence side of the photoelectric conversion unit 50 are formed. After that, through the process similar to that of the first embodiment, the solid-state imaging device 75 of this embodiment is completed.

In this embodiment, since the photoelectric conversion unit side pixel isolation unit 51 and the p-type semiconductor layer 58 are formed through the lateral growth, the damage during the ion implantation or the adverse effect on the wiring layer during the annealing is smaller than that of the case where the photoelectric conversion unit side pixel isolation unit 51 and the p-type semiconductor layer 58 are formed through the ion implantation or the annealing process. Thus, the damage during the manufacturing process can be reduced.

Note that although the photoelectric conversion unit side pixel isolation unit 51 is formed of the p-type semiconductor layer in this embodiment, the photoelectric conversion unit side pixel isolation unit 51 may be formed of a semiconductor not containing p-type impurity. In this case, the photoelectric conversion unit side pixel isolation unit 51 can be formed of a chalcopyrite-based compound semiconductor with a wide band gap. By forming the photoelectric conversion unit side pixel isolation unit 51 so that the band gap difference between the photoelectric conversion unit 50 and the photoelectric conversion unit side pixel isolation unit 51 is more than or equal to kT=27 meV, the potential barrier is formed between the pixels, whereby the pixels can be electrically isolated from each other.

In the case of isolating the pixels utilizing the band gap difference, the photoelectric conversion unit side pixel isolation unit 51 is formed by the chalcopyrite-based compound semiconductor through the lateral growth under the condition that the p-type impurity is not contained in the step of FIG. 25C. Specifically, for example, the photoelectric conversion unit side pixel isolation unit 51 is formed so that the composition ratio of copper-aluminum-gallium-indium-sulfur-selenium becomes 1.0:0.36:0.64:0:1.28:0.72 or 1.0:0.24:0.23:0.53:2.0:0.

After that, the chalcopyrite-based compound semiconductor is subjected to the crystal growth under the condition that a large amount of impurities such as Ga, In, As, and P are contained, whereby the p-type semiconductor layer 58 is formed. The pixels can alternatively be isolated by the structure where the photoelectric conversion unit side pixel isolation unit 51 does not contain the p-type impurities.

The aforementioned manufacturing method for the solid-state imaging device 75 forms the photoelectric conversion unit side pixel isolation unit 51 and the p-type semiconductor layer 58 through the lateral growth; however, the manufacturing method for the solid-state imaging device 75 according to this embodiment is not limited thereto. The p-type semiconductor layer 58 may be formed by forming the photoelectric conversion unit side pixel isolation unit 51 as illustrated in FIG. 21E and then implanting the ions of the p-type impurity on the light incidence surface side of the photoelectric conversion unit 50.

8. Eighth Embodiment

Figure 26:
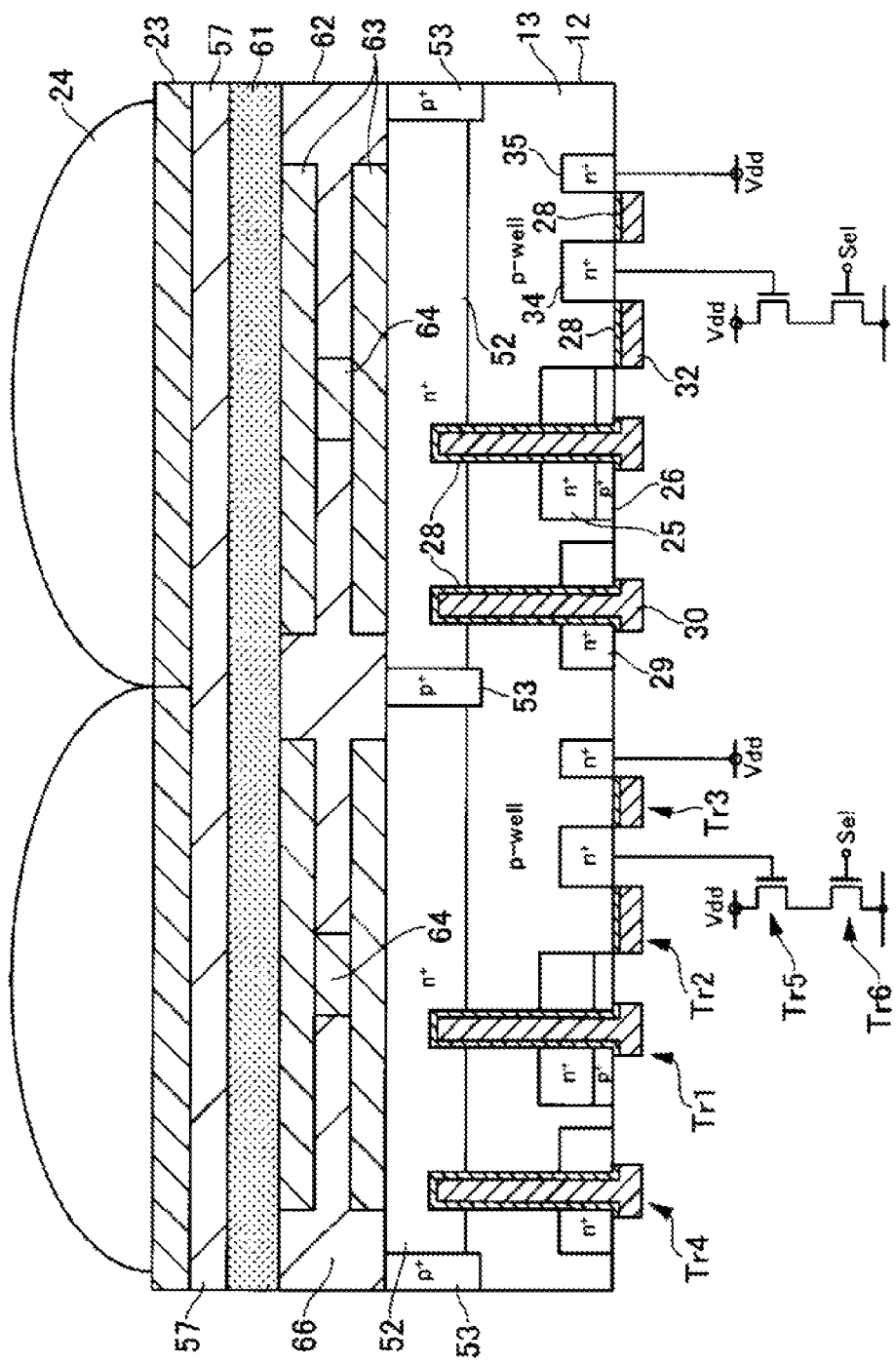
FIG. 26 is a sectional structure diagram of main components of a solid-state imaging device according to an eighth embodiment of the present disclosure.

Example of Stacking Photoelectric Conversion Unit Over Substrate with Electrode Layer Interposed Therebetween Next, a solid-state imaging device according to an eighth embodiment of the present disclosure is described. Since the overall structure of the solid-state imaging device according to this embodiment is similar to that of FIG. 1, the illustration is omitted and the overlapping description is omitted. FIG. 26 is a sectional structure diagram of main components of a solid-state imaging device 78 according to this embodiment. In the solid-state imaging device 78 of this embodiment, the signal charges generated in the photoelectric conversion unit are moved to the substrate via the electrode in the solid-state imaging device 74 of the sixth embodiment. In FIG. 26, the same part as that of FIG. 14 is denoted by the same reference symbol and the description thereto is not repeated. In FIG. 26, a part of the pixel transistors in each pixel is illustrated as a circuit diagram.

In this embodiment, an electrode layer 62 is formed on the back surface side of the substrate 12, and a photoelectric conversion unit 61, the transparent electrode 57, the color filter layer 23, and the on-chip lens 24 are stacked on the electrode layer 62.

The electrode layer 62 is formed of two layers of electrodes 63 stacked in the light incidence direction with an insulation layer 66 interposed therebetween. The two layers of electrodes 63 are electrically connected to each other through a contact portion 64. These electrodes 63 are formed separated from each other for each pixel, and the upper electrode 63 is in contact with the photoelectric conversion unit 61 and the lower electrode 63 is in contact with the back surface of the substrate 12. The electrodes 63 are formed of, for example, Al, Cu, W, or the like.

In this embodiment, the photoelectric conversion unit 61 is formed of an organic material with a light-shielding property. The photoelectric conversion unit 61 may be formed of an organic material that absorbs light with all the wavelengths in visible light region in common across the entire pixels, or may be formed of an organic material that absorbs light with a different wavelength for each pixel. As aforementioned, since the electron mobility is low in the organic material, the mobility of the electrons generated in the photoelectric conversion unit 61 formed of the organic material in the horizontal direction is low. Therefore, the isolation unit is not necessary between the pixels.

In the solid-state imaging device 78 of this embodiment, the signal charges (electrons) generated in the photoelectric conversion unit 61 move to the first charge accumulation unit 52 via the electrodes 63 and the holes generated in the photoelectric conversion unit 61 move toward the transparent electrode 57 directly. Then, the signal charges accumulated in the first charge accumulation unit 52 are read out in a manner similar to that of the first embodiment.

In this embodiment, the photoelectric conversion unit 61 also serves as the light-shielding film; however, the present invention is not limited thereto. For example, the photoelectric conversion unit 61 and the electrode 63 may be combined to block the light to enter the first charge accumulation unit 52. The solid-state imaging device 78 of this embodiment can provide the effect similar to that of the first embodiment.

In this embodiment, the photoelectric conversion unit 61 is formed of the organic material; however, the photoelectric conversion unit may alternatively be formed of an inorganic material such as the chalcopyrite or silicide compound. In this case, the photoelectric conversion unit formed of the inorganic material is attached onto the electrode 63. In the case of attaching the photoelectric conversion unit of the inorganic material onto the electrode 63, however, subsequent thermal annealing may be necessary. Further alternatively, the photoelectric conversion unit of the inorganic material may be formed on the electrode 63 through deposition or the like.

9. Ninth Embodiment

Figure 27:
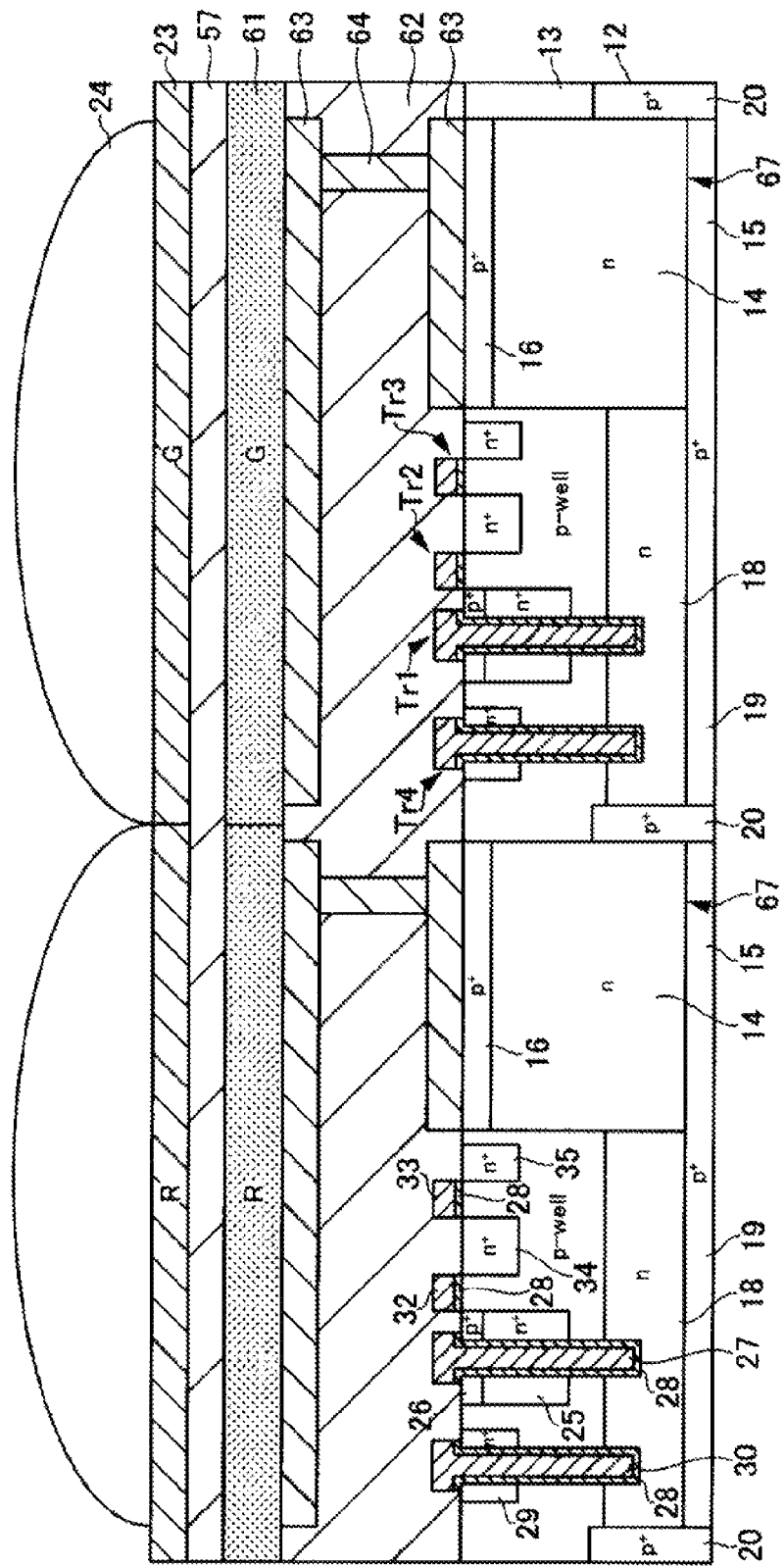
FIG. 27 is a sectional structure diagram of main components of a solid-state imaging device according to a ninth embodiment of the present disclosure.

Example of Stacking Photoelectric Conversion Unit Over Substrate with Electrode Layer Interposed Therebetween in Solid-State Imaging Device of Front-Illumination Type Next, a solid-state imaging device according to a ninth embodiment of the present disclosure is described. Since the overall structure of the solid-state imaging device of this embodiment is similar to that of FIG. 1, the illustration is omitted and the overlapping description is omitted. FIG. 27 is a sectional structure diagram of main components of a solid-state imaging device 79 of this embodiment. The solid-state imaging device 79 of this embodiment is an example obtained by applying the structure of the solid-state imaging device 78 of the eighth embodiment to the front-illumination type. In FIG. 27, the same part as that of FIG. 26 is denoted by the same reference symbol and the description thereto is omitted.

In this embodiment, the front surface side of the substrate 12 provided with each pixel transistor is the light incidence surface, and the electrode layer 62, the photoelectric conversion unit 61, the transparent electrode 57, the color filter layer 23, and the on-chip lens 24 are sequentially stacked on the front surface side of the substrate 12. In this embodiment, a transfer path 67 is formed of an n-type semiconductor layer in the depth direction from the front surface side of the substrate 12, and this transfer path 67 is connected to the first charge accumulation unit 18 formed on the back surface side of the substrate 12. Then, the first charge accumulation unit 18 and each pixel transistor are formed to be stacked in the depth direction of the substrate 12.

In other words, in the solid-state imaging device 79 of this embodiment, the n-type semiconductor layer 14 included in "the photoelectric conversion unit 17" of the solid-state imaging device 71 of the second embodiment is the n-type semiconductor layer 14 included in "the transfer path 67". In this embodiment, the impurity concentration of the n-type semiconductor layer included in the first charge accumulation unit 18 is also higher than the impurity concentration of the n-type semiconductor layer 14 included in the transfer path 67. Thus, the potential gradient is formed which enables the electrons to move from the transfer path 67 toward the first charge accumulation unit 18.

In this embodiment, the lower electrode 63 of the electrode layer 62 is formed in contact with the top of the transfer path 67, and the upper electrode 63 thereof is formed in contact with the photoelectric conversion unit 61. The photoelectric conversion unit 61 is formed of the organic material that absorbs the light with a different wavelength for each pixel. In this embodiment, a photoelectric conversion unit (R)61 which absorbs the light with a red wavelength is formed below the color filter layer (R)23 that transmits the red wavelength. A photoelectric conversion unit (G)61 which absorbs the light with a green wavelength is formed below the color filter (G)23 that transmits the green wavelength. Although not illustrated, a photoelectric conversion unit (B)61 which absorbs the light with a blue wavelength is formed below the color filter (B)23 that transmits the blue wavelength.

In this embodiment, only the light with a predetermined wavelength transmits through the color filter layer 23 and the light with the other wavelengths are absorbed. Next, the transmitted light is absorbed in the corresponding photoelectric conversion unit 61. Therefore, the incident light toward the substrate 12 is blocked by the combination of each photoelectric conversion unit 61 and the color filter layer 23 formed thereon. This suppresses the incident light to enter the substrate 12 and the noise is reduced. This embodiment provides the effects similar to those of the solid-state imaging devices according to the first and second embodiments.

10. Tenth Embodiment

Example of Stacking Three Layers of Photoelectric Conversion Films on Substrate

Figure 28:
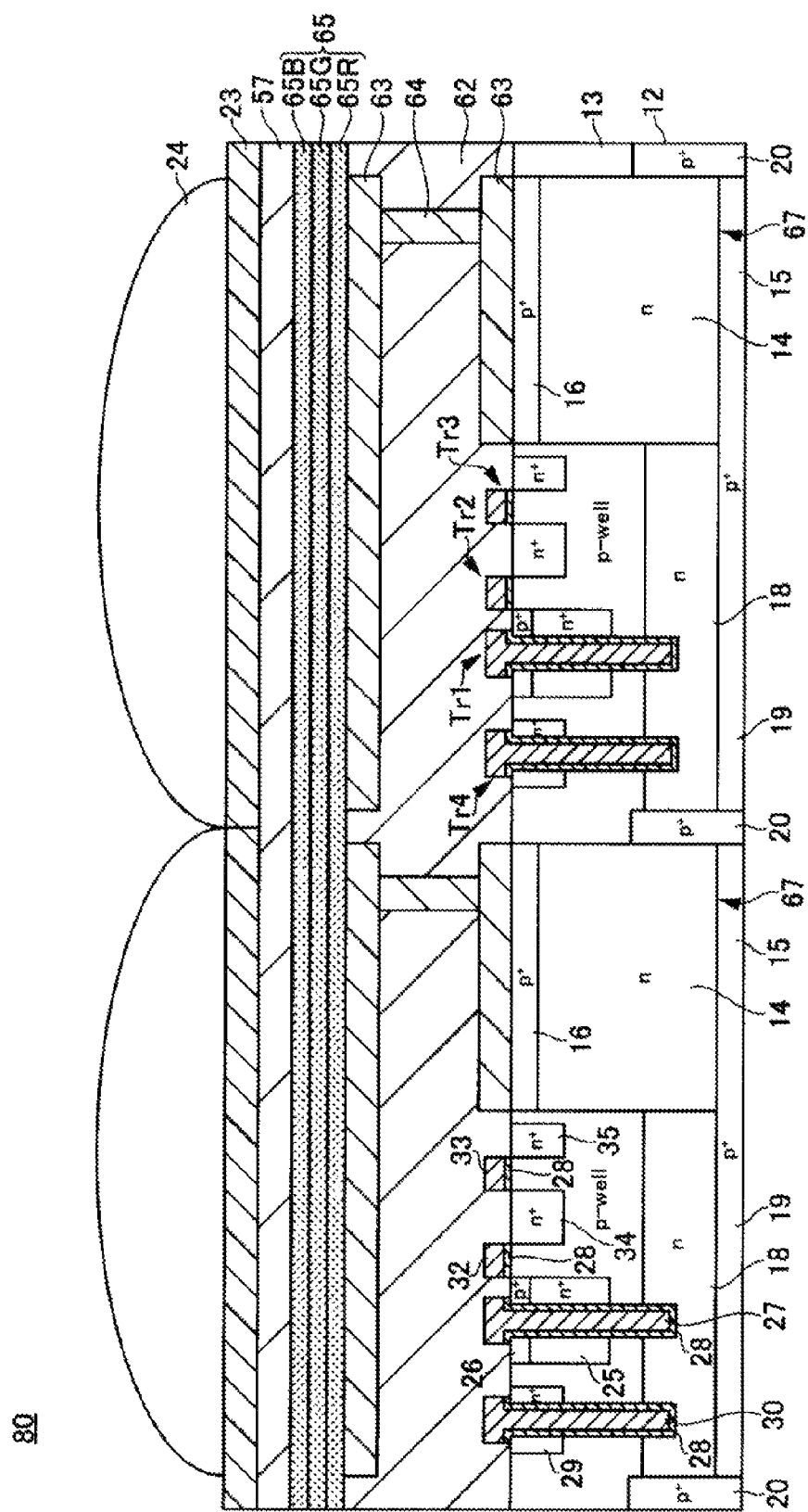
FIG. 28 is a sectional structure diagram of main components of a solid-state imaging device according to a tenth embodiment of the present disclosure.

Next, a solid-state imaging device according to a tenth embodiment of the present disclosure is described. Since the overall structure of the solid-state imaging device according to this embodiment is similar to that of FIG. 1, the illustration is omitted and the overlapping description is omitted. FIG. 28 is a sectional structure diagram of main components of a solid-state imaging device 80 of this embodiment. The solid-state imaging device 80 of this embodiment is different from the solid-state imaging device 79 of the ninth embodiment in the structure of the photoelectric conversion unit. In FIG. 28, the same part as that of FIG. 27 is denoted by the same reference symbol and the description thereto is not repeated.

In this embodiment, a photoelectric conversion unit 65 is obtained by stacking three layers in the light incidence direction: a red color photoelectric conversion film 65R that absorbs light with a red wavelength; a green color photoelectric conversion film 65G that transmits the light with a green wavelength; and a blue color photoelectric conversion film 65B that absorbs the light with a blue wavelength.

In this embodiment, the color filter layer 23 is provided over the photoelectric conversion unit 65 with the transparent electrode 57 interposed therebetween. Therefore, the light having transmitted through the color filter layer 23 is received by the red color photoelectric conversion film 65R, the green color photoelectric conversion film 65G, and the blue color photoelectric conversion film 65B. For example, the red light having transmitted through the red color filter layer in the color filter layer 23 is received by the red color photoelectric conversion film 65R and converted into electricity. Moreover, the green light having transmitted through the green color filter layer in the color filter layer 23 is received by the green color photoelectric conversion film 65G and converted into electricity. Moreover, the blue light having transmitted through the blue color filter layer in the color filter layer 23 is received by the blue color photoelectric conversion film 65B and converted into electricity.

In the above description, each of the red color photoelectric conversion film 65R, the green color photoelectric conversion film 65G, and the blue color photoelectric conversion film 65B is formed of, for example, an organic material in a manner similar to the ninth embodiment. Alternatively, an inorganic material such as the chalcopyrite-based material may be used. By the combination of the plural photoelectric conversion films 65B, 65G, and 65R stacked, the incident light to enter the substrate 12 is blocked.

In this embodiment, the incident light to enter the substrate 12 is blocked by the plural photoelectric conversion films 65B, 65G, and 65R; therefore, the size reduction of the pixel can be achieved, the noise can be prevented, and the image quality of the photographed image can therefore be improved in a manner similar to the other embodiments. In this embodiment, since the photoelectric conversion unit 65 is not necessary to be isolated for each pixel, the manufacturing process can be reduced. In this embodiment, the effects similar to those of the first embodiment can be obtained.

The solid-state imaging devices of the first to tenth embodiments have been described so far; additionally, these may be combined as appropriate. Although the above embodiments (except the second modified example of the sixth embodiment) have described the structure of reading out the electrons as the signal charges, the present invention is not limited thereto. "The holes" may be read out as the signal charges. In this case, the conductivity types of the components in each embodiment are reversely structured to form the p-channel type MOS transistor as each pixel transistor, so that "the holes" can be read out as the signal charges.

Although in the above embodiment, the well of the second conductivity type (for example, p-type) is formed in the silicon substrate of the first conductivity type (for example, n-type) and the impurity region of the first conductivity type (for example, n-type) is formed in the well; however, the present disclosure is not limited thereto. For example, the impurity region of the first conductivity type (for example, n-type) may be formed in the silicon substrate of the second conductivity type (for example, p-type).

The present disclosure is applicable not just to the solid-state imaging device that captures the image by detecting the distribution of the quantity of incident visible light but also to the solid-state imaging device that captures the image by detecting the distribution of the quantity of incidence of infrared ray, the X-ray or the particles. In a broad sense, the present disclosure is applicable to the general solid-state imaging device (physical quantity distribution detector) that captures the image by detecting the distribution of another physical quantity including pressure and electrostatic capacitance, such as a fingerprint detection sensor.

Further, the present disclosure is not limited to the solid-state imaging device that reads out the image signal from each unit pixel of a pixel portion by scanning each unit pixel for each row sequentially. The present disclosure is applicable to the X-Y address type solid-state imaging device that selects any pixel in the unit of pixel and reads out signals in the unit of pixel from the selected pixel. The solid-state imaging device may be in the form of one chip or a packaged module having the imaging function, which includes a pixel portion, a signal processing portion or an optical system.

The present disclosure is not limited to the application to the solid-state imaging device but is also applicable to another imaging device. The imaging device refers to a camera system such as a digital still camera or a digital video camera, or an electronic appliance having the imaging function such as a cellular phone.

11. Eleventh Embodiment

Electronic Appliance

Figure 29:
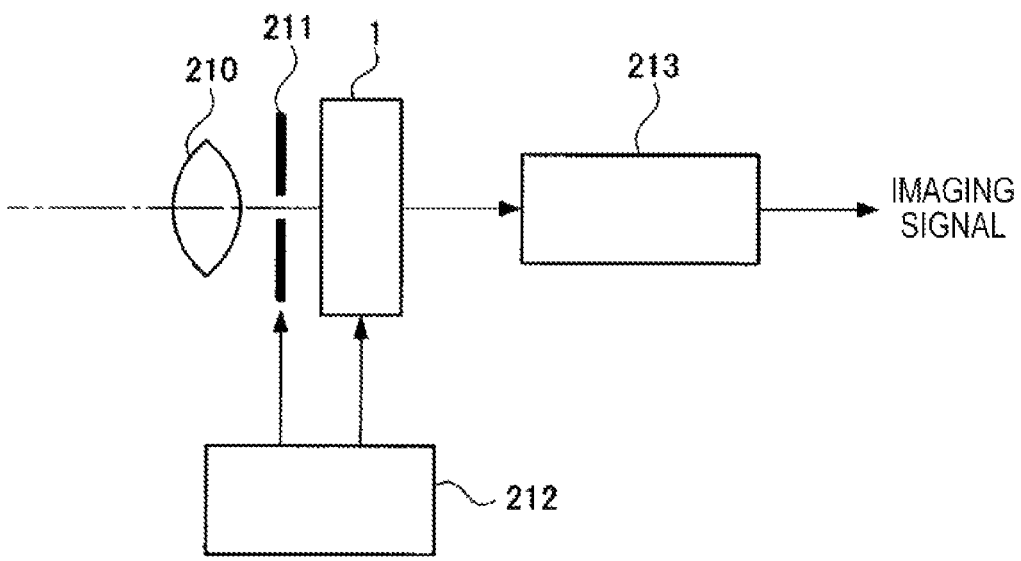
FIG. 29 is a sectional structure diagram of an electronic appliance according to an eleventh embodiment of the present disclosure.

Next, an electronic appliance according to an eleventh embodiment of the present disclosure is described. FIG. 29 is a schematic structure diagram of an electronic appliance 200 according to the eleventh embodiment of the present disclosure. This embodiment describes an example in which the solid-state imaging device 1 of the first embodiment according to the present disclosure is used for an electronic appliance (digital video camera).

The electronic appliance 200 of this embodiment includes the solid-state imaging device 1, an optical lens 210, a shutter device 211, a driving circuit 212, and a signal processing circuit 213.

The optical lens 210 forms an image of image light (incident light) from a subject on an imaging plane of the solid-state imaging device 1. Thus, signal charges are accumulated for a certain period of time in the solid-state imaging device 1. The shutter device 211 controls the light irradiation period and the light-shielding period for the solid-state imaging device 1. The driving circuit 212 supplies a driving signal that controls the operation of transferring the signal charges and the operation of the shutter device 211 in the solid-state imaging device 1. With the driving signal (timing signal) supplied from the driving circuit 212, the signal transfer of the solid-state imaging device 1 is conducted. The signal processing circuit 213 performs various kinds of signal processes. The video signal after the signal process is stored in a storage medium such as a memory, or output to a monitor.

In this embodiment, the electronic appliance 200 can have pixel area reduced in the solid-state imaging device 1; therefore, the size reduction of the electronic appliance 200 can be achieved. Moreover, the image quality is improved.

The electronic appliance 200 to which the solid-state imaging device 1 can be applied is not limited to the digital video camera and the solid-state imaging device 1 can be applied to a digital still camera and a camera module for a mobile appliance such as a cellular phone.

Although this embodiment has described the structure in which the solid-state imaging device 1 of the first embodiment is used for the electronic appliance, the solid-state imaging device manufactured according to any of the second to tenth embodiments can be used similarly.

The present disclosure can have any of the following structures.

(1)

A solid-state imaging device including:

a substrate;

a photoelectric conversion unit that generates signal charges corresponding to light quantity;

a floating diffusion unit that is provided for the substrate and that converts the signal charges into voltage;

a first charge accumulation unit that is provided for the substrate and that accumulates the signal charges generated in the photoelectric conversion unit;

a second charge accumulation unit that is provided on the first charge accumulation unit in a substrate thickness direction and that is formed electrically isolated from the first charge accumulation unit;

a first transfer transistor that includes a first transfer gate electrode formed embedded in the substrate to a depth of such a degree that the first transfer gate electrode reaches the first charge accumulation unit from a substrate surface provided with the second charge accumulation unit; and a second transfer transistor that transfers the signal charges accumulated in the second charge accumulation unit to the floating diffusion unit.

(2)

The solid-state imaging device according to (1), wherein a light-shielding film that shields at least the second charge accumulation unit and the floating diffusion unit from light is formed on a light incidence side of the substrate.

(3)

The solid-state imaging device according to (1) or (2), wherein the photoelectric conversion unit is stacked on the light incidence side of the substrate.

(4)

The solid-state imaging device according to any of (1) to (3), wherein the photoelectric conversion unit also serves as the light-shielding film.

(5)

The solid-state imaging device according to any of (1) to (4), wherein the photoelectric conversion unit includes a chalcopyrite-based compound.

(6)

The solid-state imaging device according to any of (1) to (5), further including a pixel isolation unit that isolates the photoelectric conversion unit for each pixel, wherein the pixel isolation unit is formed of a compound semiconductor whose impurity concentration or impurity composition is controlled so that a potential barrier is formed between the adjacent photoelectric conversion units.

(7)

The solid-state imaging device according to any of (1) to (6), further including a reset transistor that resets the photoelectric conversion unit and the first charge accumulation unit, wherein the reset transistor includes a vertical reset transistor including a reset gate electrode formed embedded in the substrate to a depth of such a degree that the reset gate electrode reaches the first charge accumulation unit from the substrate surface.

(8)

The solid-state imaging device according to any of (1) to (4), wherein the photoelectric conversion unit is formed of a silicide-based compound.

(9)

The solid-state imaging device according to any of (1) to (4), wherein the photoelectric conversion unit is formed of an organic material.

(10)

The solid-state imaging device according to any of (1) to (9), wherein: the photoelectric conversion unit and the substrate are connected to each other with an electrode interposed therebetween; and the photoelectric conversion unit and the electrode shield the substrate from light.

(11)

The solid-state imaging device according to any of (1) to (8), wherein the photoelectric conversion unit is formed to lattice-match with the substrate.

(12)

The solid-state imaging device according to any of (1) to (5), wherein the photoelectric conversion unit is provided with an intermediate layer on the light incidence side or the substrate side.

(13)

The solid-state imaging device according to (12), wherein the intermediate layer is formed to have electron affinity between electron affinity of the substrate and electron affinity of the photoelectric conversion unit.

(14)

The solid-state imaging device according to (12), wherein the intermediate layer is formed of a material with a conductivity type opposite to that of the photoelectric conversion unit.

(15)

The solid-state imaging device according to any of (1) to (3), wherein the photoelectric conversion unit is formed of a photodiode having pn junction formed in the substrate.

(16)

The solid-state imaging device according to (15), wherein the signal charges generated in the photoelectric conversion unit move toward the first charge accumulation unit by potential gradient generated due to impurity concentration between the photoelectric conversion unit and the first charge accumulation unit.

(17)

The solid-state imaging device according to (15), further including a transfer electrode formed on the substrate in a region provided with the first charge accumulation unit, wherein the signal charges generated in the photoelectric conversion unit move toward the first charge accumulation unit when the transfer electrode applies voltage.

(18)

The solid-state imaging device according to any of (15) to (17), further including a reset transistor that resets the photoelectric conversion unit and the first charge accumulation unit, wherein the reset transistor includes a vertical reset transistor including a reset gate electrode formed embedded in the substrate to a depth of such a degree that the reset gate electrode reaches the first charge accumulation unit from the substrate surface.

(19)

The solid-state imaging device according to any of (1) to (18), including a plurality of pixels each including the photoelectric conversion unit, the floating diffusion unit, the first charge accumulation unit, the second charge accumulation unit, the first transfer transistor, and the second transfer transistor, wherein: the pixels are arranged in two-dimensional array; the signal charges accumulated in the first charge accumulation units are transferred to the second charge accumulation units simultaneously in the entire pixels; and the signal charges held in the second charge accumulation units are transferred to the floating diffusion units for each row.

(20)

A driving method for a solid-state imaging device including a pixel region having pixels arranged in two-dimensional array, each pixel including:

a photoelectric conversion unit that generates signal charges corresponding to light quantity;

a floating diffusion unit that is provided for a substrate and that converts the signal charges into voltage;

a first charge accumulation unit that is provided for the substrate and that accumulates the signal charges generated in the photoelectric conversion unit;

a second charge accumulation unit that is provided on the first charge accumulation unit in a substrate thickness direction and that is formed electrically isolated from the first charge accumulation unit;

a first transfer transistor that includes a first transfer gate electrode formed embedded in the substrate to a depth of such a degree that the first transfer gate electrode reaches the first charge accumulation unit from a substrate surface provided with the second charge accumulation unit; and a second transfer transistor that transfers the signal charges accumulated in the second charge accumulation unit to the floating diffusion unit, wherein:

the signal charges accumulated in the first charge accumulation units and the photoelectric conversion units are transferred to the second charge accumulation units simultaneously in the entire pixels by turning on the first transfer transistors; and the signal charges held in the second charge accumulation units are read out for each row by turning on the second transfer transistors.

(21)

An electronic appliance including:

an optical lens;

a solid-state imaging device to which light condensed by the optical lens is incident and which includes a substrate, a photoelectric conversion unit that generates signal charges corresponding to light quantity, a floating diffusion unit that is provided for the substrate and that converts the signal charges into voltage, a first charge accumulation unit that is provided for the substrate and that accumulates the signal charges generated in the photoelectric conversion unit, a second charge accumulation unit that is provided on the first charge accumulation unit in a substrate thickness direction and that is formed electrically isolated from the first charge accumulation unit, a first transfer transistor that includes a first transfer gate electrode formed embedded in the substrate to a depth of such a degree that the first transfer gate electrode reaches the first charge accumulation unit from a substrate surface provided with the second charge accumulation unit, and a second transfer transistor that transfers the signal charges accumulated in the second charge accumulation unit to the floating diffusion unit; and a signal processing circuit that processes an output signal output from the solid-state imaging device.

REFERENCE SIGNS LIST 1 solid-state imaging device
2 pixel
3 pixel region
4 vertical driving circuit
5 column signal processing circuit
6 horizontal driving circuit
7 output circuit
8 control circuit
9 vertical signal line
10 horizontal signal line
11, 12 substrate
13 well region
14 n-type semiconductor layer
15 p-type semiconductor layer
16 p-type semiconductor layer
17 photoelectric conversion unit
18 first charge accumulation unit
19 p-type semiconductor layer
20 pixel isolation unit
21 insulation film
22 light-shielding film
23 color filter layer
24 on-chip lens
25 second charge accumulation unit
26 p-type semiconductor layer
27 first transfer gate electrode
28 gate insulation film
29, 35 source/drain region
30 second reset gate electrode
31 n-type semiconductor layer
32 second transfer gate electrode
33 first reset gate electrode
34 floating diffusion unit

The invention claimed is:

1. A solid-state imaging device comprising:

a substrate;

a photoelectric conversion unit configured to generate signal charges corresponding to light quantity;

a floating diffusion unit that is provided for the substrate and configured to convert the signal charges into voltage;

a first charge accumulation unit that is provided for the substrate and configured to accumulate the signal charges generated in the photoelectric conversion unit;

a second charge accumulation unit that is provided on the first charge accumulation unit in a substrate thickness direction and that is formed electrically isolated from the first charge accumulation unit;

a first transfer transistor that includes a first transfer gate electrode formed embedded in the substrate to a depth of such a degree that the first transfer gate electrode reaches the first charge accumulation unit from a substrate surface provided with the second charge accumulation unit;

a second transfer transistor configured to transfer the signal charges accumulated in the second charge accumulation unit to the floating diffusion unit; and a reset transistor configured to reset the photoelectric conversion unit and the first charge accumulation unit, wherein the reset transistor includes a vertical reset transistor including a reset gate electrode formed embedded in the substrate to a depth of such a degree that the reset gate electrode reaches the first charge accumulation unit from the substrate surface.

2. The solid-state imaging device according to claim 1, wherein the photoelectric conversion unit is stacked on the light incidence side of the substrate.

3. The solid-state imaging device according to claim 1, further comprising a light-shielding film configured to shield at least the second charge accumulation unit and the floating diffusion unit from light, wherein the light-shielding film is formed on a light incidence side of the substrate, and wherein the photoelectric conversion unit also serves as the light-shielding film.

4. The solid-state imaging device according to claim 1, wherein the photoelectric conversion unit includes a chalcopyrite-based compound.

5. The solid-state imaging device according to claim 1, further comprising a pixel isolation unit configured to isolate the photoelectric conversion unit for each pixel, wherein the pixel isolation unit is formed of a compound semiconductor whose impurity concentration or impurity composition is controlled so that a potential barrier is formed between the adjacent photoelectric conversion units.

6. The solid-state imaging device according to claim 1, comprising a plurality of pixels each including the photoelectric conversion unit, the floating diffusion unit, the first charge accumulation unit, the second charge accumulation unit, the first transfer transistor, and the second transfer transistor, wherein:
the pixels are arranged in two-dimensional array;
the signal charges accumulated in the first charge accumulation units are transferred to the second charge accumulation units simultaneously in the entire pixels; and
the signal charges held in the second charge accumulation units are transferred to the floating diffusion units for each row.

7. The solid-state imaging device according to claim 1, wherein the photoelectric conversion unit is formed of a silicide-based compound.

8. The solid-state imaging device according to claim 1, wherein the photoelectric conversion unit is formed of an organic material.

9. The solid-state imaging device according to claim 1, wherein:
the photoelectric conversion unit and the substrate are connected to each other with an electrode interposed therebetween; and
the photoelectric conversion unit and the electrode shield the substrate from light.

10. The solid-state imaging device according to claim 1, wherein the photoelectric conversion unit is formed to lattice-match with the substrate.

11. The solid-state imaging device according to claim 1, wherein the photoelectric conversion unit is provided with an intermediate layer on the light incidence side of the substrate.

12. The solid-state imaging device according to claim 11, wherein the intermediate layer is formed to have electron affinity between electron affinity of the substrate and electron affinity of the photoelectric conversion unit.

13. The solid-state imaging device according to claim 11, wherein the intermediate layer is formed of a material with a conductivity type opposite to that of the photoelectric conversion unit.

14. The solid-state imaging device according to claim 1, wherein the photoelectric conversion unit is formed of a photodiode having pn junction formed in the substrate.

15. The solid-state imaging device according to claim 1, wherein the signal charges generated in the photoelectric conversion unit move toward the first charge accumulation unit by potential gradient generated due to impurity concentration between the photoelectric conversion unit and the first charge accumulation unit.

16. The solid-state imaging device according to claim 1, further comprising a transfer electrode formed on the substrate in a region provided with the first charge accumulation unit, wherein the signal charges generated in the photoelectric conversion unit move toward the first charge accumulation unit in an event the transfer electrode applies voltage.

17. A driving method for a solid-state imaging device including a pixel region having pixels arranged in two-dimensional array, each pixel comprising:
a photoelectric conversion unit configured to generate signal charges corresponding to light quantity;
a floating diffusion unit that is provided for a substrate and configured to convert the signal charges into voltage;
a first charge accumulation unit that is provided for the substrate and configured to accumulate the signal charges generated in the photoelectric conversion unit;
a second charge accumulation unit that is provided on the first charge accumulation unit in a substrate thickness direction and that is formed electrically isolated from the first charge accumulation unit;
a first transfer transistor that includes a first transfer gate electrode formed embedded in the substrate to a depth of such a degree that the first transfer gate electrode reaches the first charge accumulation unit from a substrate surface provided with the second charge accumulation unit;
a second transfer transistor configured to transfer the signal charges accumulated in the second charge accumulation unit to the floating diffusion unit, wherein:
the signal charges accumulated in the first charge accumulation units and the photoelectric conversion units are transferred to the second charge accumulation units simultaneously in the entire pixels by turning on the first transfer transistors; and
the signal charges held in the second charge accumulation units are read out for each row by turning on the second transfer transistors; and
a reset transistor configured to reset the photoelectric conversion unit and the first charge accumulation unit, wherein the reset transistor includes a vertical reset transistor including a reset gate electrode formed embedded in the substrate to a depth of such a degree that the reset gate electrode reaches the first charge accumulation unit from the substrate surface.

18. An electronic appliance comprising:
an optical lens;
a solid-state imaging device to which light condensed by the optical lens is incident and which includes:
a substrate,
a photoelectric conversion unit configured to generate signal charges corresponding to light quantity,
a floating diffusion unit that is provided for the substrate and configured to convert the signal charges into voltage,
a first charge accumulation unit that is provided for the substrate and configured to accumulate the signal charges generated in the photoelectric conversion unit,
a second charge accumulation unit that is provided on the first charge accumulation unit in a substrate thickness direction and that is formed electrically isolated from the first charge accumulation unit,
a first transfer transistor that includes a first transfer gate electrode formed embedded in the substrate to a depth of such a degree that the first transfer gate electrode reaches the first charge accumulation unit from a substrate surface provided with the second charge accumulation unit,
a second transfer transistor configured to transfer the signal charges accumulated in the second charge accumulation unit to the floating diffusion unit, and
a reset transistor configured to reset the photoelectric conversion unit and the first charge accumulation unit, wherein the reset transistor includes a vertical reset transistor including a reset gate electrode formed embedded in the substrate to a depth of such a degree that the reset gate electrode reaches the first charge accumulation unit from the substrate surface; and
a signal processing circuit configured to process an output signal output from the solid-state imaging device.

* * * * *